US012660223B2

(12) United States Patent
Khaderbad et al.

(10) Patent No.: US 12,660,223 B2
(45) Date of Patent: Jun. 16, 2026

(54) CONTACT STRUCTURE FOR SEMICONDUCTOR DEVICE

(71) Applicant: Taiwan Semiconductor Manufacturing Company., Ltd., Hsinchu (TW)

(72) Inventors: Mrunal Abhijith Khaderbad, Hsinchu City (TW); Keng-Chu Lin, Ping-Tung (TW); Ko-Feng Chen, Hsinchu City (TW); Yu-Yun Peng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 342 days.

(21) Appl. No.: 17/371,288

(22) Filed: Jul. 9, 2021

(65) Prior Publication Data

US 2023/0008496 A1    Jan. 12, 2023

(51) Int. Cl.
| | |
|---|---|
| *H10D 30/01* | (2025.01) |
| *H10D 30/62* | (2025.01) |
| *H10D 62/13* | (2025.01) |
| *H10D 62/17* | (2025.01) |

(Continued)

(52) U.S. Cl.
CPC ....... *H10D 30/024* (2025.01); *H10D 30/6211* (2025.01); *H10D 62/151* (2025.01); *H10D 62/235* (2025.01); *H10D 84/0158* (2025.01); *H10D 84/038* (2025.01)

(58) Field of Classification Search
CPC ......... H01L 21/02109; H01L 21/02126; H01L 21/02263; H01L 21/02274; H01L 21/0228; H01L 21/823431; H01L 21/76834; H01L 21/76831; H01L 21/76897; H01L 21/823475; H01L 21/823425; H01L 29/66545; H01L 29/785; H01L 29/0886; H01L 29/41791; H01L 23/535; H01L 23/5221; H01L 23/528; H01L 23/5283; H01L 21/76877; H01L 21/76895; H01L 21/76829; H01L 21/76849; H10D 64/681; H10D 64/68; H10D 64/259; H10D 64/251; H10D 64/258; H10D 64/27; H10D 64/311; H10D 64/411; H10D 64/511;

(Continued)

(56) References Cited

U.S. PATENT DOCUMENTS 8,436,404 B2 *   5/2013   Bohr ..................... H01L 21/283
                                                        257/E29.116
8,536,656 B2 *   9/2013   Ramachandran ..........................
                                                        H01L 21/76895
                                                        438/653

(Continued)

*Primary Examiner* — Sophia T Nguyen
(74) *Attorney, Agent, or Firm* — Sterne, Kessler, Goldstein & Fox P.L.L.C.

(57) ABSTRACT

The present disclosure describes a semiconductor structure and a method for forming the same. The semiconductor structure can include a substrate, first and second contact structures proximate to each other and over the substrate, and first and second dielectric layers formed over the first and second contact structures, respectively. A top portion of the first dielectric layer can include a first dielectric material. A bottom portion of the first dielectric layer can include a second dielectric material different from the first dielectric material. The second dielectric layer can include a third dielectric material different from the first dielectric material.

20 Claims, 31 Drawing Sheets

(51) Int. Cl.
   *H10D 84/01* (2026.01)
   *H10D 84/03* (2025.01)
(58) Field of Classification Search
   CPC ............... H10D 64/518; H10D 64/517; H10D
                                    84/0186; H10D 30/6219
   See application file for complete search history.

(56) References Cited

U.S. PATENT DOCUMENTS

| | | | | |
|---|---|---|---|---|
| 8,937,359 | B2 * | 1/2015 | Xie | H01L 21/76834 |
| | | | | 257/401 |
| 9,105,490 | B2 | 8/2015 | Wang et al. | |
| 9,153,498 | B2 * | 10/2015 | Xie | H10D 30/62 |
| 9,236,267 | B2 | 1/2016 | De et al. | |
| 9,236,300 | B2 | 1/2016 | Liaw | |
| 9,306,032 | B2 * | 4/2016 | Lin | H01L 21/28247 |
| 9,406,804 | B2 | 8/2016 | Huang et al. | |
| 9,443,769 | B2 | 9/2016 | Wang et al. | |
| 9,520,482 | B1 | 12/2016 | Chang et al. | |
| 9,524,965 | B2 * | 12/2016 | Ho | H01L 21/76897 |
| 9,536,980 | B1 * | 1/2017 | Huang | H01L 21/76897 |
| 9,548,366 | B1 * | 1/2017 | Ho | H01L 21/823475 |
| 9,576,814 | B2 | 2/2017 | Wu et al. | |
| 9,831,183 | B2 | 11/2017 | Lin et al. | |
| 9,859,386 | B2 | 1/2018 | Ho et al. | |
| 9,893,184 | B2 * | 2/2018 | Chang | H01L 21/76897 |
| 9,899,321 | B1 * | 2/2018 | Park | H01L 21/76831 |
| 9,997,522 | B2 * | 6/2018 | Lai | H01L 29/6653 |
| 10,170,377 | B1 * | 1/2019 | Zang | H10B 10/00 |
| 10,236,364 | B1 * | 3/2019 | Cheng | H01L 29/456 |
| 10,243,053 | B1 * | 3/2019 | Xie | H01L 29/785 |
| 10,546,754 | B2 * | 1/2020 | Chang | H01L 21/76897 |
| 10,790,376 | B2 * | 9/2020 | Xie | H01L 29/42372 |
| 10,797,161 | B2 * | 10/2020 | Khaderbad | H01L 29/0847 |
| 10,818,768 | B1 * | 10/2020 | Cheng | H01L 21/76897 |
| 10,832,961 | B1 * | 11/2020 | Fan | H01L 21/76895 |
| 10,868,184 | B2 * | 12/2020 | Chiang | H10D 30/62 |
| 10,916,475 | B2 * | 2/2021 | Lai | H01L 21/823418 |
| 10,923,573 | B2 * | 2/2021 | Wang | H10D 64/662 |
| 10,930,556 | B2 * | 2/2021 | Wang | H01L 23/5226 |
| 10,943,990 | B2 * | 3/2021 | Greene | H01L 21/76895 |
| 11,004,795 | B2 * | 5/2021 | Chang | H01L 21/76897 |
| 11,139,203 | B2 * | 10/2021 | Tsai | H01L 21/76897 |
| 11,282,920 | B2 * | 3/2022 | Lin | H01L 21/7682 |
| 11,387,331 | B2 * | 7/2022 | Fang | H10D 30/62 |
| 11,764,106 | B2 * | 9/2023 | Yang | H01L 21/31144 |
| | | | | 257/773 |
| 12,125,886 | B2 * | 10/2024 | Tsai | H01L 21/76834 |
| 12,142,652 | B2 * | 11/2024 | Kim | H10D 64/511 |
| 2003/0017642 | A1 * | 1/2003 | Conti | H01L 21/02274 |
| | | | | 257/642 |
| 2005/0250348 | A1 * | 11/2005 | Xia | C23C 16/45523 |
| | | | | 438/789 |
| 2006/0046520 | A1 * | 3/2006 | Padhi | H01L 21/02126 |
| | | | | 438/778 |
| 2006/0252273 | A1 * | 11/2006 | Lakshmanan | H01L 21/02304 |
| | | | | 438/758 |
| 2006/0276054 | A1 * | 12/2006 | Lakshmanan | H01L 21/02274 |
| | | | | 438/758 |
| 2008/0233366 | A1 * | 9/2008 | Edelstein | H01L 21/02126 |
| | | | | 427/96.8 |
| 2011/0204492 | A1 * | 8/2011 | Xie | C23C 16/45523 |
| | | | | 438/643 |
| 2011/0298017 | A1 * | 12/2011 | Jain | H01L 21/76897 |
| | | | | 257/288 |
| 2013/0175583 | A1 * | 7/2013 | Yuan | H01L 29/78 |
| | | | | 257/E21.585 |
| 2014/0077305 | A1 * | 3/2014 | Pethe | H01L 21/76807 |
| | | | | 257/E21.409 |
| 2014/0264499 | A1 * | 9/2014 | Yuan | H01L 21/76895 |
| | | | | 257/288 |
| 2014/0312433 | A1 * | 10/2014 | He | H01L 21/76834 |
| | | | | 438/586 |
| 2014/0315379 | A1 * | 10/2014 | He | H01L 21/28132 |
| | | | | 438/595 |
| 2014/0339629 | A1 * | 11/2014 | Xie | H01L 29/66666 |
| | | | | 438/270 |
| 2015/0021683 | A1 * | 1/2015 | Xie | H10D 64/514 |
| | | | | 438/270 |
| 2015/0041869 | A1 * | 2/2015 | Pham | H10D 64/514 |
| | | | | 257/288 |
| 2015/0118836 | A1 * | 4/2015 | Lin | H10D 30/6219 |
| | | | | 438/586 |
| 2015/0228646 | A1 * | 8/2015 | Ho | H01L 21/31051 |
| | | | | 438/586 |
| 2015/0243746 | A1 * | 8/2015 | Chiang | H10D 64/258 |
| | | | | 257/288 |
| 2015/0279935 | A1 * | 10/2015 | Xie | H01L 29/0847 |
| | | | | 257/288 |
| 2016/0049481 | A1 * | 2/2016 | Wei | H01L 21/76895 |
| | | | | 257/401 |
| 2016/0087076 | A1 * | 3/2016 | Chiang | H10D 64/258 |
| | | | | 438/299 |
| 2016/0133623 | A1 * | 5/2016 | Xie | H01L 23/528 |
| | | | | 438/586 |
| 2016/0155815 | A1 * | 6/2016 | Bohr | H10D 64/691 |
| | | | | 257/410 |
| 2016/0276455 | A1 * | 9/2016 | Yang | H01L 23/528 |
| 2016/0293485 | A1 * | 10/2016 | Song | H01L 21/76829 |
| 2016/0358908 | A1 * | 12/2016 | Xie | H01L 21/76829 |
| 2016/0365426 | A1 * | 12/2016 | Ching | H01L 29/785 |
| 2017/0110549 | A1 * | 4/2017 | Xie | H01L 21/76897 |
| 2017/0125596 | A1 * | 5/2017 | Pradhan | H01L 29/66795 |
| 2017/0141215 | A1 * | 5/2017 | Ching | H01L 29/7851 |
| 2017/0170316 | A1 * | 6/2017 | Chang | H01L 21/7684 |
| 2017/0179241 | A1 * | 6/2017 | Chang | H01L 29/41775 |
| 2017/0194211 | A1 * | 7/2017 | Lai | H01L 29/0649 |
| 2017/0287780 | A1 * | 10/2017 | Park | H10D 84/0186 |
| 2017/0288031 | A1 * | 10/2017 | Ho | H10D 84/0149 |
| 2017/0317076 | A1 * | 11/2017 | Shen | H01L 27/0886 |
| 2017/0317178 | A1 * | 11/2017 | Chang | H01L 29/4991 |
| 2017/0373161 | A1 * | 12/2017 | Schroeder | H01L 29/7851 |
| 2018/0096842 | A1 * | 4/2018 | Varadarajan | H01L 21/76822 |
| 2018/0130889 | A1 * | 5/2018 | Xie | H10D 84/0149 |
| 2018/0138176 | A1 * | 5/2018 | Shen | H01L 21/823475 |
| 2018/0190780 | A1 * | 7/2018 | Lee | H01L 27/088 |
| 2018/0337060 | A1 * | 11/2018 | Chang | H01L 21/31111 |
| 2018/0366324 | A1 * | 12/2018 | Cao | H01L 21/02167 |
| 2019/0088742 | A1 * | 3/2019 | Zang | H01L 27/088 |
| 2019/0103265 | A1 * | 4/2019 | Kao | H01L 27/0886 |
| 2019/0164829 | A1 * | 5/2019 | Yang | H10D 30/024 |
| 2019/0259619 | A1 * | 8/2019 | Zang | H10D 30/6219 |
| 2019/0259667 | A1 * | 8/2019 | Zang | H01L 29/785 |
| 2019/0279863 | A1 * | 9/2019 | Kao | H01L 21/31111 |
| 2019/0295889 | A1 * | 9/2019 | Bai | H10D 30/6219 |
| 2019/0296129 | A1 * | 9/2019 | Cheng | H01L 27/1211 |
| 2019/0378722 | A1 * | 12/2019 | Economikos | H10D 30/62 |
| 2019/0385946 | A1 * | 12/2019 | Xie | H01L 23/535 |
| 2020/0006139 | A1 * | 1/2020 | Tseng | H01L 21/7684 |
| 2020/0020687 | A1 * | 1/2020 | Wang | H10D 84/0135 |
| 2020/0043787 | A1 * | 2/2020 | Su | H01L 23/535 |
| 2020/0044072 | A1 * | 2/2020 | Chiang | H10D 30/62 |
| 2020/0058757 | A1 * | 2/2020 | Xie | H01L 21/823431 |
| 2020/0058769 | A1 * | 2/2020 | Khaderbad | H01L 29/0847 |
| 2020/0058785 | A1 * | 2/2020 | Tsai | H01L 21/76805 |
| 2020/0075409 | A1 * | 3/2020 | Wang | H01L 21/0332 |
| 2020/0098922 | A1 * | 3/2020 | You | H10D 64/017 |
| 2020/0111706 | A1 * | 4/2020 | Cheng | H01L 21/76829 |
| 2020/0126843 | A1 * | 4/2020 | Tsai | H01L 29/4991 |
| 2020/0135872 | A1 * | 4/2020 | Zang | H01L 21/76829 |
| 2020/0135912 | A1 * | 4/2020 | Tsai | H01L 21/02362 |
| 2020/0144118 | A1 * | 5/2020 | Cheng | H01L 21/76831 |
| 2020/0168555 | A1 * | 5/2020 | Huang | H01L 29/785 |
| 2020/0176324 | A1 * | 6/2020 | Zang | H01L 29/41791 |
| 2020/0335594 | A1 * | 10/2020 | Zang | H01L 27/088 |
| 2020/0343138 | A1 * | 10/2020 | Jisong | H01L 21/31144 |
| 2021/0043747 | A1 * | 2/2021 | Cheng | H01L 21/28562 |
| 2021/0057569 | A1 * | 2/2021 | Huang | H01L 21/3081 |
| 2021/0066464 | A1 * | 3/2021 | Zang | H01L 21/76852 |
| 2021/0272893 | A1 * | 9/2021 | Song | H01L 21/76802 |
| 2021/0280690 | A1 * | 9/2021 | Park | H10D 64/256 |

(56)　　　　　　　References Cited

U.S. PATENT DOCUMENTS

| | | | | |
|---|---|---|---|---|
| 2021/0351290 A1* | 11/2021 | Huang | .............. | H01L 21/76816 |
| 2021/0391432 A1* | 12/2021 | Yoo | ................... | H01L 21/76895 |
| 2021/0391464 A1* | 12/2021 | Bae | ...................... | H10D 30/792 |
| 2022/0005934 A1* | 1/2022 | Park | ................. | H01L 21/76895 |
| 2022/0028983 A1* | 1/2022 | Fang | ................ | H01L 21/76816 |
| 2022/0037338 A1* | 2/2022 | Wang | ............. | H01L 21/823475 |
| 2022/0051939 A1* | 2/2022 | Yang | ................ | H01L 29/66515 |
| 2022/0220608 A1* | 7/2022 | Varadarajan | ...... | H01L 21/02167 |
| 2022/0246738 A1* | 8/2022 | Kim | ................... | H01L 29/41775 |
| 2022/0293742 A1* | 9/2022 | Tsai | ...................... | H10D 64/62 |
| 2022/0293765 A1* | 9/2022 | Cheng | .............. | H01L 29/41791 |
| 2023/0008496 A1* | 1/2023 | Khaderbad | ....... | H01L 29/41791 |
| 2023/0036104 A1* | 2/2023 | Baek | ................... | H10D 62/118 |
| 2023/0178361 A1* | 6/2023 | Hung | ................ | H10D 84/0177 |
| | | | | 438/745 |
| 2023/0238279 A1* | 7/2023 | Huang | ............... | H01L 29/7851 |
| | | | | 257/401 |
| 2023/0317805 A1* | 10/2023 | Lin | ..................... | H01L 29/7851 |
| | | | | 257/288 |
| 2023/0326746 A1* | 10/2023 | Kao | ................... | H01L 21/0228 |
| | | | | 438/696 |
| 2025/0107196 A1* | 3/2025 | Fang | ................ | H01L 21/76816 |

* cited by examiner

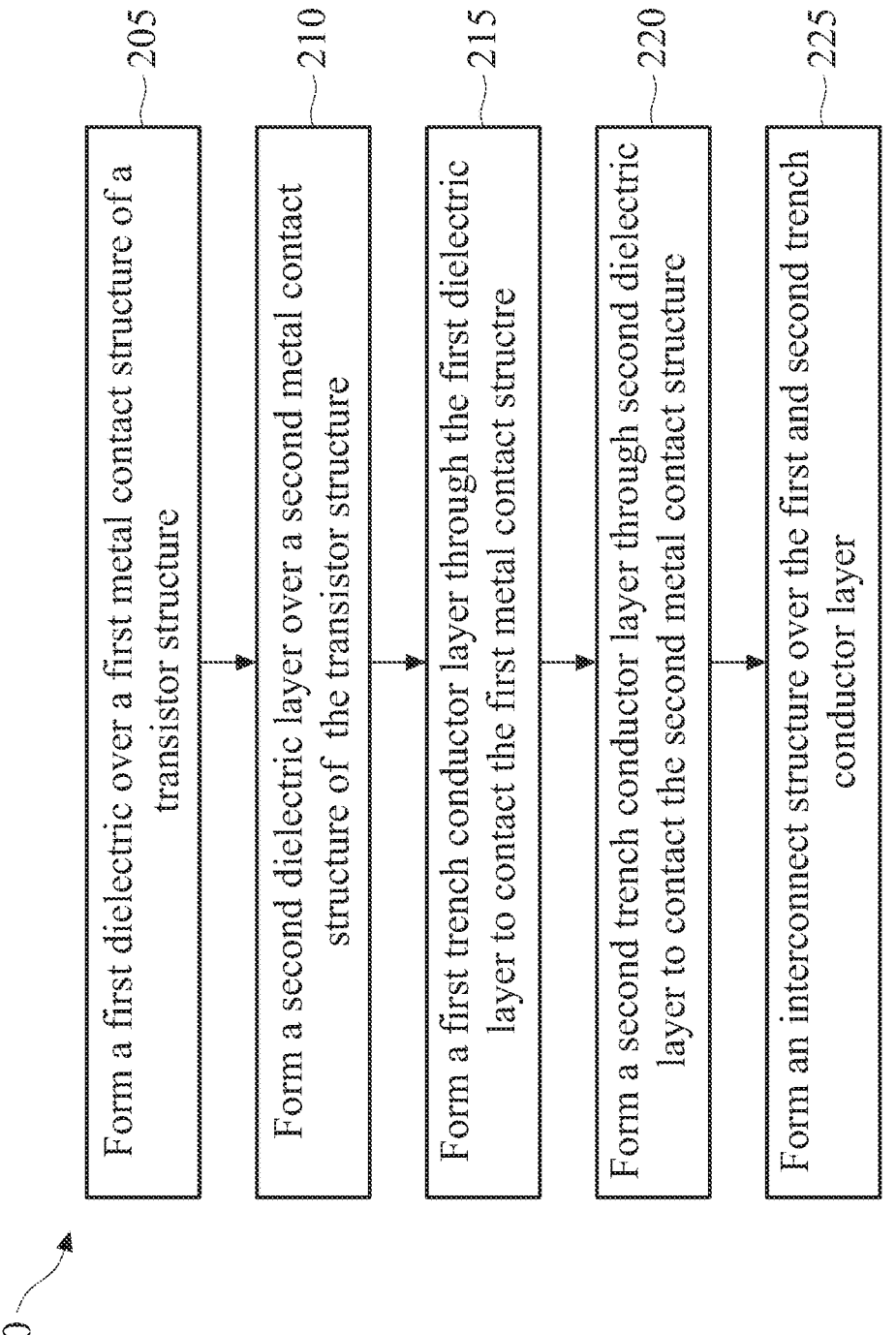

200

Form a first dielectric over a first metal contact structure of a transistor structure — 205

Form a second dielectric layer over a second metal contact structure of the transistor structure — 210

Form a first trench conductor layer through the first dielectric layer to contact the first metal contact structre — 215

Form a second trench conductor layer through second dielectric layer to contact the second metal contact structure — 220

Form an interconnect structure over the first and second trench conductor layer — 225

FIG. 2

CONTACT STRUCTURE FOR SEMICONDUCTOR DEVICE

BACKGROUND

Advances in semiconductor technology have increased the demand for semiconductor devices with higher storage capacity, faster processing systems, higher performance, and lower costs. To meet these demands, the semiconductor industry continues to scale down the dimensions of semiconductor devices. Such scaling down has increased the complexity of semiconductor device manufacturing processes.

BRIEF DESCRIPTION OF THE DRAWINGS

Aspects of this disclosure are best understood from the following detailed description when read with the accompanying figures.

FIG. 2 is a flow diagram of a method for fabricating a semiconductor device, according to some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
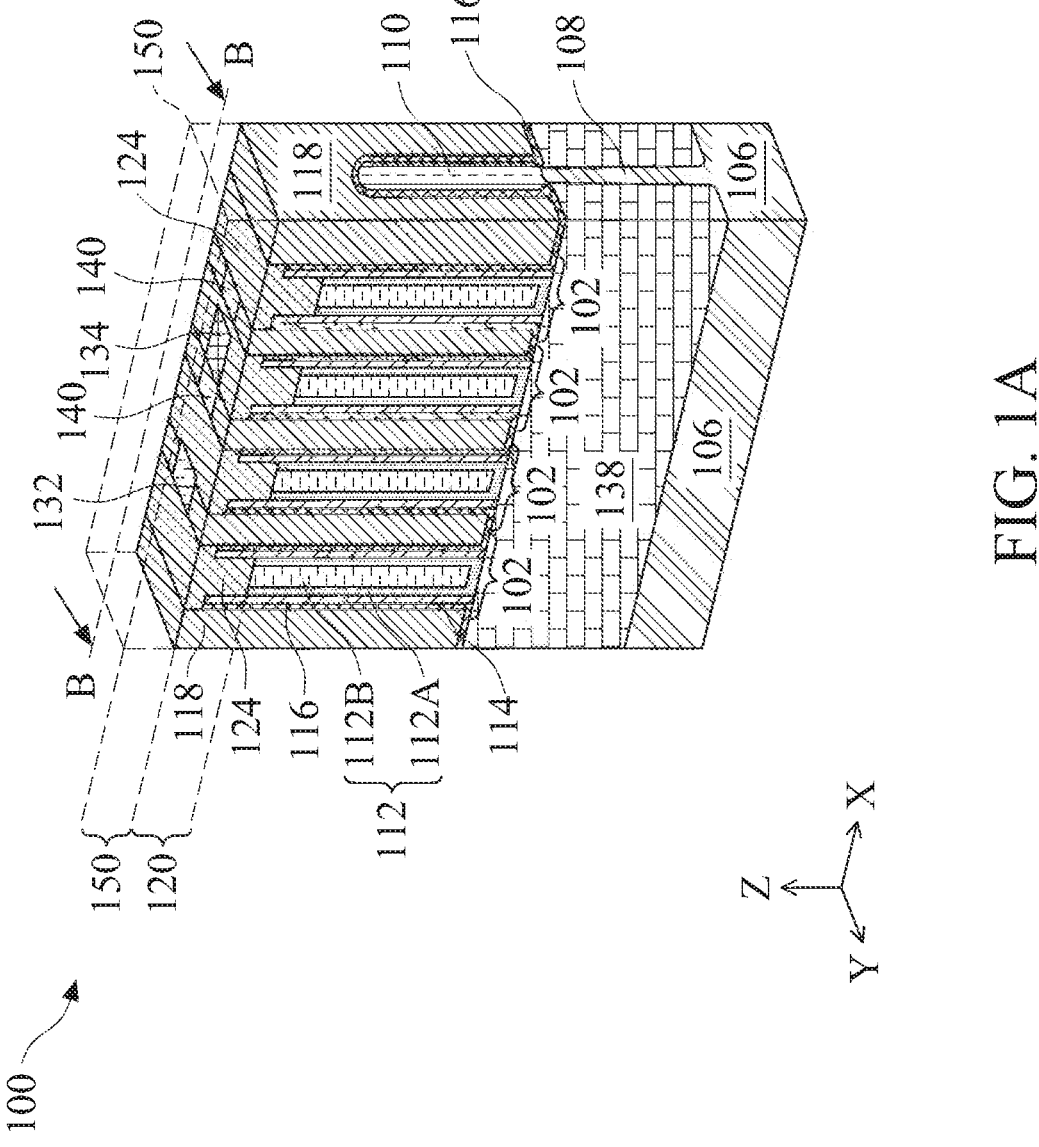
FIG. 1A illustrates an isometric view of a semiconductor device, according to some embodiments.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is tor the purpose of description and not of limitation, such that the terminology or phraseology of the present specification is to be interpreted by those skilled in relevant art(s) m light of the teachings herein.

Spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

Fins associated with fin field effect transistors (finFETs) or gate-all-around (GAA) FETs may be patterned by any suitable method. For example, the fins may be patterned using one or more photolithography processes, including a double-patterning process or a multi-patterning process. Double-patterning and multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Technology advances in the semiconductor industry drive the pursuit of integrated circuits (ICs) having higher device density, higher performance, and lower cost. In the course of the IC evolution, the transistor structure is scaled down to achieve ICs with higher transistor densities. Such scaling down can reduce the separation between the transistor's gate terminal and the transistor's source/drain (S/D) terminals. However, this separation reduction can decrease the fabrication tolerance for patterning the contact structure (e.g., gate contact structure and/or S/D contact structure) over the transistor's gate terminal and the transistor's S/D terminals. For example, a lithography operation for defining the contact structure can have an overlay shift (e.g., a misalignment) comparable to the separation between the transistor's gate terminal and the transistor's S/D terminals. Such overlay shift can cause the contact structure to land on both the transistor's gate terminal and the transistor's S/D terminals, thus causing an electrical short in the transistor and the IC failure.

To address the aforementioned challenges, the present disclosure is directed to a fabrication method and a transistor structure with a contact structure. The transistor structure can include a channel and a source/drain (S/D) region adjacent to the channel. The contact structure can include first and second metal contact structures that contact the channel and the S/D region, respectively. The contact structure can further include first and second dielectric layers formed over the first and second metal contact structures, respectively. The first and second dielectric layers can be made of different dielectric materials that have different etching selectivity from one another for an etching process. For example, the first dielectric layer can be made of silicon nitride, and the second dielectric layer can be made of a dielectric material that contains carbon, such as silicon carbide. In addition, the second dielectric layer's top and bottom portions can be made of different dielectric materials to further increase the second dielectric layer's dielectric strength (e.g., reduce a leakage current flowing through the second dielectric layer). For example, the second dielectric layer's top and bottom portions can be made of a dielectric material that contains carbon, where the second dielectric layer's bottom portion (e.g., proximate to the second dielectric layer's bottom surface) can further incorporate a greater oxygen or a greater nitrogen concentration than the second dielectric layer's upper portion (e.g., proximate to the second dielectric layer's top surface). The contact structure can further include first and second trench conductor layers formed through the first and second dielectric layers to contact the first and second metal contact structures, respectively. The first and second trench conductor layers can be formed via a lithography process and the etching process that can selectively etch the first or the second dielectric layers. The lithography process for defining the first or the second trench conductor layer may unintentionally expose both the first and second dielectric layers because of an overlay shift. The etching selectivity between the first and the second dielectric layers can protect the first or the second dielectric layer during the etching process that defines the second or the first trench conductor layers, thus mitigating the above-noted unintentional exposure. Therefore, a benefit of the present disclosure, among others, is to avoid electrical shorting between the transistor's channel and S/D region, thus enhancing an overall yield and reliability of the IC.

A semiconductor device 100 having multiple field effect transistors (FETs) 102, a contact structure 120 disposed over FETs 102, and an interconnect structure 150 disposed over contact structure 120 is described with reference to FIGS. 1A-1G, according to some embodiments. FIG. 1A illustrates an isometric view of semiconductor device 100, according to some embodiments. FIGS. 1B-1F illustrate cross-sectional views along line B-B of semiconductor device 100 of FIG. 1A, according to some embodiments. FIG. 1G illustrates various profiles of atomic concentrations of an oxygen and nitrogen of etch selective layer (ESL) 140 (discussed below) along line M-M of FIG. 1B, according to some embodiments. The discussion of elements in FIGS. 1A-1G with the same annotations applies to each other, unless mentioned otherwise. Semiconductor device 100 can be included in a microprocessor, memory cell, or other integrated circuit. Though FETs 102 shown in FIGS. 1A-1F are fin field effect transistors (finFETs), each FET 102 can be a gate-all-around (GAA) PET, according to some embodiments.

Referring to FIG. 1A, each FET 102 can include a fin structure 108 extending along an x-direction, a gate structure 112 traversing through fin structure 108 along a y-direction, and a source/drain (S/D) region 110 formed over portions of fin structure 108. Although FIG. 1A shows fin structure 108 accommodating four FETs 102, any number of FETs 102 can be disposed along fin structure 108. Each FET 102 can be formed on a substrate 106. Substrate 106 can be a semiconductor material, such as silicon. In some embodiments, substrate 106 can include (i) an elementary semiconductor, such as silicon (Si) and germanium (Ge); (ii) a compound semiconductor including silicon carbide (SiC), gallium arsenide (GaAs), gallium phosphide (GaP), indium phosphide (InP), indium arsenide (InAs), and indium antimonide (InSb); or (iii) a combination thereof. Further, substrate 106 can be doped depending on design requirements (e.g., p-type substrate or n-type substrate). In some embodiments, substrate 106 can be doped with p-type dopants (e.g., boron (B), indium (In), aluminum (Al), or gallium (Ga)) or n-type dopants phosphorus (P) or arsenic (As)).

Fin structure 108 can be formed over substrate 106 and can include a material similar to substrate 106. For example, fin structure 108 can include a material having a lattice constant substantially equal to lattice mismatch within 5%) that of substrate 106. Fin structure 108 can accommodate FET 102's channel region 172 (shown in FIG. 1B) that is traversed by gate structure 112. Fin structure 108 can be p-type doped, n-type doped, or un-doped. In some embodiments, FET 102 can be an NFET, where fin structure 108 can be un-doped or doped with p-type dopants, such as boron, indium, aluminum, and gallium. In some embodiments, FET 102 can be a PFET, where fin structure 108 can be un-doped or doped with n-type dopants, such as phosphorus and arsenic.

S/D region 110 can be grown over structure 108. FET 102's channel region 172 can be interposed between a pair of S/D regions 110. SID region 110 can include an epitaxially-grown semiconductor material. In some embodiments, the epitaxially-grown semiconductor material can be the same material as the material of substrate 116. For example, the epitaxially-grown semiconductor material can have a lattice constant substantially equal to (e.g., lattice mismatch within 5%) that of the material of substrate 106. In some embodiments, the epitaxially-grown semiconductor material can include: (i) a semiconductor material, such as Ge and Si; (ii) a compound semiconductor material, such as GaAs and AiGaAs; or (iii) a semiconductor alloy, such as Site. and GaAsP. SID region 110 can be doped with p-type dopants or doped with n-type dopants. The p-type dopants can include B, In, Al, or Ga. The n-type dopants can include P or As.

Gate structure 112 can be multi-layered structures that wraps around portions of fin structure 108. Gate structure 112 can be referred to as a metal contact structure that contacts and modulates FET 102's channel region 172. For example, gate structure 112 can wrap FET 102's channel region 172 to modulate a conductivity of PET 102's channel region 172. In some embodiments, gate structure 112 can be referred to as gate-all-around (GAA) structures, where FET 102 can be referred to as a GAA FET 102. Gate structure 112 can include a gate dielectric layer 112A that can wrapp around PET 102's channel region 172, a gate electrode 112B disposed on gate dielectric layer 112A, and gate spacers 114 disposed on sidewalk of gate electrode 112B.

Gate dielectric layer 112A can include any suitable dielectric material, such as (i) a layer of silicon oxide, silicon nitride, and/or oxynitride, (ii) a high-k dielectric material that has a dielectric constant greater than the dielectric constant of silicon dioxide (e.g., greater than about 3.9), such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), and zirconium silicate ($ZrSiO_2$), and (iii) a combination thereof, that separates gate electrode 112B from FET 102's channel region 172. In some embodiments, gate dielectric layer 112A can include a single layer or a stack of insulating material layers. Gate dielectric layer 112A can have a thickness ranging from about 1 nm to about 5 nm. Other materials and thicknesses for gate dielectric layers 112A are within the spirit and scope of this disclosure.

Gate electrode 112B can be a gate terminal of YET 102. Gate electrode 112B can include metal stacks that wrap about FET 102's channel region 172. In some embodiments, gate electrode 112B can include a gate harrier layer (not shown in FIG. 1A), a gate work function layer (not shown in FIG. 1A), and a gate metal fill layer (not shown in FIG. 1A). The gate barrier layer can serve as a nucleation layer for subsequent formation of a gate work function layer. The gate barrier layer can include titanium (Ti), tantalum (Ta), titanium nitride (TiN), tantalum nitride (TaN), or other suitable diffusion barrier materials. The gate work function layer can include a single metal layer or a stack of metal layers. In some embodiments, the gate work function layer can include aluminum (Al), copper (Cu), tungsten (W), titanium (Ti), tantalum (Ta), titanium nitride (TiN), tantalum nitride (TaN), nickel silicide (NiSi), cobalt silicide (CoSi), silver (Ag), tantalum carbide (TaC), tantalum silicon nitride (TaSiN), tantalum carbon nitride (TaCN), titanium aluminum (TiAl), titanium aluminum nitride (TiAlN), tungsten nitride (WN), metal alloys, and/or combinations thereof. Gate metal fill layer can include a single metal layer or a stack of metal layers. In some embodiments, the gate metal fill layer can include a suitable conductive material, such as Ti, silver (Ag), Al, titanium aluminum nitride (TiAlN), tantalum carbide (TaC), tantalum carbo-nitride (TaCN), tantalum silicon nitride (TaSiN), manganese (Mn), Zr, titanium nitride (TiN), tantalum nitride (TaN), ruthenium (Ru), molybdenum (Mo), tungsten nitride (WN), copper (Cu), tungsten (W), cobalt (Co), nickel (Ni), titanium carbide (TiC), titanium aluminum carbide (TiAlC), tantalum aluminum carbide (TaAlC), metal alloys, and combinations thereof. Other materials for the gate barrier layer, the gate work function layer, and the gate metal fill layer are within the spirit and scope of this disclosure.

Gate spacer 114 can physically contact gate dielectric layers 112A. In some embodiments, gate spacer 114's top surface $114_T$ (shown in FIG. 1B) can be positioned above gate structure 112's top surface $112_T$ (shown in FIG. 1B). In some embodiments, gate spacer 114's top surface $114_T$ can be substantially coplanar with gate structure 112's top surface $112_T$. Gate spacer 114 can include a low-k material with a dielectric constant less than about 3.9. For example, gate spacer 114 can include an insulating material, such as silicon oxycarbide (SiOC), silicon carbonitride (SiCN), and silicon oxycarbonitride (SiOCN). In some embodiments, gate spacer 114 can have a thickness ranging from about 2 nm to about 10 nm. Other materials and thicknesses for gate spacer 114 are within the spirit and scope of this disclosure.

Semiconductor device 100 can further include a shallow trench isolation (STI) regions 138 that provide electrical isolation for fin structure 108. For example, STI region 138 can electrically isolate fin structure 108 from another fin structure 108 (not shown in FIG. 1A) formed in semiconductor device 100. Also, STI region 138 can provide electrical isolation between FET 102 and neighboring active and passive elements (not shown in FIG. 1A) integrated with or deposited on substrate 106. STI region 138 can include one or more layers of dielectric material, such as a nitride layer, an oxide layer disposed on the nitride layer, and an insulating layer disposed on the nitride layer. In some embodiments, an insulating layer can refer to a layer that functions as an electrical insulator (e.g., a dielectric layer). In some embodiments, the insulating layer can include silicon oxide, silicon nitride, silicon oxynitride, fluorine-doped silicate glass (FSG), a low-k dielectric material, and/or other suitable insulating materials.

Semiconductor device 100 can further include a contact etch stop layer (CESL) 116 and an interlayer dielectric (ILD) layer 118 to provide an electrical insulation between adjacent fin structures 108. CESL 116 can be formed over gate spacer 114 and S/D regions 110 to protect gate spacer 104 and S/D region 110 during the formation of ILD layer 118. In some embodiments, CESL 116's top surface $116_T$ (shown in FIG. 1B) can be substantially coplanar with gate spacer 114's top surface $114_T$. CESL 116 can be made of any suitable dielectric material, such as silicon nitride ($SiN_x$), silicon oxide ($SiO_x$), silicon oxynitride (SiON), silicon carbide (SiC), SiCN, SiOC, SiOCN, boron nitride (BN), silicon boron nitride (SiBN), and silicon boron carbon nitride (SiBCN). CESL 116 can have any suitable thickness, such as from about 1 nm to about 10 nm. Other materials and thicknesses for CESL 116 are within the scope and spirit of this disclosure.

ILD layer 118 can be formed over CESL 116. In some embodiments, ILD layer 118's top surface $118_T$ (shown in FIG. 1B) can be positioned above gate spacer 114's top surface $114_T$. In some embodiments, ILD layer 118's top surface $118_T$ can be substantially coplanar with gate spacer 114's top surface $114_T$. ILD layer 118 can be made of any suitable flowable material, such as flowable silicon oxide, flowable silicon nitride, flowable silicon oxynitride, flowable silicon carbide, and flowable silicon oxycarbide. In some embodiments, ILD layer 118 can be made of any suitable dielectric material, such as SiOC, $SiO_x$, $SiN_x$, zirconium oxide, a low-k (e.g., dielectric constant less than or equal to about 3.9) dielectric material, and a high-k (e.g., dielectric constant greater than about 3.9) dielectric material. In some embodiments, ILD layer 118 can have a thickness from about 1 nm to about 200 nm. Other materials and thicknesses for ILD layer 118 are within the spirit and scope of this disclosure.

Figure 1B:
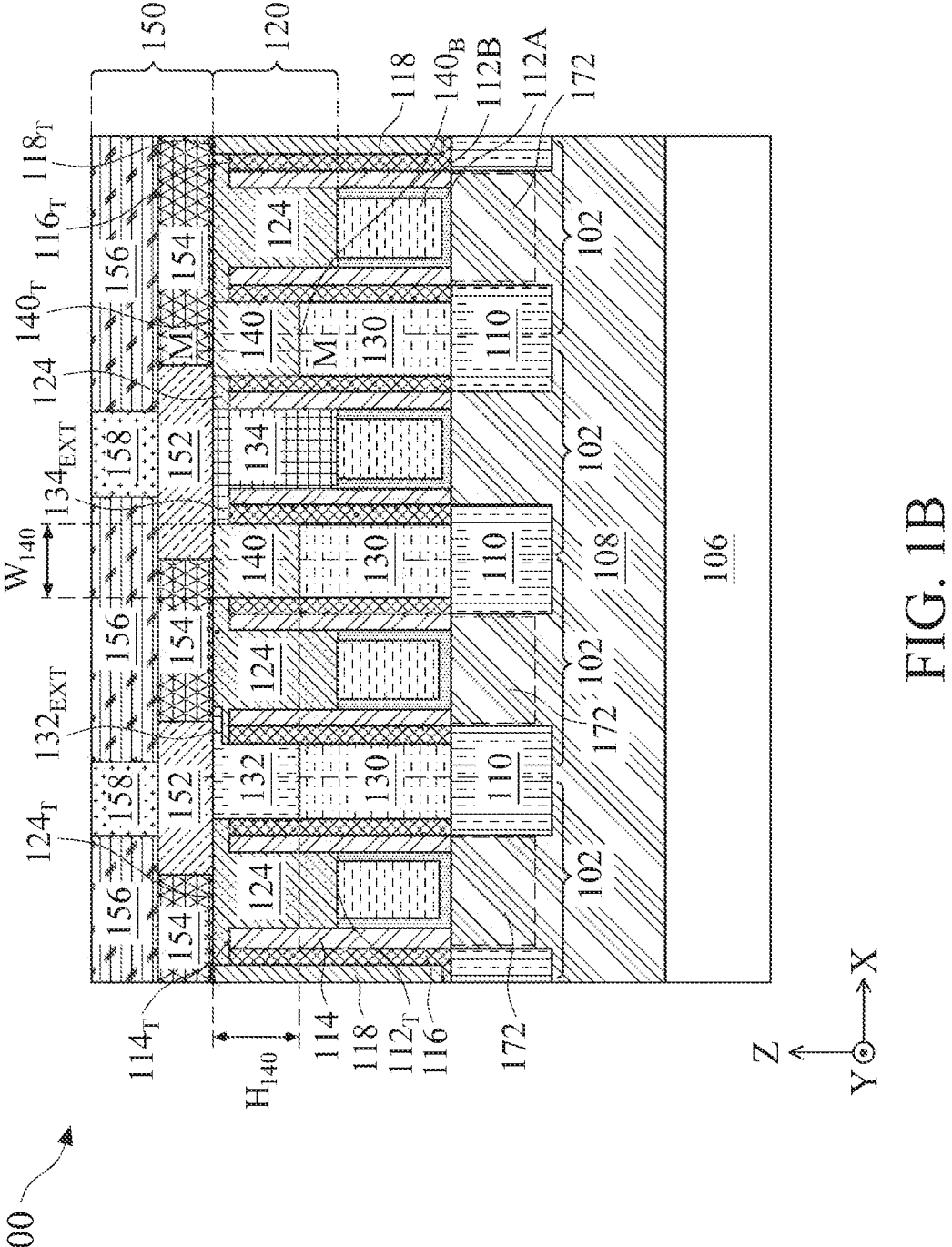
FIGS. 1B-1F illustrate cross-sectional views of a semiconductor device, according to some embodiments.

Referring to FIGS. 1A and 1B, contact structure 120 can be sandwiched between PET 102 and interconnect structure 150 to electrically connect PET 102 to interconnect structure 150. Contact structure 120 can include a padding layer 124 formed between gate structure 112 and interconnect structure 150. Padding layer 124 can be further formed over gate spacer 114's side surface. In some embodiments, padding layer 124's top surface $124_T$ can be positioned above gate spacer 114's top surface $114_T$ and/or over CESL 116's top surface $116_T$. In some embodiments, padding layer 124's top surface $124_T$ can be substantially coplanar with gate spacer 114's top surface $114_T$ and/or substantially coplanar with ILD layer 118's top surface $118_T$. Padding layer 124 can be made of any suitable dielectric material, such as silicon nitride, silicon oxynitride, silicon oxide, and metal oxide (e.g., hafnium oxide or aluminum oxide), that functions as an electrical insulator. In some embodiments, padding layer 124's top and bottom surfaces can be made of an identical dielectric material. In some embodiments, an upper portion (e.g., proximate to top surface $124_T$) of padding layer 124 and a lower portion (e.g., proximate to gate structure 112) of padding layer 124 can be made of an identical dielectric material. In some embodiments, padding layer 124 can be made of a dielectric material that has different etching selectivity from gate spacer 114. The term "etching selectivity" can refer to the ratio of the etch rates and/or the etching depth of two materials under a same etching condition (e.g., a same dry etching condition or a same wet etching condition). In some embodiments, padding layer 124's top and bottom surfaces can be made of dielectric materials that have negligible etching selectivity (e.g., substantially has no etching selectivity) to one another. In some embodiments, an upper portion (e.g., proximate to top surface $124_T$) of padding layer 124 and a lower portion (e.g., proximate to gate structure 112) of padding layer 124 can be made of dielectric material that have negligible etching selectivity substantially has no etching selectivity) to one another. Padding layer 124 can have any suitable thickness, such as from about 50 nm to about 200 nm. Other materials and thicknesses for padding layer 124 are within the spirit and scope of this disclosure.

Contact structure 120 can further include a trench conductor layer 134 vertically (e.g., in the z-direction) extending through padding layer 124 to contact gate structure 112. Trench conductor layer 134 can be referred to as a metal contact structure that can electrically bridge interconnect structure 150 and the underlying gate structure 112 (e.g., gate electrode 112B). Trench conductor layer 134 can include a conductor layer (not shown in FIG. 1B). The conductor layer can include Cu, Co, Ni, Ru, Rh, Ir, Os, Al, In, Ag, Au, W, or carbon nanotubes. In some embodiments, trench conductor layer 134 can further include a barrier liner layer (not shown in FIG. 1B). The barrier liner layer can include a metallic material (e.g., Ta or TiW), metal oxide (e.g., alumina, manganese oxide, chromium oxide, niobium oxide, titanium oxide, or combinations thereof), a metal nitride (e.g., TaN or TiN), a metal compound (e.g., alumina, manganese oxide, chromium oxide, niobium oxide, titanium oxide, and/or combinations thereof), a carbon containing material, or combinations thereof. Trench conductor layer 134 can have an average horizontal dimension (e.g., width in the x-direction) and a vertical dimension (e.g., height in the z-direction) based on a pitch size of FET 102. For example, trench conductor layer 134 can have an average horizontal dimension (e.g., width in the x-direction) from about 5 nm to about 30 nm and can have an average vertical dimension (e.g., height in the z-direction) from about 10 nm to about 50 nm. If trench conductor layer 134's width and/or height are beyond the above-noted upper limits, semiconductor device 100 may not meet the fin pitch requirement determined by the respective technology node (e.g., fin pitch may be required to be less than about 60 nm for a 22 nm technology node). If trench conductor layer 134's width and/or height are below the above-noted lower limits, contact structure 120 may introduce a higher contact resistance and/or a higher parasitic capacitance to FET 102, thus degrading FET 102's speed. In some embodiments, trench conductor layer 134 can be further formed over gate spacer 114's top surface 114$_T$ and/or over CESL 116's top surface 116. For example, trench conductor layer 134 can further include an extension portion 134$_{EXT}$ (discussed at method 200) formed above CESL 116 and above gate spacer 114. Based on the disclosure herein, other materials and dimensions for trench conductor layer 134 are within the spirit and scope of this disclosure.

Contact structure 120 can further include a trench conductor layer 130 vertically in the z-direction) extending through ILD layer 118 to contact S/D region 110. Trench conductor layer 130 can be referred to as FET 102's S/D metal contact structure that contacts FET 102's S/D regions 110. In some embodiments, trench conductor layer 130's bottom surface can be vertically (e.g., in the z-direction) lower than trench conductor layer 134's bottom surface. Trench conductor layer 130 can be made of any suitable conductive material, such as Co, W, Al, Cu, Ti, Ta, Rh, Ru, Mo, Ir, Os, Ni, and a silicide material. The silicide material can include NiSi, CoSi, nickel cobalt silicide (NiCoSi), platinum silicide (PtSi), and titanium silicon nitride (TiSiN). In some embodiments, trench conductor layer 130 can be free from a conductive nitride material. Trench conductor layer 130 can have an average horizontal dimension (e.g., width in the x-direction) and a vertical dimension height in the z-direction) based on a pitch size of PET 102. For example, trench conductor layer 130 can have an average horizontal dimension (e.g., width in the x-direction) from about 5 nm to about 30 nm and can have an average vertical dimension (e.g., height in the z-direction) from about 10 nm to about 50 nm. If trench conductor layer 130's width and/or height are beyond the above-noted upper limits, semiconductor device 100 may not meet the fin pitch requirement determined by the respective technology node (e.g., fin pitch may be required to be less than about 60 nm for a 22 nm technology node). If trench conductor layer 130's width and/or height are below the above-noted lower limits, contact structure 120 may introduce a higher contact resistance and/or a higher parasitic capacitance to PET 102, thus degrading FET 102's speed. Based on the disclosure herein, other materials and dimensions for trench conductor layer 130 are within the spirit and scope of this disclosure.

Contact structure 120 can further include an etch selective layer (ESL) 140 disposed between trench conductor layer 130 and interconnect structure 150. For example, ESL 140 can have top and bottom surfaces 140$_T$ and 140$_B$ that are respectively in contact with interconnect structure 150 and trench conductor layer 130, ESL 140 can be further formed over CESL 116's side surface. In some embodiments, ESL 140 can be in contact with an adjacent padding layer 124, ESL 140's top surface 140$_T$ can be substantially coplanar with padding layer 124's top surface 124$_T$. In some embodiments, ESL 140's top surface 140$_T$ can be substantially coplanar with ILD layer 118's top surface 118$_T$. In some embodiments, ESL 140's top surface 140$_T$ can be substantially coplanar with gate spacer 114's top surface 114$_T$ and/or substantially coplanar with CESL 116's top surface 116$_T$. In some embodiments, ESL 140's top surface 140$_T$ can be positioned above gate spacer 114's top surface 114$_T$ and/or positioned above CESL 116's top surface 116$_T$. ESL 140 can have a width W$_{140}$ from about 5 nm to about 40 nm or from about 8 nm to about 30 nm based on a pitch size of PET 102. If ESL 140's width W$_{140}$ is below the above-noted lower limits, contact structure 120 may introduce a higher contact resistance and/or a higher parasitic capacitance to PET 102, thus degrading PET 102's speed. On the other hand, if ESL 140's width W$_{140}$ is beyond the above-noted upper limits, semiconductor device 100 may not meet the fin pitch requirement determined by the respective technology node (e.g., fin pitch may be required to be less than about 60 nm for a 22 nm technology node). ESL 140 can have a height H$_{140}$ from about 5 nm to about 60 nm or from about 10 nm to about 50 nm based on a pitch size of FET 102. If ESL 140's height H$_{140}$ is below the above-noted lower limits, contact structure 120 may introduce a higher parasitic capacitance to FET 102, thus degrading FET 102's speed. On the other hand, if ESL 140's height H$_{140}$ is beyond the above-noted upper limits, semiconductor device 100 may not meet the fin pitch requirement determined by the respective technology node (e.g., fin pitch may be required to be less than about 60 nm for a 22 nm technology node). In some embodiments, ESL 140 can have an aspect ratio (e.g., a ratio of height H$_{140}$ to width W$_{140}$) can be from about 0.2 to about 10, from about 0.3 to about 8, from about 0.6 to about 8, from about 0.8 to about 8, from about 1 to about 8, from about 1.5 to about 8, from about 2 to about 8, or from about 3 to about 8. If ESL 140's aspect ratio is below the above-noted lower limits, contact structure 120 may introduce a higher parasitic capacitance to FEY 102, thus degrading ITT 102's speed. On the other hand, if ESL 140's aspect ratio is beyond the above-noted upper limits, semiconductor device 100 may not meet the fin pitch requirement determined by the respective technology node (e.g., fin pitch may be required to be less than about 60 nm for a 22 nm technology node).

ESL 140 can include dielectric materials that have different etching selectivity from padding layer 124. For example, padding layer 124 and ESL 140 can respectively be made of first and second dielectric materials. The first dielectric material can include silicon oxide, silicon nitride, or silicon oxynitride that have sufficient dielectric strength to reduce FET 102's leakage current. The second dielectric material can include a carbon-containing dielectric material, such as SiC, SiOC, and SiOCN, that can have different etching selectivity to the first dielectric material. The different etching selectivity between padding layer 124 and ESL 140 can reconcile the overlay shift of the lithography process (discuss at method 200) during the definition of trench conductor layer 134, thus preventing trench conductor layer 134 (discussed below) from landing on both gate structure 112 and trench conductor layer 130 to electrically short FET 102's gate and S/D terminals. In some embodiments, padding layer 124 and ESL 140 can respectively be made of third and fourth dielectric materials. The third dielectric material can include silicon oxide, silicon nitride, silicon oxynitride or SiOCN that have sufficient dielectric strength to reduce FET 102's leakage current. The fourth dielectric material can include a boron-containing dielectric material, such as BN, SiBN, SiBCN, and boron carbon nitride (BCN), that can have different etching selectivity to the third dielectric material. In some embodiments, ESL 140 can include dielectric materials that have different etching selectivity from CESL 116. In some embodiments, ESL 140 can include dielectric materials that have different etching selectivity from gate spacer 114. In some embodiments, ESL 140 can include flowable dielectric materials that have different etching selectivity from padding layer 124, CESL 116, and/or gate spacer 114. In some embodiments, padding layer 124 CESL 116, and/or gate spacer 114 can be made of a carbon-free (e.g., carbon concentration substantially equal to zero) dielectric material, and ESL 140 can include a carbon-containing dielectric material that can have different etching selectivity to the carbon-free dielectric material.

Further, ESL 140's upper portion (e.g., proximate to ESL 140's top surface 140$_T$, such as within a separation of about 50%, about 40%, about 30%, about 20%, about 10%, and about 5% of ESL 140's height H$_{140}$ from top surface 140$_T$) and ESL 140's lower portion (e.g. proximate to ESL 140's bottom surface 140$_B$, such as within a separation of about 50%, about 40%, about 30%, about 20%, about 10%, and about 5% of ESL 140's height H$_{140}$ from bottom surface 140$_B$) can be made of different materials from one another. For example, ESL 140's upper portion can be made of a dielectric material, such as SiC, that contains the Si—C—Si bonding and/or the Si—CH$_3$ bonding, and ESL 140's lower portion can be made of another dielectric material, such as compounds of silicon oxycarbide, silicon carbonitride, and silicon oxycarbonitride, that contains Si—O—Si bonding and/or Si—N—Si bonding. Accordingly, a carbon concentration of ESL 140's upper portion (e.g., proximate to top surface 140$_T$) can be greater than another carbon concentration of ESL 140's lower portion (e.g., proximate to bottom surface 140$_B$). Hence, ESL 140's upper portion can have different etching selectivity to padding layer 124 to reconcile the previously discussed lithography process's overlay shift, and ESL 140's lower portion can have a reduce porosity that provides an enhance dielectric strength to reduce FET 102's leakage current.

In some embodiments, ESL 140 can be made of a carbon-containing or a boron-containing dielectric material, where an oxygen concentration and/or a nitrogen concentration of the carbon-containing or the boron-containing dielectric material can be greater proximate to bottom surface 140$_B$ than proximate to top surface 140$_T$. For example, referring to FIG. 1G's profiles 151, 153, 155, 157, 159, and 161, ESL 140 can have an oxygen concentration and/or a nitrogen concentration gradually decreasing from a concentration C$_{max}$ (e.g., proximate to bottom surface 140$_B$) to a concentration C$_{min}$ (e.g., proximate to top surface 140$_T$). In some embodiments, concentration C$_{max}$ can be greater than about 10%, greater than about 20%, greater than about 30%, greater than about 50%, or greater than about 70%. If concentration C$_{max}$ is below the above-noted lower limits, ESL 140's lower portion may not have sufficient dielectric strength to lower FET 102's leakage current. In some embodiments, concentration C$_{min}$ can be less than greater than about 20%, less than about 10%, less than about 5%, or less than about 2%. If concentration C$_{min}$ is beyond the above-noted upper limits, ESL 140's upper portion may not have sufficient etching selectivity to padding layer 124 to avoid trench conductor layers 132 (discussed below) and/or 134 landing on both gate structure 112 and trench conductor layer 130. In some embodiments, referring to FIG. 1G's profile 151, ESL 140's oxygen and/or nitrogen concentration can substantially linearly decrease from concentration C$_{max}$ to concentration C$_{min}$. In some embodiments, referring to FIG. 1G's profile 153, ESL 140's oxygen and/or nitrogen concentration can increase from a concentration C$_{init}$ to concentration C$_{max}$ that separates from bottom surface 140 by a separation Z$_1$ and can decrease from concentration C$_{max}$ to concentration C$_{min}$ with any suitable gradient slope, such as about −1 dB/decade. Concentration C$_{init}$ can be less than concentration C$_{max}$, such as from about 5% to concentration C$_{max}$, from about 10% to concentration C$_{max}$, or from about 20% to concentration C$_{max}$. If concentration C$_{init}$ is below the above-noted lower limits, ESL 140's lower portion may not have sufficient dielectric strength to lower FET 102's leakage current. Separation Z$_1$ can be any suitable separation proximate to bottom surface 140$_B$, such as less than about 10% of height H$_{140}$, less than about 5% of height H$_{140}$, or less than about 3% of height H$_{140}$. If separation Z$_1$ is beyond the above-noted lower limits, ESL 140's upper portion may not provide sufficient etching selectivity to padding layer 124 to avoid trench conductor layers 132 and/or 134 landing on both gate structure 112 and trench conductor layer 130. In some embodiments, referring to FIG. 1G's profile 155, ESL 140's oxygen and/or nitrogen concentration can have a substantially constant concentration C$_{max}$ within separation Z$_1$ from bottom surface 140$_B$ and can decrease from concentration C$_{max}$ to concentration C$_{min}$ with any suitable gradient slope, such as about −1 dB/decade and about −10 dB/decade. In some embodiments, referring to FIG. G's profile 157, ESL 140's oxygen and/or nitrogen concentration can be substantially constant at concentration C$_{min}$ within separation Z$_1$ from bottom surface 140$_B$ to provide an etching selectivity from FET 102's inner spacer (hot shown in FIGS. 1A-1G), and ESL 140's oxygen and/or nitrogen concentration can be increased from concentration Gain at separation Zr to concentration proximate to top surface 140$_T$ to enhance ESL 140's dielectric strength. In some embodiments, referring to FIG. 1G's profile 159, ESL 140's oxygen and/or nitrogen concentration can have a substantially constant concentration C$_{max}$ within separation Z$_2$ from bottom surface 140$_B$, and ESL 140's oxygen and/or nitrogen concentration can decrease from concentration C$_{max}$ at separation Z$_2$ to concentration Grin with any suitable gradient slope, such as about −10 dB/decade and about −20 dB/decade. Separation Z$_2$ can be any suitable separation, such as greater than about 50% of height H$_{140}$, greater than about 70% of height H$_{140}$, or greater than about 90% of height H$_{140}$. If separation Z$_2$ is below the above-noted lower limits, ESL 140's lower portion may not have sufficient dielectric strength to lower FET 102's leakage current.

Figure 1C:
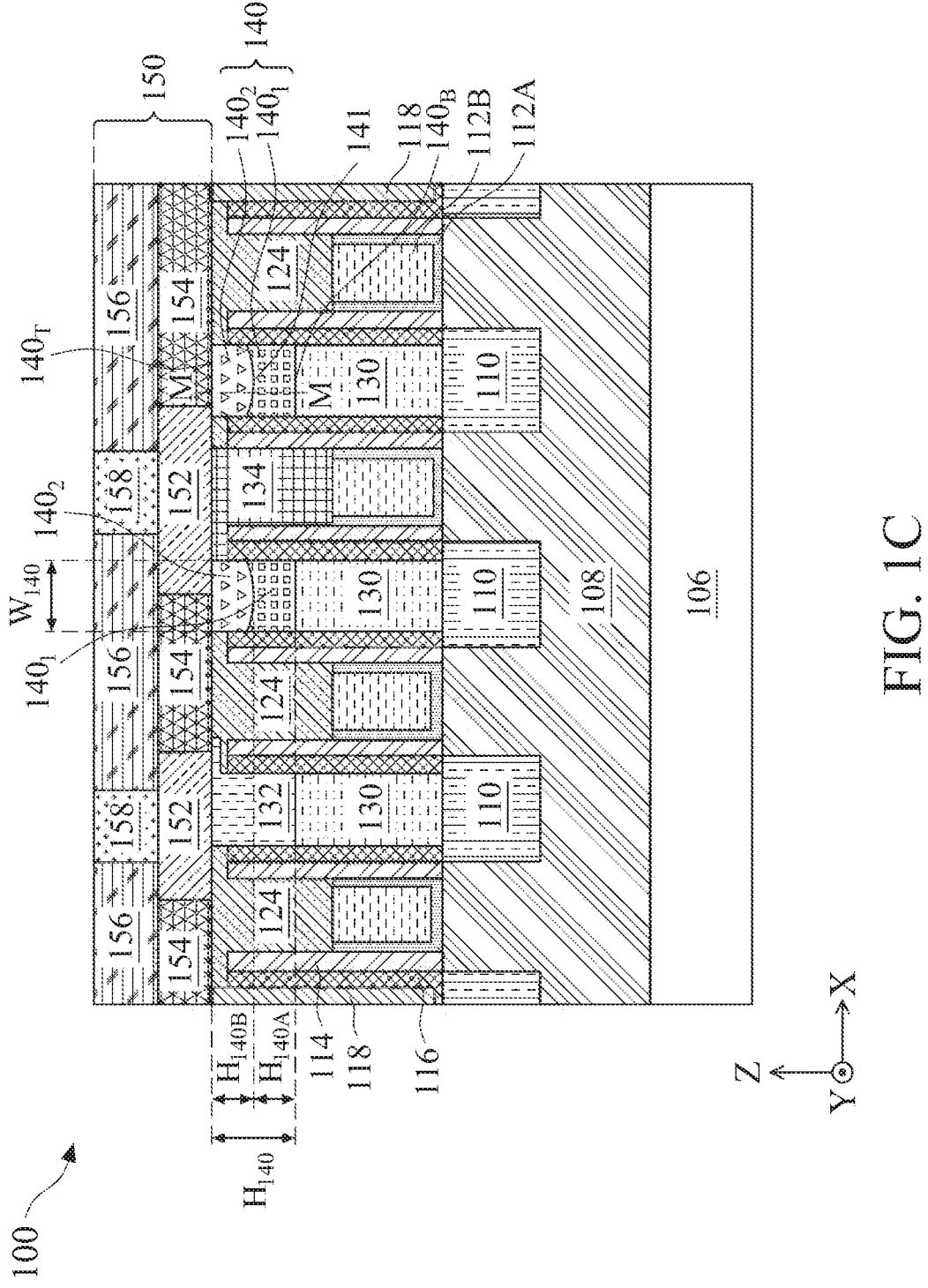

In some embodiments, referring to FIG. 1C, ESL 140 can be a multilayer structure. For example, ESL 140 can include an ESL 140$_1$ and an ESL 140$_2$ formed over and in contact with ESL 140$_1$ at a junction 141. In some embodiments, junction 141 can be a dishing-like interface between ESL $140_1$ and an ESL $140_2$. In some embodiments, junction 141 can be substantially parallel to substrate 106. ESL $140_1$ can include ESL 140's bottom surface $140_B$ and can include an oxygen-containing and/or a nitrogen-containing dielectric material, such as silicon oxide, silicon nitride, silicon oxynitride and SiOCN, that can provide sufficient dielectric strength to reduce FET 102's leakage current, ESL $140_2$ can include ESL 140's top surface $140_T$ and can include a carbon-containing and/or a boron-containing dielectric material, such as BN, BCN, and SiC, that can have different etching selectivity to padding layer 124, CESL 116, and/or gate spacer 114. In some embodiments, ESL $140_1$'s top and bottom portions can be made of an identical dielectric material. In some embodiments, ESL $140_2$'s top and bottom portions can be made of an identical dielectric material. In some embodiments, one or more of ESL $140_1$ and ESL $140_2$ can be made of a carbon-containing or a boron-containing dielectric material, where an oxygen concentration and/or a nitrogen concentration of the carbon-containing or the boron-containing dielectric material can be greater proximate to bottom surface $140_B$ than proximate to top surface $140_T$. For example, the previous discussion of FIG. 1G's profiles 151, 153, 155, 157, 159, and 161 can be applied to one or more of ESL $140_1$ and ESL $140_2$, which is not described here for simplicity purpose. ESL $140_1$ can have a height H1.401 (e.g., a vertical separation between trench conductor layer 130 and a bottommost vertex of junction 141) that is suitable for ESL 140 to provide sufficient etching selectivity and sufficient dielectric strength to avoid the lithography process's overlay shill and FET 102's leakage current, respectively. In some embodiments, a ratio of ESL $140_1$'s height $H_{140A}$ to ESL 140's height $H_{140}$ can be from about 0.3 to 0.9, from about 0.4 to about 0.8, or from about 0.5 to about 0.8. If the ratio of ESL $140_1$'s height $H_{140A}$ to ESL 140's height $H_{140}$ is below the above-noted lower limits, ESL 140 may not have sufficient dielectric strength to lower FET 102's leakage current. If the ratio of ESL $140_1$'s height $H_{140A}$ to ESL 140's height $H_{140}$ is beyond the above-noted upper limits, ESL 140 may not have sufficient etching selectivity to padding layer 124 to avoid trench conductor layers 132 and/or 134 landing on both gate structure 112 and trench conductor layer 130. ESL $140_2$ can have a height $H_{140B}$ (e.g., a vertical separation between interconnect structure 150 and a bottommost vertex of junction 141) that is suitable for ESL 140 to provide sufficient etching selectivity and sufficient dielectric strength to avoid the lithography process's overlay shift and FET 102's leakage current, respectively. In some embodiments, a ratio of ESL $140_2$'s height $H_{140B}$ to ESL 140's height $H_{140}$ can be from about 0.1 to 0.7, from about 0.2 to 0.6, or from about 0.2 to 0.5. If the ratio of ESL $140_2$'s height $H_{140B}$ to ESL 140's height $H_{140}$ is below the above-noted lower limits, ESL 140 may not have sufficient etching selectivity to padding layer 124 to avoid trench conductor layers 132 and/or 134 landing on both gate structure 112 and trench conductor layer 130. If the ratio of ESL $140_2$'s height $H_{140B}$ to ESL 140's height $H_{140}$ is beyond the above-noted upper limits, ESL 140 may not have sufficient dielectric strength to lower FET 102's leakage current. In some embodiments, the sum of heights $H_{140A}$ and $H_{140B}$ can be substantially equal to or less than ESL 140's height $H_{140}$.

Figure 1D:
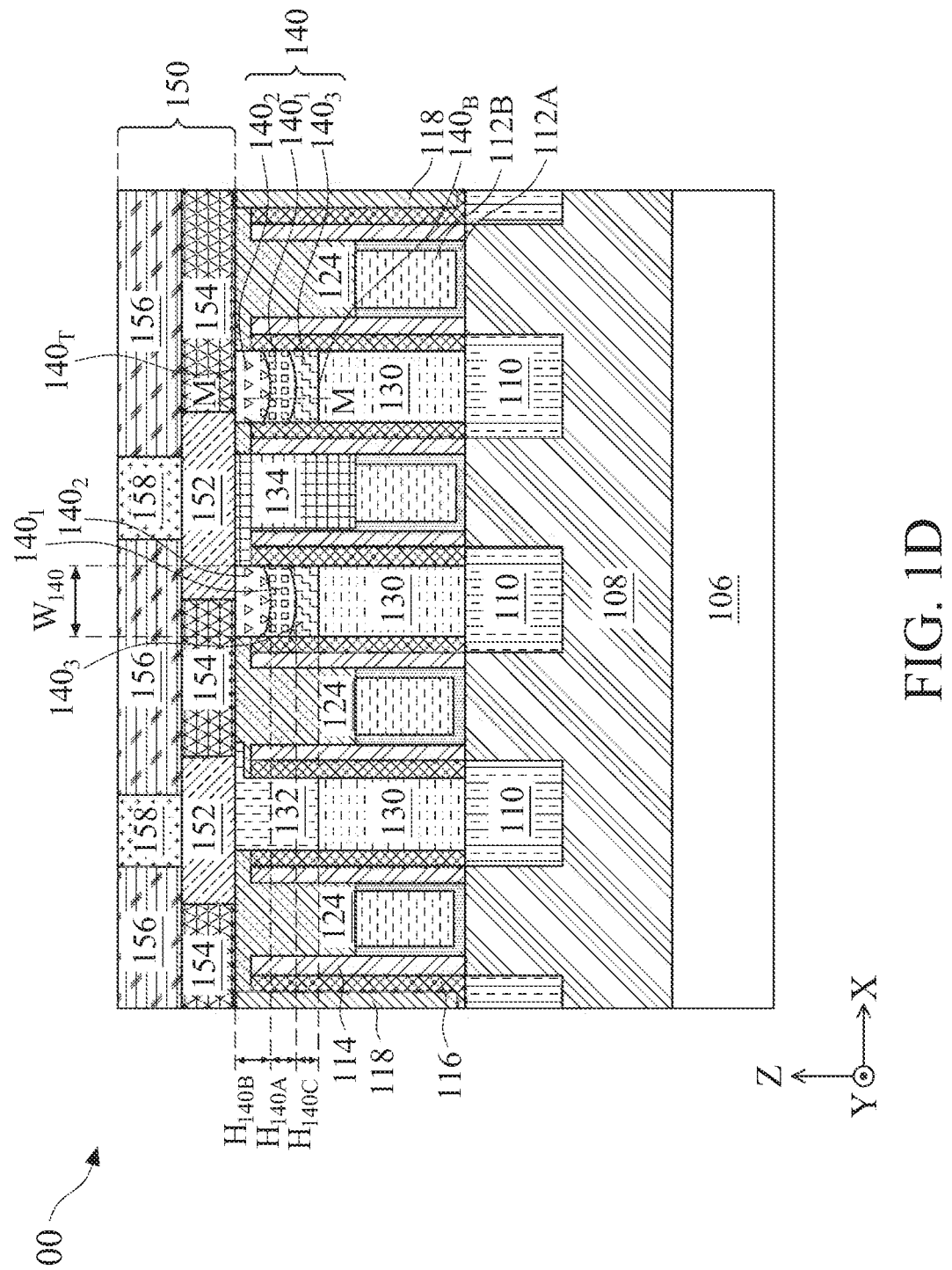

In some embodiments, referring to FIG. 1D, ESL 140 can include a capping layer $140_3$ formed between ESL $140_1$ and trench conductor layer 130. For example, capping layer $140_3$ can include ESL 140's bottom surface $140_B$ over and in contact with trench conductor layer 130. Capping layer $140_3$ can be made of any suitable oxygen-deficient conductive material and/or oxygen-deficient dielectric material that can prevent the underlying trench conductor layer 130 from being oxidized during the formation of ESLs $140_1$ and $140_2$. For example, capping layer $140_3$ can be made of a metallic material, such as Ru, W, and Mo. In some embodiments, capping layer $140_3$ can be made of a conductive material, such as a conductive nitride TaN or TiN). In some embodiments, capping layer $140_3$ can be made of a carbon-containing dielectric material, such as SiC, SiCO, and SiCN. In some embodiments, capping layer $140_3$ can incorporate less oxygen or less nitrogen concentration than the oxygen or the nitrogen concentration in ESL $140_1$. For example, referring to FIG. 1G's profile 161, ESL $140_1$ can have an oxygen concentration and/or nitrogen concentration of concentration $C_{max}$, and capping layer $140_3$ can have an oxygen concentration and/or nitrogen concentration less than concentration $C_{max}$. In some embodiments, capping layer $140_3$ can have an oxygen concentration and/or nitrogen concentration of about concentration $C_{min}$. In some embodiments, capping layer $140_3$ can be made of an oxygen-free (e.g., oxygen concentration substantially equal to zero) and/or a nitrogen-free (e.g., nitrogen concentration substantially equal to zero) dielectric material. Capping layer $140_3$ can have a vertical (e.g., in the z-direction) height $H_{140C}$ that is sufficient to prevent the underlying trench conductor layer 130 from being oxidized during the formation of ESLs $140_1$ and $140_2$. For example, a ratio of capping layer $140_3$'s height $H_{140C}$ to ESL 140's height $H_{140}$ can be from about 0.1 to 0.2. If the ratio of capping layer $141_3$'s height $H_{140C}$ to ESL 140's height $H_{140}$ is below the above-noted lower limits, capping layer $140_3$ may not have sufficient thickness to prevent underlying trench conductor layer 130 from being oxidized during the formation of ESLs $140_1$ and $140_2$. If the is the ratio of capping layer $140_3$'s height $H_{140C}$ to ESL 140's height is beyond the above-noted upper limits, ESL 140 may not have sufficient etching selectivity to padding layer 124 to avoid trench conductor layers 132 and/or 134 landing on both gate structure 112 and trench conductor layer 130. In some embodiments, the sum of heights $H_{140A}$, $H_{140B}$, and $H_{140C}$ can be substantially equal to or less than ESL 140's height $H_{140}$.

Figure 1E:
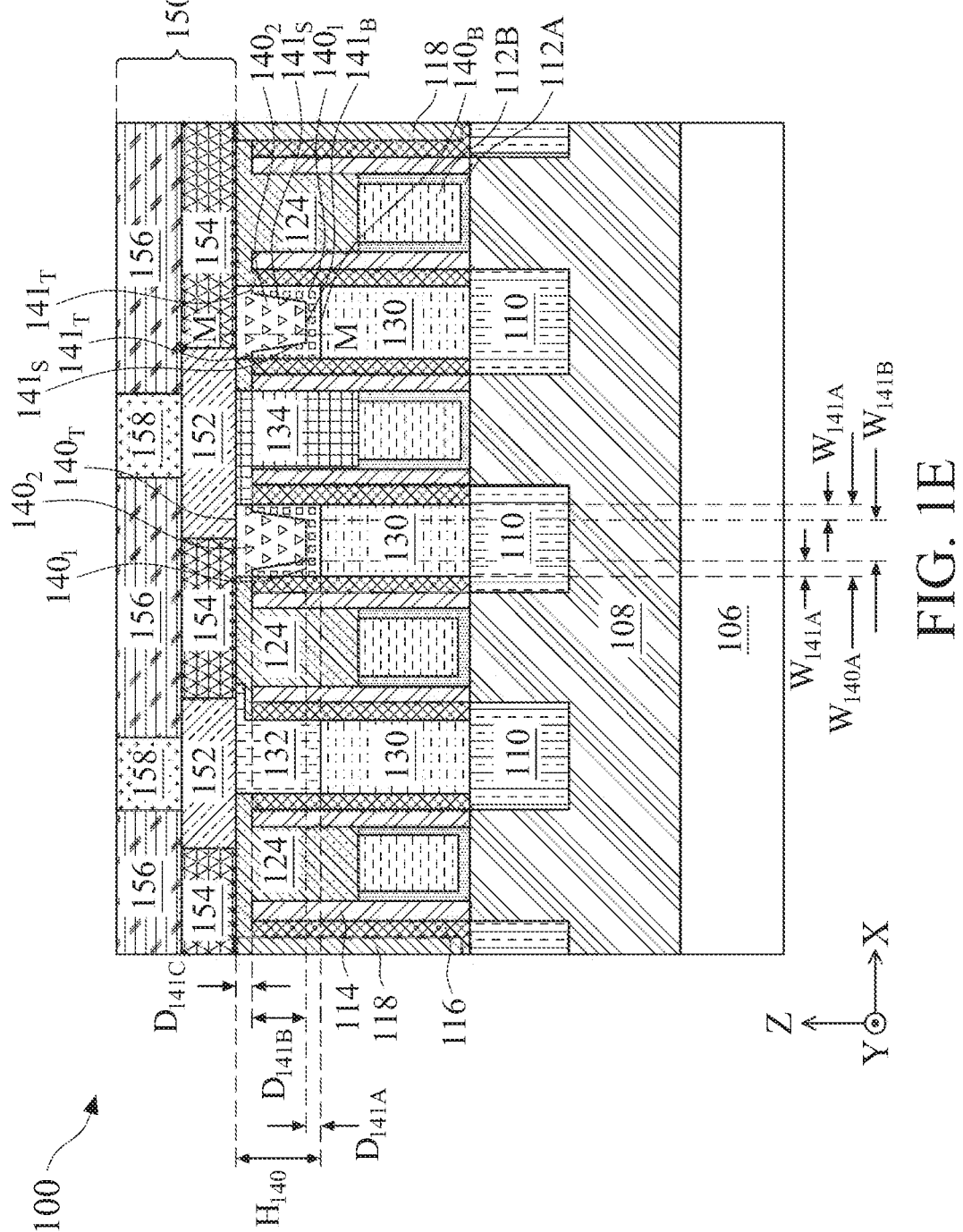
Figure 1F:
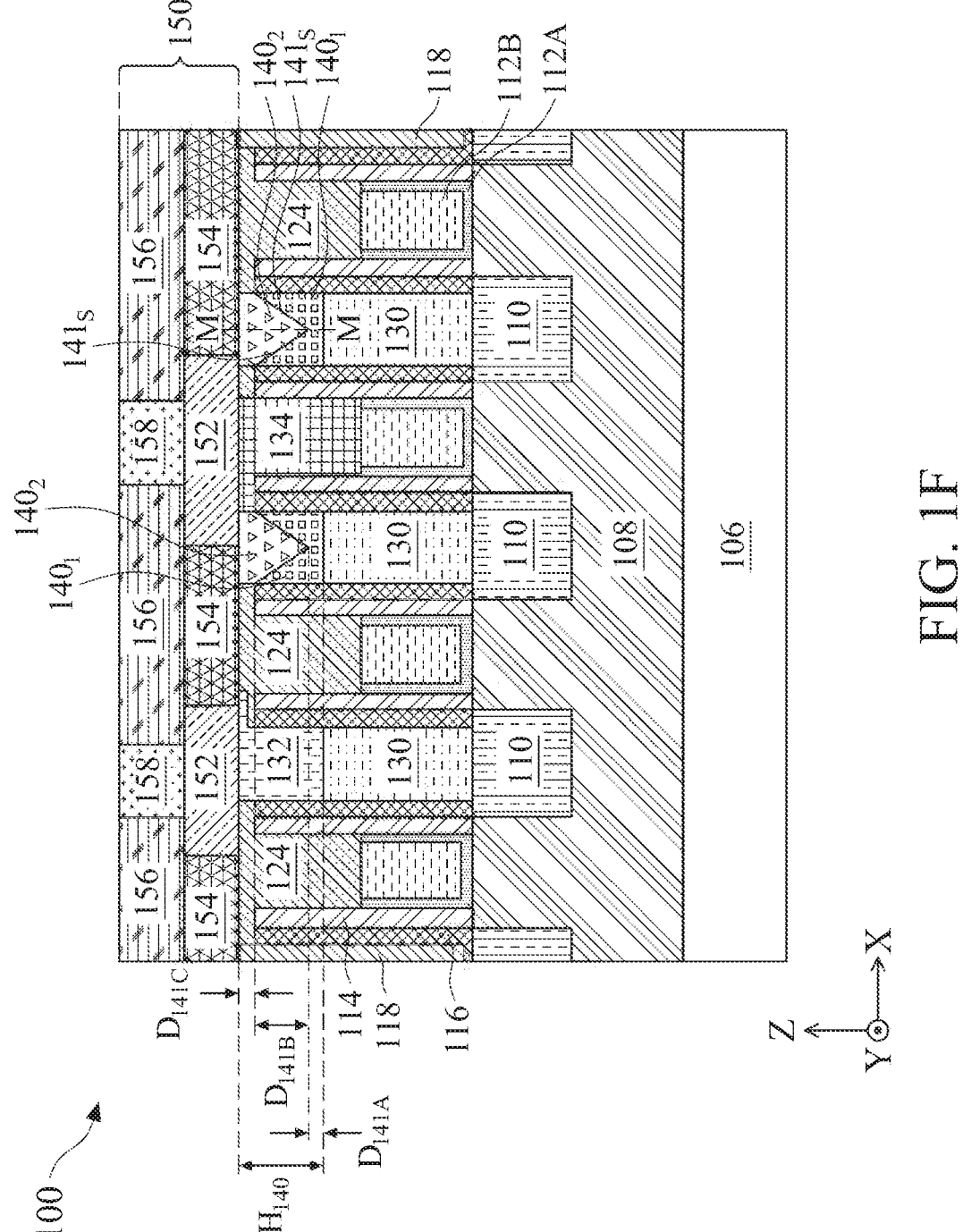
Figure 1G:
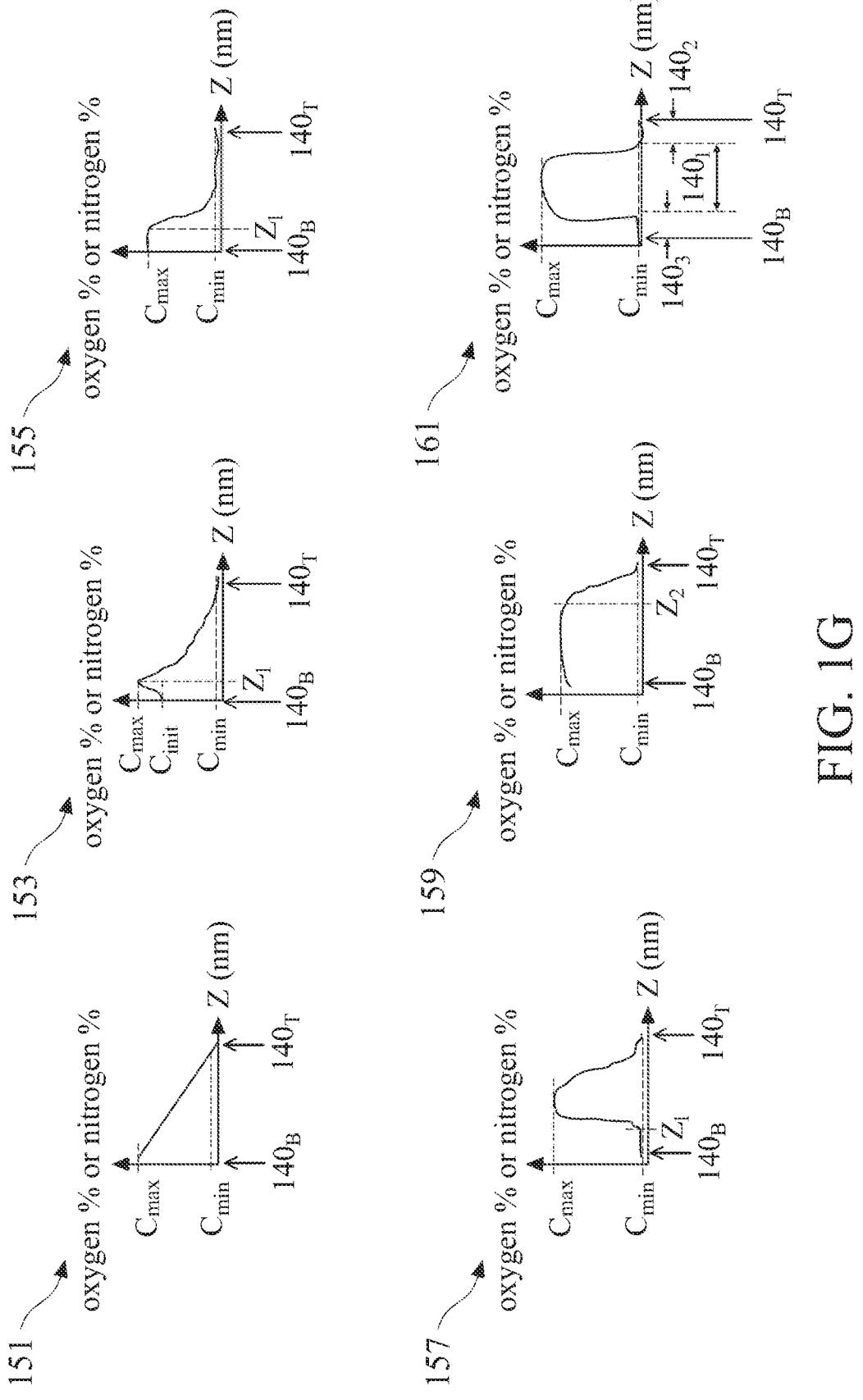
FIG. 1G illustrates atomic concentration profiles of a dielectric layer of a semiconductor device, according to some embodiments.

In some embodiments, referring to FIGS. 1E and 1F, ESL $140_2$ can be formed protruding into ESL $140_1$. For example, referring to FIG. 1E, ESL $140_2$ can be in contact with ESL $140_1$ along junction 141, where junction 141 can include a top surface $141_T$, a bottom surface $141_B$ protruding into ESL $140_1$, and side surfaces $141_S$ that connect top and bottom surfaces $141_T$ and $141_B$. In some embodiments, top and bottom surfaces $141_T$ and $141_B$ can be substantially parallel to substrate 106. In some embodiments, as shown in FIG. 1F, junction 141's two opposite side surfaces $141_S$ can be connected to each other (e.g., a V-groove). With bottom surface $141_B$ and/or side surface $141_S$ protruding into ESL $140_1$, ESL $140_2$'s volume can be expanded to enhance ESL $140_2$'s etching selectivity to reconcile the lithography overlay shift, thus avoiding trench conductor layers 132 and/or 134 landing on both gate structure 112 and trench conductor layer 130. Junction 141's bottom surface $141_B$ can be separated from ESL 140's bottom surface $140_B$ by a vertical (e.g., in the z-direction) separation $D_{141A}$. In some embodiments, a ratio of separation Dull to ESL 140's height $H_{140}$ can be from about 0.05 to about 0.6, from about 0.4 to 0.6, or from about 0.1 to about 0.3. If the ratio of separation $D_{141A}$ to height $H_{140}$ is below the above-noted lower limits, ESL 140 may not have sufficient dielectric strength to lower FET 102's leakage current. If the ratio of separation $D_{141A}$ to height $H_{140}$ is beyond the above-noted upper limits, ESL 140 may not have sufficient etching selectivity to padding layer 124 to avoid trench conductor layers 132 and/or 134 landing on both gate structure 112 and trench conductor layer 130.

Junction 141's bottom surface 141$_B$ can be separated from junction 141's top surface 141$_T$ by a vertical (e.g., in the x-direction) separation $D_{141B}$. In some embodiments, a ratio of separation Drain to ESL 140's height $H_{140}$ can be from about 0.7 to 0.95. If the ratio of separation $D_{141B}$ to height $H_{140}$ is below the above-noted lower limits, ESL 140 may not have sufficient etching selectivity to padding layer 124 to avoid trench conductor layers 132 and/or 134 landing on both gate structure 112 and trench conductor layer 130. If the ratio of separation $H_{141B}$ to height $H_{140}$ is beyond the above-noted upper limits, ESL 140 may not have sufficient dielectric strength to lower FET 102's leakage current.

Junction 141's top surface 141$_T$ can be separated from ESL 140's top surface 140$_T$ by a vertical (e.g., in the z-direction) separation $D_{141C}$. In some embodiments, a ratio of separation $H_{141C}$ to ESL 140's height $H_{140}$ can be from about 0.1 to 0.2. If the ratio of separation $D_{141C}$ to height $H_{140}$ is below the above-noted lower limits, ESL 140 may not have sufficient etching selectivity to padding layer 124 to avoid trench conductor layers 132 and/or 134 landing on both gate structure 112 and trench conductor layer 130. If the ratio of separation $D_{141C}$ to height $H_{140}$ is beyond the above-noted upper limits, ESL 140 may not have sufficient dielectric strength to lower FET 102's leakage current.

Junction 141's side surface 141$_S$ can be separated from the adjacent CESL 116 or from the adjacent gate spacer 114 by a lateral in the x-direction) separation $W_{141A}$ (shown in FIG. 1E). In some embodiments, separation $D_{141A}$ can be greater than separation $W_{141A}$ to provide sufficient dielectric strength to reduce FET 102's leakage current. In some embodiments, a ratio of separation $W_{141A}$ to ESL 140's width $W_{140}$ can be from about 0.1 to 0.4. If the ratio of separation $W_{141A}$ to width $W_{140}$ is below the above-noted lower limits, ESL 140 may not have sufficient dielectric strength to lower FET 102's leakage current. 11 the ratio of separation $W_{141A}$ to width $W_{140}$ is beyond the above-noted upper limits, ESL 140 may not have sufficient etching selectivity to padding layer 124 to avoid trench conductor layers 132 and/or 134 landing on both gate structure 112 and trench conductor layer 130.

Junction 141's bottom surface 141$_B$ can separate two adjacent side surfaces 141$_S$ by a lateral (e.g., in the x-direction) separation $W_{141B}$. In some embodiments, a ratio of separation $W_{141B}$ to ESL 140's width $W_{140}$ can be from about 0.2 to 0.8. If the ratio of separation $W_{141B}$ to width $W_{140}$ is below the above-noted lower limits, ESL 140 may not have sufficient etching selectivity to padding layer 124 to avoid trench conductor layers 132 and/or 134 landing on both gate structure 112 and trench conductor layer 130. If the ratio of separation $W_{141B}$ to width $W_{140}$ is beyond the above-noted upper limits, ESL 140 may not have sufficient dielectric strength to lower FET 102's leakage current.

In some embodiments, the above discussion of padding layer 124 and ESL 140 in FIGS. 1A-1G can be interchangeably applied to one another (e.g., the previous discussion of padding layer 124 can be applied to ESL 140, and the previous discussion of ESL 140 can be applied to padding layer 124).

Contact structure 120 can further include a trench conductor layer 132 vertically (e.g., in the z-direction) extending through ESL 140 to contact trench conductor layer 130, Trench conductor layer 132 can electrically connect trench conductor layer 130 (e.g., FET 102's S/D metal contact structure) to interconnect structure 150. Trench conductor layer 132 can have any suitable horizontal dimension (e.g., width in the x-direction) that is substantially equal to or less than ESL 140's width $W_{140}$. For example, trench conductor layer 132's horizontal (e.g., in the x-direction) width can be substantially equal to width $W_{140}$, where trench conductor layer 132 can be in contact with adjacent CESL 116. In some embodiments, trench conductor layer 132's horizontal (e.g., in the x-direction) width can be less than width $W_{140}$, where ESL 140 can separate trench conductor layer 132 from the adjacent CESL 116 (not shown in FIGS. 1A-lF). In some embodiments, trench conductor layer 132 can further include an extension portion 132$_{EXT}$ (discussed at method 200) formed above CESL 116 and above gate spacer 114. Trench conductor layer 132 can be substantially coplanar with adjacent padding layer 124 and/or CESL 116. In some embodiments, trench conductor layer 132's top surface can be substantially coplanar with trench conductor layer 134's top surface. In some embodiments, trench conductor layer 132's top surface can be substantially coplanar with ESL 140's top surface 140$_T$. In some embodiments, trench conductor layer 132's bottom surface can be substantially coplanar with ESL 140's bottom surface 140$_B$. In some embodiments, trench conductor layer 132 can protrude into the underlying trench conductor layer 130 (not shown in FIGS. 1A-1F). Trench conductor layer 132 can be made of any suitable conductive material, such as W, Al, Cu, Co, Ti, Ta, Ru, Mo, a silicide material, and a conductive nitride material. In some embodiments, trench conductor layer 132 can be substantially free from containing a conductive nitride material. Based on the disclosure herein, other materials for trench conductor layer 132 are within the spirit and scope of this disclosure.

Interconnect structure 150 can provide metal wire routings for the underlying FETs 102. Interconnect structure 150 can include a layer of insulating material 154, a layer of conductive material 152 embedded in layer of insulating material 154, a layer of insulating material 156 disposed over layer of conductive material 152, and a trench conductor layer 158 formed through layer of insulating material 156 and in contact with layer of conductive material 152. Layer of conductive material 152 can be a lateral (e.g., in the x-y plane) routing for the interconnect structure 150. Each of trench conductor layers 130, 132, and 134 can be a vertical (e.g., in the z-direction) wire routing in contact structure 120, and trench conductor layer 158 can be a vertical (e.g., in the z-direction) wire routing for the interconnect structure 150. Accordingly, in some embodiments, an aspect ratio (e.g., a ratio of height to width) of layer of conductive material 152 can be less than that of each of trench conductor layers 130, 132, 134, and 158. In some embodiments, a ratio of layer of conductor material 152's aspect ratio to each of trench conductor layers 130, 132, 134, and 158's aspect ratio can be less than about 1, less than about 0.8, less than about 0.6, less than about 0.4, less than about 0.2, or less than about 0.1. If the ratio of layer of conductor material 152's aspect ratio to each of trench conductor layers 130, 132, 134, and 158's aspect ratio is beyond the above-noted upper limits, interconnect structure 150 may not meet the fin pitch requirement determined by the respective technology node. Layer of conductive material 152 can be disposed over one or more of trench conductor layers 132 and 134 to electrically connect to the underlying gate structure 112 and S/D regions 110. Trench conductor layer 158 can electrically connect layer of conductive material 152 to another vertical (e.g., in the z-direction) interconnect structures 150's layer of conductive material 152 (not shown in FIGS. 1A-1F). Layer of conductive material 152 and trench conductor layer 158 can be made of any suitable conductive material, such as W, Al, Cu, Co, Ti, Ta, Ru, Mo, a silicide material, and a conductive nitride material. Layer of insulating material 156 and layer of insulating material 154 can be made of a suitable dielectric material, such as silicon oxide, silicon nitride, silicon oxynitride, a low-k dielectric, and a high-k dielectric. Based on the disclosure herein, other materials for layer of conductive material 152, trench conductor layer 158, and layer of insulating material 156, and layer of insulating material 154 are within the spirit and scope of this disclosure.

FIG. 2 is a flow diagram of an example method 200 for fabricating semiconductor device 100, according to some embodiments. For illustrative purposes, the operations illustrated in FIG. 2 will be described with reference to FIGS. 3-5, 6A, 6B, 7A-7K, and 8-14, FIG. 3 is an isometric view of semiconductor device 300 (e.g., semiconductor device 300 can represent stages of fabrication to form semiconductor device 100) at various stages of its fabrication, according to some embodiments. FIGS. 4, 5, 6A, 6B, 7A-7K, and 8-14 are cross-sectional views along line B-B of FIG. 3 at various stages of its fabrication, according to some embodiments. Operations can be performed in a different order or not performed depending on specific applications. Method 200 may not produce a complete semiconductor device 100. Accordingly, it is understood that additional processes can be provided before, during, and after method 200, and that some other processes may be briefly described herein. Further, the discussion of elements in FIGS. 1A-1G, 3-5, 6A, 6B, 7A-7K, and 8-14 with the same annotations applies to each other, unless mentioned otherwise.

Figure 3:
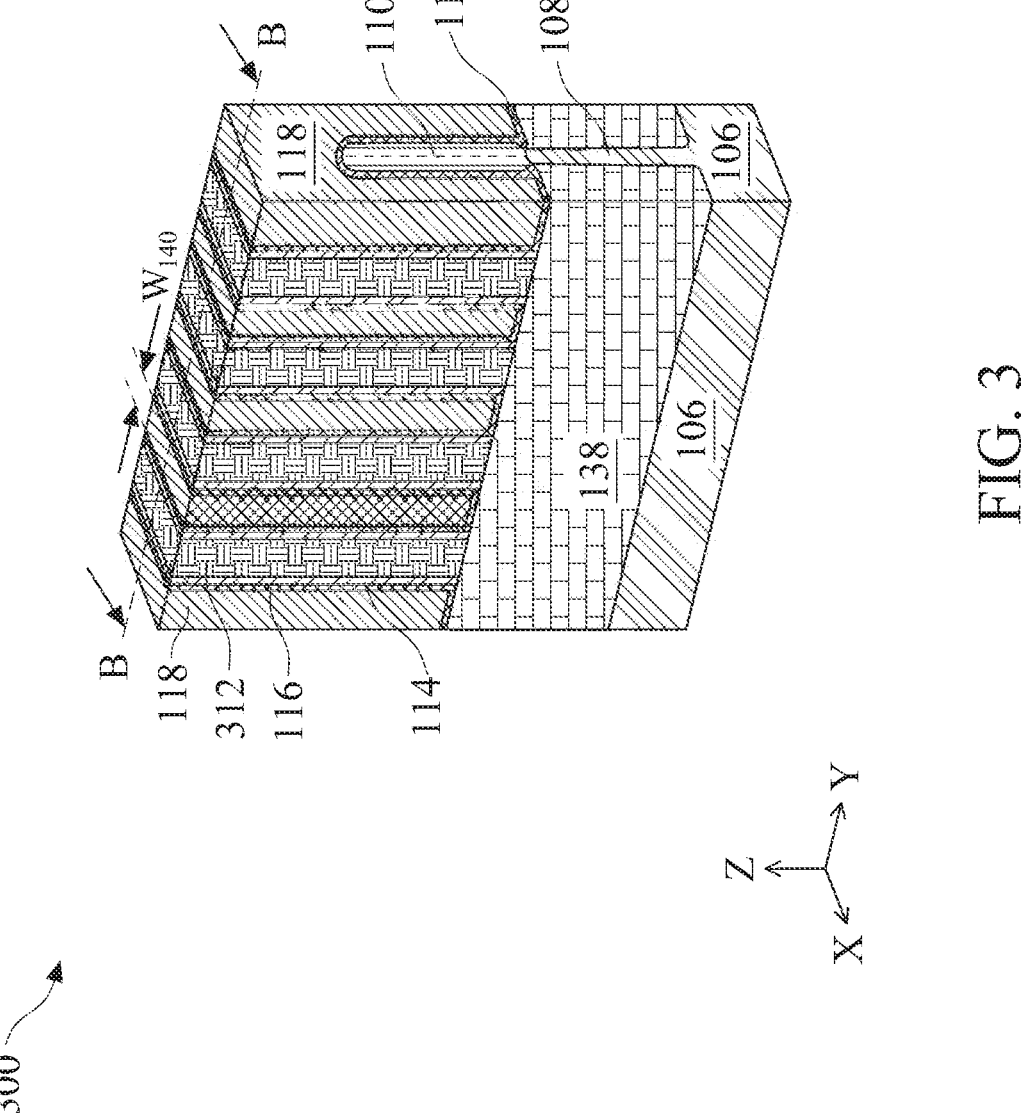
FIG. 3 illustrates an isometric view of a semiconductor device at a stage of its fabrication process, according to some embodiments.

Referring to FIG. 2, in operation 205, a first dielectric layer is formed over a first metal contact structure of a transistor structure. For example, FIG. 5 shows padding layer 124 formed over FETs 102's gate structure 112 as described with reference to FIGS. 3-5. Operation 205 can begin with providing a semiconductor device 301). Referring to FIG. 3, semiconductor device 300 can include fin structure 108 traversed by a sacrificial gate structures 312 and encapsulated by ILD layer 118. By way of example and not limitation, the process of forming semiconductor device 300 can include forming fin structure 108 on substrate 106, forming STI region 138 adjacent to fin structure 108, forming sacrificial gate structure 312 and gate spacers 114 traversing through fin structure 108, forming S/D regions 110 in fin structure 108, forming CESL 116 not covered by sacrificial gate structure 312, and ILD layer 118 with width $W_{140}$ over CESL 116. Based on the disclosure herein, other formation methods for semiconductor device 300 are within the spirit and scope of this disclosure.

Figure 4:
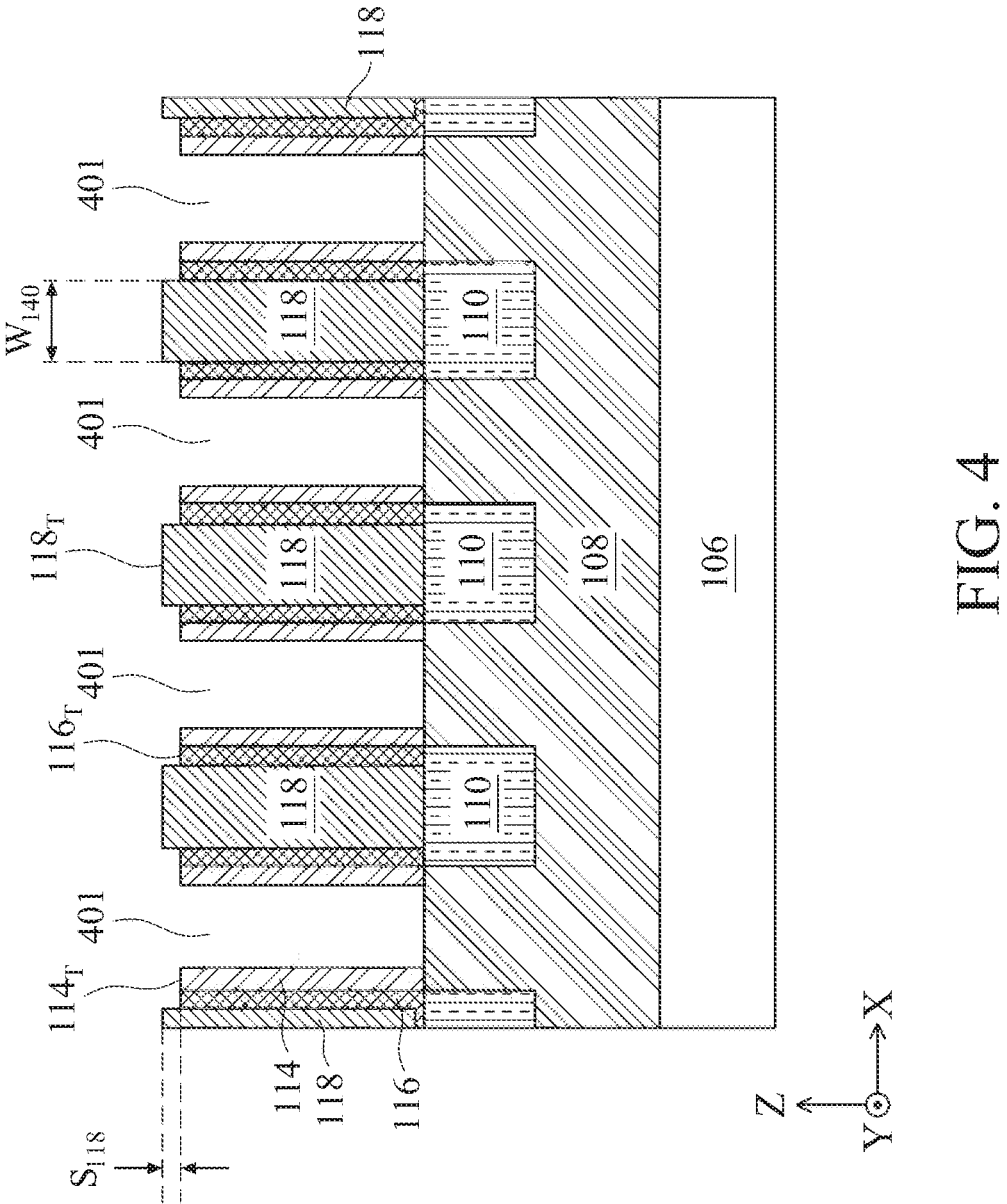
FIGS. 4, 5, 6A, 6B, 7A-7K, and 8-14 illustrate cross-sectional views of a semiconductor device at various stages of its fabrication process, according to some embodiments.
Figure 5:
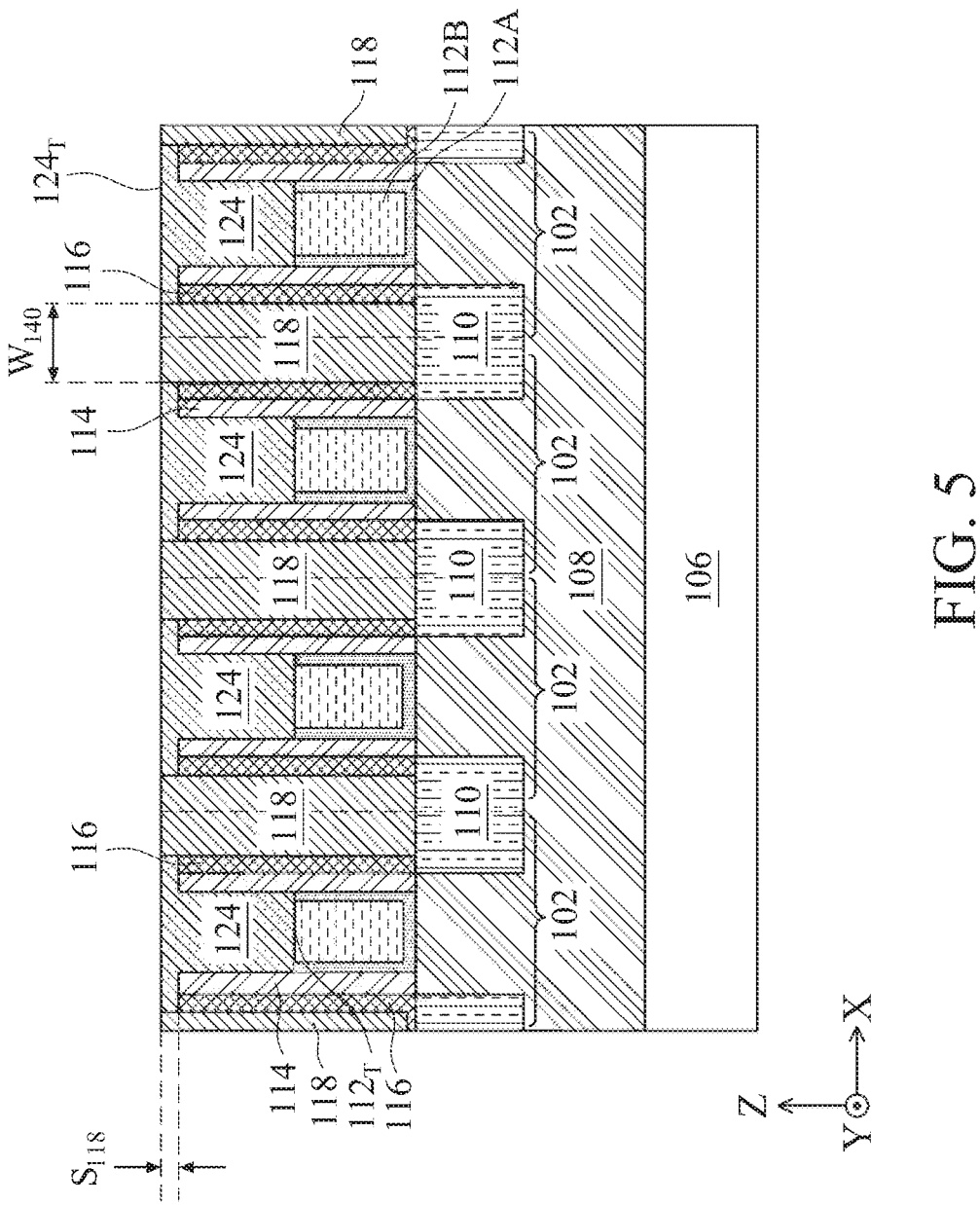

Referring to FIG. 4, operation 205 can further include removing sacrificial gate structures 312 to form recess structures 401 using an etching process. Recess structures can expose fin structure 108 and gate spacers 114. In some embodiments, the process of removing sacrificial gate structures 312 can further include removing gate spacers 114 and/or removing CESL 116. Accordingly, ILD layer 118's top surface $118_T$ can be positioned higher than gate spacers 114's top surface $114_T$ and/or CESL 116' top surface $116_T$ by a suitable separation $S_{118}$, such as from about 0 nm to about 5 nm, after forming recess structures 401. In some embodiments, top surfaces $118_T$, $114_T$ and/or $116_T$ can be substantially coplanar with one another after forming recess structures 401.

Referring to FIG. 5, operation 205 can further include (i) forming gate structures 112 in recess structures 401, and (ii) forming padding layer 124 over gate structures 112 using a deposition process and a chemical mechanic polishing (CMP) process. In some embodiments, the process of forming gate structures 112 can further include (i) depositing gate dielectric layer 112A in recess structures 401, (ii) depositing gate electrode 112B over gate dielectric layer 112A, and (iii) removing an upper portion of gate dielectric layer 112A and an upper portion of gate electrode 112B. Accordingly, gate structure 112's top surface $112_T$ can be positioned lower than gate spacers 114's top surface $114_T$ and/or CESL 116' top surface $116_T$ after forming gate structures 112. Based on the disclosure herein, other formation methods for gate structure 112 are within the spirit and scope of this disclosure.

Figure 6A:
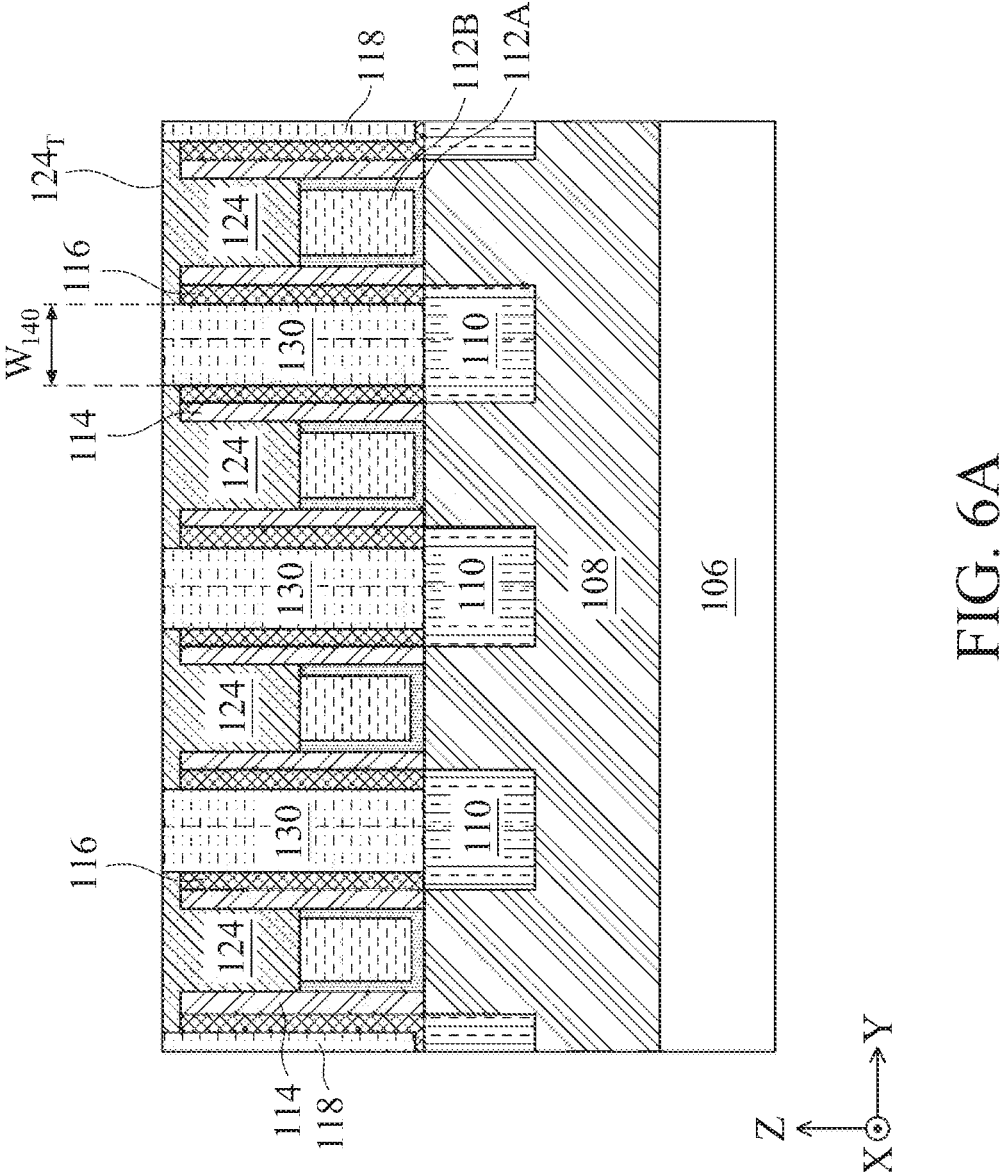

Referring to FIG. 2, in operation 210, a second dielectric layer is formed over a second metal contact structure of the transistor structure. For example, as shown in FIGS. 7A-7H, ESL 140 can be formed over trench conductor layers 130 as described with reference to FIGS. 6A, 6B, and 7A-7K. Referring to FIG. 6A, the process for forming ESL 140 can include forming trench conductor layers 130 over and in contact with S/D regions 110. By way of example and not limitation, the process of forming trench conductor layer 130 can include (i) removing, via an etching process, portions of ILD layer 118 and CESL 116 from the structure of FIG. 5 to expose S/D regions 110, (ii) depositing conductive materials to contact the exposed S/D regions 110, and (iii) coplanarizing, via a CMP process, the deposited trench conductor layers 130 with padding layer 124. In some embodiments, the process of forming trench conductor layer 130 can further include forming a silicide layer in contact with S/D regions 110 by reacting the deposited conductive materials with S/D regions 110 using an annealing process.

Figure 6B:
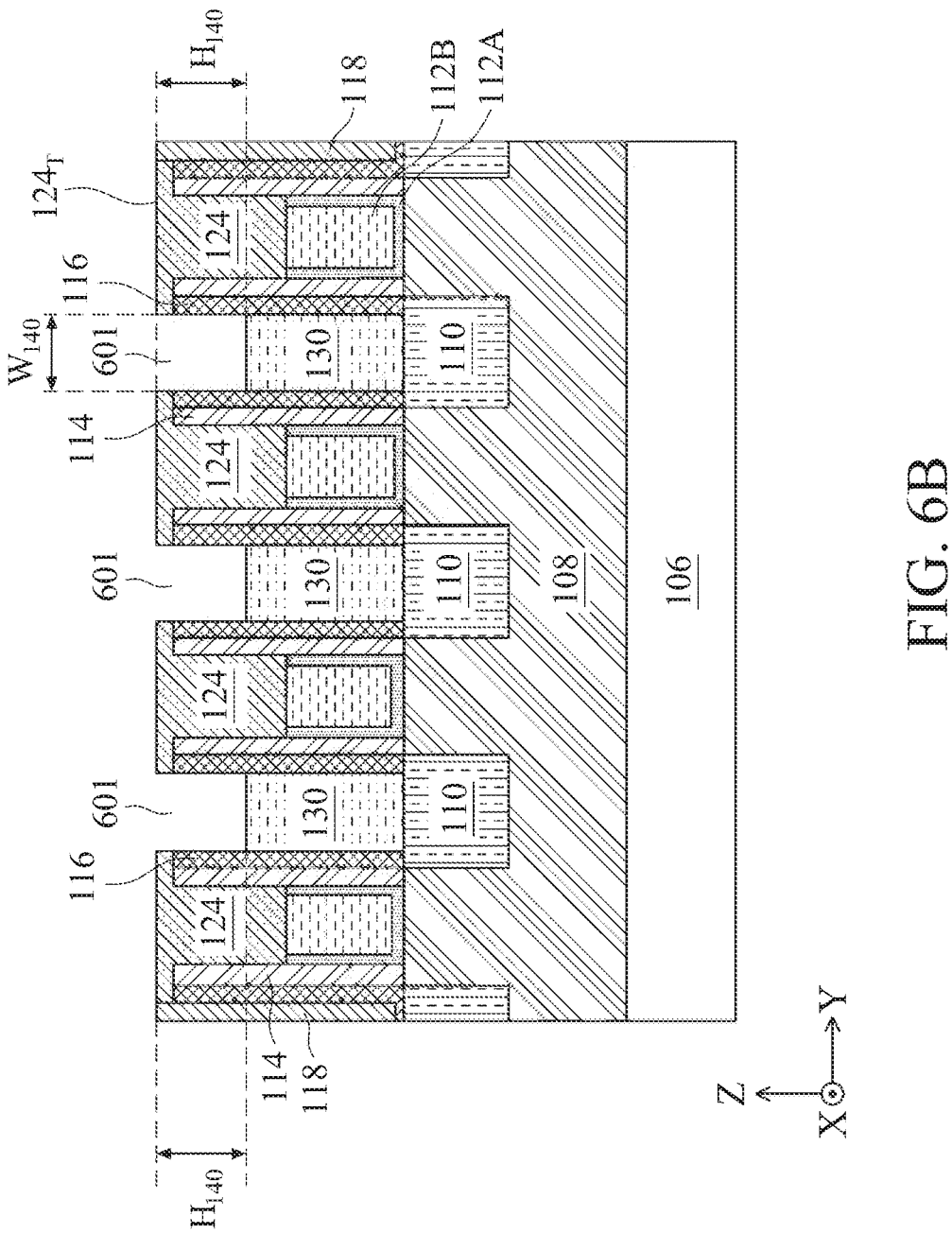

Referring to FIG. 6B, the process for forming ESL 140 can further include forming a recess structure 601 with a vertical (e.g., in the z-direction) depth substantially equal to height $H_{140}$ in trench conductor layer 130 using an etching process. Accordingly, trench conductor layer 130's top surface can be positioned lower than padding layer 124's top surface $124_T$ by height $H_{140}$. In some embodiments, recess structure 601 can expose CESL 116 and/or padding layer 124's side surface. The etching process for forming recess structure 601 can be a selective etching process that has a higher etching rate to remove trench conductor layer 130 than removing padding layer 124. In some embodiments, the etching process for forming recess structure 601 can include a dry etching process that can use a fluorine-contained (e.g., carbon tetrafluoride) gas or a chlorine-contained gas (e.g., boron trichloride). In some embodiments, the etching process for forming recess structure 601 can include a wet etching process that can use ammonia hydroxide or an acidic medium as etchants. In some embodiments, the etching process for forming recess structure 601 can etch trench conductor layer 130 and padding layer 124 with first and second etching rates, where a ratio of the first etching rate to the second etching rate can be greater than about 40, greater than about 50, greater than about 60, greater than about 70, greater than about 80, or greater than about 90, If the ratio of the first etching rate to the second etching rate is less than the above-noted lower limits, the process of forming recess structure 601 may damage the integrity of padding layer 124, thus causing an electrical short between trench conductor layer 130 and gate structure 112. In some embodiments, the etching process for forming recess structure 601 can etch trench conductor layer 130 and CESL 116 with first and third etching rates, where a ratio of the first etching rate to the third etching rate can be greater than about 40, greater than about 50, greater than about 60, greater than about 70, greater than about 80, or greater than about 90. If the ratio of the first etching rate to the third etching rate is less than the above-noted lower limits, the process of forming recess structure 601 may damage the integrity of padding layer 124, thus causing an electrical short between trench conductor layer 130 and gate structure 112.

In some embodiments, the etching process for forming recess structure 601 can etch trench conductor layer 130 and gate spacer 114 with first and fourth etching rates, where a ratio of the first etching rate to the fourth etching rate can be greater than about 40, greater than about 50, greater than about 60, greater than about 70, greater than about 80, or greater than about 90. If the ratio of the first etching rate to the fourth etching rate is less than the above-noted lower limits, the process of forming recess structure 601 may damage the integrity of padding layer 124, thus causing an electrical short between trench conductor layer 130 and gate structure 112. In some embodiments, the etching process for forming recess structure 601 can have a negligible etching rate (e.g., etching rate substantially equal to zero) for padding layer 124, CESL 116, and/or gate spacer 114.

Referring to FIGS. 7A-7K, the process for forming ESL 140 can further include depositing dielectric materials of ESL 140 (e.g., previously discussed in FIGS. 1B-1G) in recess structure 601 of the structure of FIG. 6B using a deposition process, such as a chemical vapor deposition (CVD) process, an atomic layer deposition (ALD) process, a physical vapor deposition (PVD) process, a plasma enhanced CVD (PECVD) process, and a plasma enhanced atomic layer deposition (PEALD) process. The deposition process for forming ESL 140 can include using a silicon-containing processing gas (e.g., silane or methylsilane), an oxygen-containing processing gas (e.g., oxygen, ozone, or carbon dioxide), a nitrogen-containing processing gas (e.g., nitrogen or ammonia), a carbon-containing processing gas methane or acetylene), and/or a boron-containing processing gas (e.g., boron trifluoride). Accordingly, the deposition process for forming ESL 140 can result in ESL 140 having silicon, oxygen, nitrogen, carbon, and boron concentrations that are substantially positively correlated to (e.g., substantially linearly proportional to) the flow rates of the silicon-containing, the oxygen-containing, the nitrogen-containing, the carbon-containing, and the boron-containing processing gases, respectively. Further, the deposition process for forming ESL 140 can be a low temperature deposition process to enhance semiconductor device 100's yield and reliability. In some embodiments, the deposition process for forming ESL 140 can be performed at an operation temperature from about 100° C. to about 350° C., from about 120° C. to about 300° C., or from about 150° C. to about 280° C. if the operation temperature is below the above-noted lower limits, the deposition process may not be able to initiate the nucleation of the atoms/molecules of the dielectric materials to form ESL 140. If the operation temperature is beyond the above-noted upper limits, the deposition process may degrade the structural integrity (e.g., metal re-flow) of the underlying trench conductor layer 130 and/or gate structure 112, thus degrading semiconductor device 100's yield and performance. In some embodiments, the process for forming ESL 140 can further include coplanarizing the deposited dielectric materials of ESL 140 with padding layer 124 using a CMP process.

In some embodiments, the deposition process for forming ESL 140 can be a non-selective deposition process that can deposit the dielectric materials of ESL 140 over the dielectric surfaces (e.g., surfaces of padding layer 124, gate spacer 114, CESL 116 and/or ILD layer 118) and the conductive/metallic surfaces (e.g., surface of trench conductor layer 130) of the structure of FIG. 6B. In some embodiments, the deposition process for forming ESL 140 can be a selective deposition process that can selectively deposit the dielectric materials of ESL 140 over a metallic surface and/or over a conductive material's surface, where the selective deposition process for forming ESL 140 can deposit the dielectric materials of ESL 140 over trench conductor layer 130 with a deposition rate greater than that over padding layer 124, over CESL 116, and/or over gate spacer 114. In some embodiments, the selective deposition process for forming ESL 140 can have a negligible deposition rate (e.g., deposition rate substantially equal to zero) of depositing the dielectric materials of ESL 140 over a dielectric surface, such as over padding layer 124, over CESL 116, and/or over gate spacer 114. In some embodiments, the selective deposition process for forming ESL 140 can include (i) performing a silylation process with a suitable temperature, such as about 25° C., to form a layer of inhibitor material (not shown in FIGS. 7A-7K) over the exposed dielectric surfaces of the structure of FIG. 6B, such as over FIG. 6B's padding layer 124, over FIG. 6.13's CESL 116 and/or over FIG. 6B's gate spacer 114, and (ii) depositing the dielectric materials of ESL 140 over the structure of FIG. 6B to form ESL 140 in recess structure 601. The layer of inhibitor material can include a monolayer that includes hydrophobic head groups and/or a methyl group selectively formed on the dielectric surfaces (e.g., surfaces of padding layer 124, CEST, 116, ILD layer 118, and/or gate spacer 114) of the structure of FIG. 6B over conductive/metallic surfaces (e.g., exposing trench conductor layer 130) of the structure of FIG. 6B. Because the layer of inhibiting material can inhibit the nucleation of depositing the dielectric materials of ESL 140, the subsequent deposition of the dielectric materials can be delayed or inhibited over padding layer 124, over CESL 116, and/or over gate spacer 114, thus being capable of selectively forming ESL 140 over trench conductor layer 130. In some embodiments, the chemical agent applied by the silylation process can include dimethylsilane (DMS), trimethylsilane (TMS), dimethylarminotrimethylsilane (DMA-TMS), octadecyltrichlorosilane (OTS), floroocatyltriclorosilane (POTS), dichlorodimethylsilane (DMDCS), trirnethylsilydiethylamine (TMSDEA), trimethylsityacetylene (TMSA), (chloromethyl)dimethylchlorosilane (CMDMCS), (chloromethyl)dimethylsitane (CMDMS), hexamethyidisilazane (HMDS), Cert-Butyldimethyisilane (TBDMS), octamethylcyclotetrasiloxane (OMCTS), bis(dimethylamino)dimethylsilane (DMADMS), or trimethylchlorosilane (TMCS).

Figure 7A:
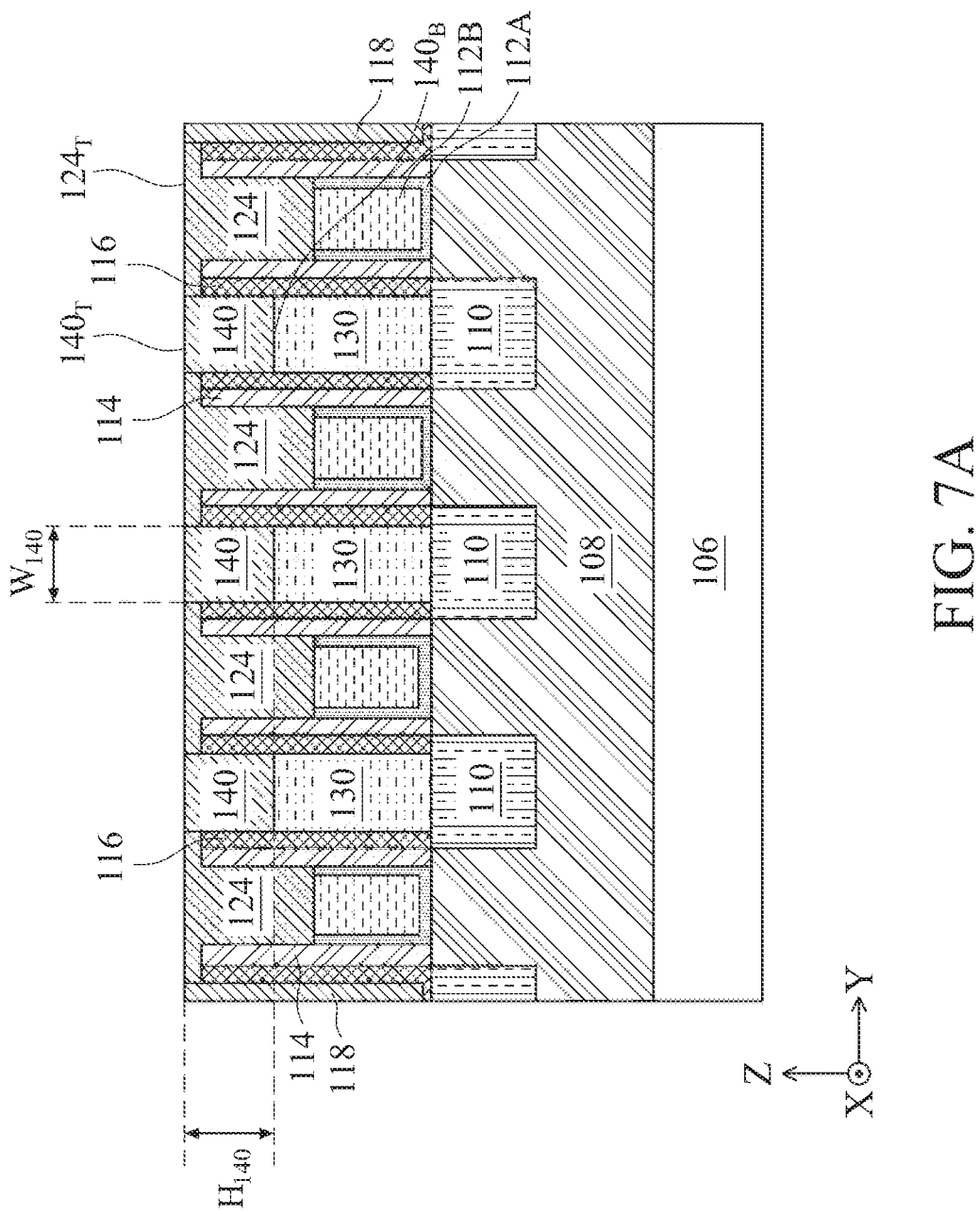

In some embodiments, referring to FIG. 1G's profiles 151, 153, 155, 157, and 159 and FIG. 7A, the deposition process for forming ESL 140 can include adjusting the oxygen-containing processing gas's flow rate and/or the nitrogen-containing, processing gas's flow rate during the deposition of ESL 140. The resulting ESL 140 can have the nitrogen concentration profile and/or an oxygen concentration profile shown in FIG. 1G, because the nitrogen concentration and/or oxygen concentration in ESL 140 can be positively correlated to (e.g., substantially linearly proportional to) the flow rate of the nitrogen-containing processing gas and/or the flow rate of the oxygen-containing processing gas. For example, referring to FIG. 1G's profile 151 and FIG. 7A, the deposition process for forming ESL 140 can include (i) flowing the nitrogen-containing, and/or the oxygen-containing processing gases with a first flow rate, and (ii) gradually reducing, such as substantially linearly decreasing, the first flow rate to a second flow rate that is less than the first flow rate. Accordingly, the resulting ESL 140 in FIG. 7A can have an oxygen concentration and/or a nitrogen concentration gradually decreasing from concentration $C_{max}$ proximate to bottom surface 140$_B$ to concentration $C_{min}$ proximate to top surface 140$_T$ as illustrated in FIG. 1G's profile 151.

In some embodiments, referring to FIG. 1G's profiles 153 and 157 and FIG. 7A, the deposition process for forming ESL 140 can include (i) flowing the nitrogen-containing and/or the oxygen-containing processing gases with a first flow rate, (ii) increasing the first flow rate to a second flow rate that is greater than the first flow rate, and (iii) decreasing the second flow rate to a third flow rate that is less than the second flow rate. Accordingly, the resulting ESL 140 shown in FIG. 7A can have an oxygen concentration and/or a nitrogen concentration with a peak concentration (e.g., about $C_{max}$) positioned between bottom surface 140$_B$ and top surface 140$_T$ as illustrated in FIG. 1G's profiles 153 and 157.

In some embodiments, referring to FIG. 1G's profiles 155 and 159 and FIG. 7A, the deposition process for forming ESL 140 can include (i) flowing the nitrogen-containing and/or the oxygen-containing, processing gases with a first flow rate for a pre-determined time duration, and (ii) decreasing the first flow rate to a fourth flow rate that is less than the first flow rate. Accordingly, the resulting ESL 140 in FIG. 7A can have an oxygen concentration and/or a nitrogen concentration with a substantially constant concentration (e.g., about $C_{max}$) at the lower portion of ESL 140 as illustrated in FIG. 1G's profiles 155 and 159. In some embodiments, ESL 140 shown in FIG. 7A can be ESL 140 shown in FIG. 1B.

Figure 7B:
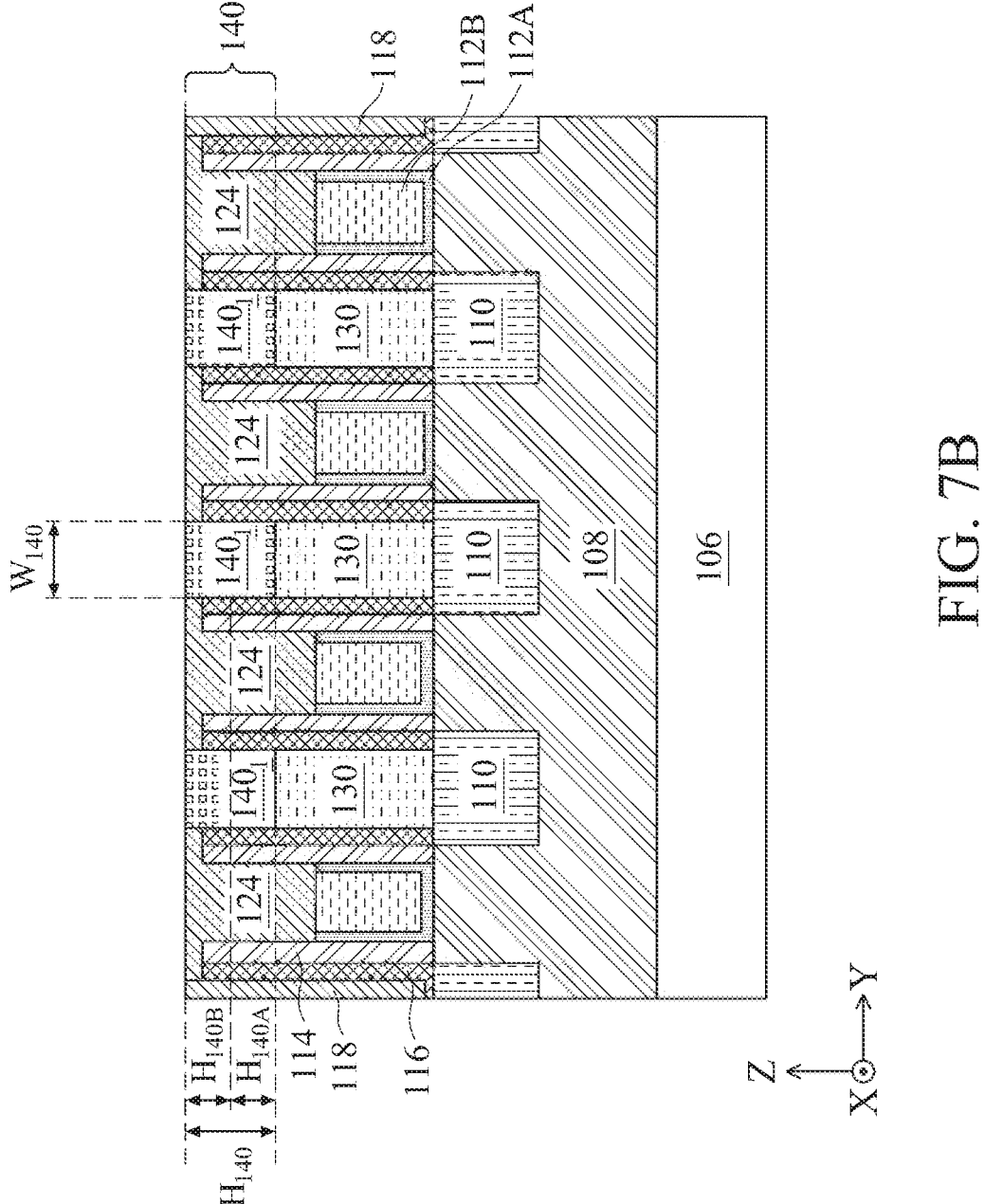
Figure 7C:
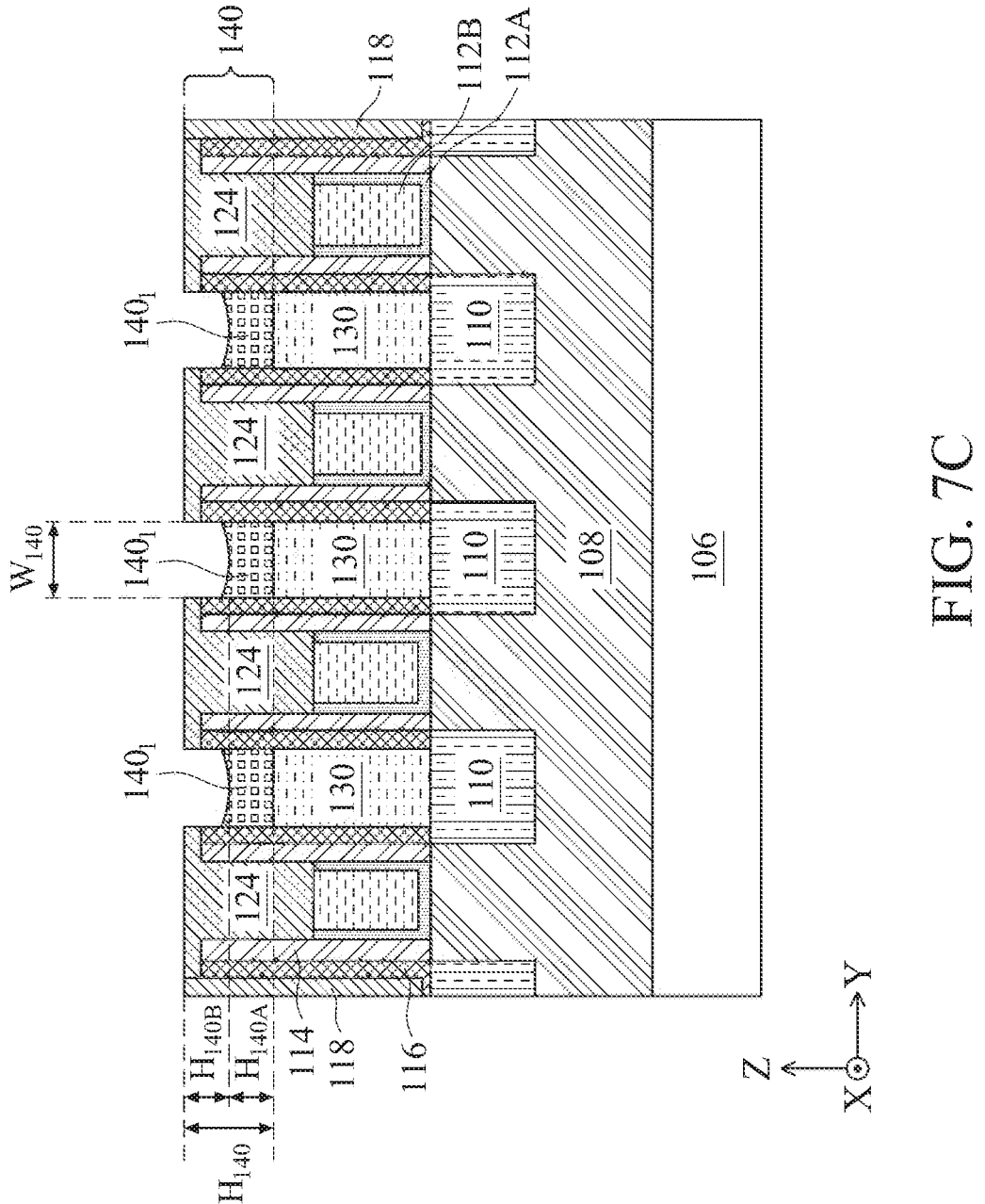
Figure 7D:
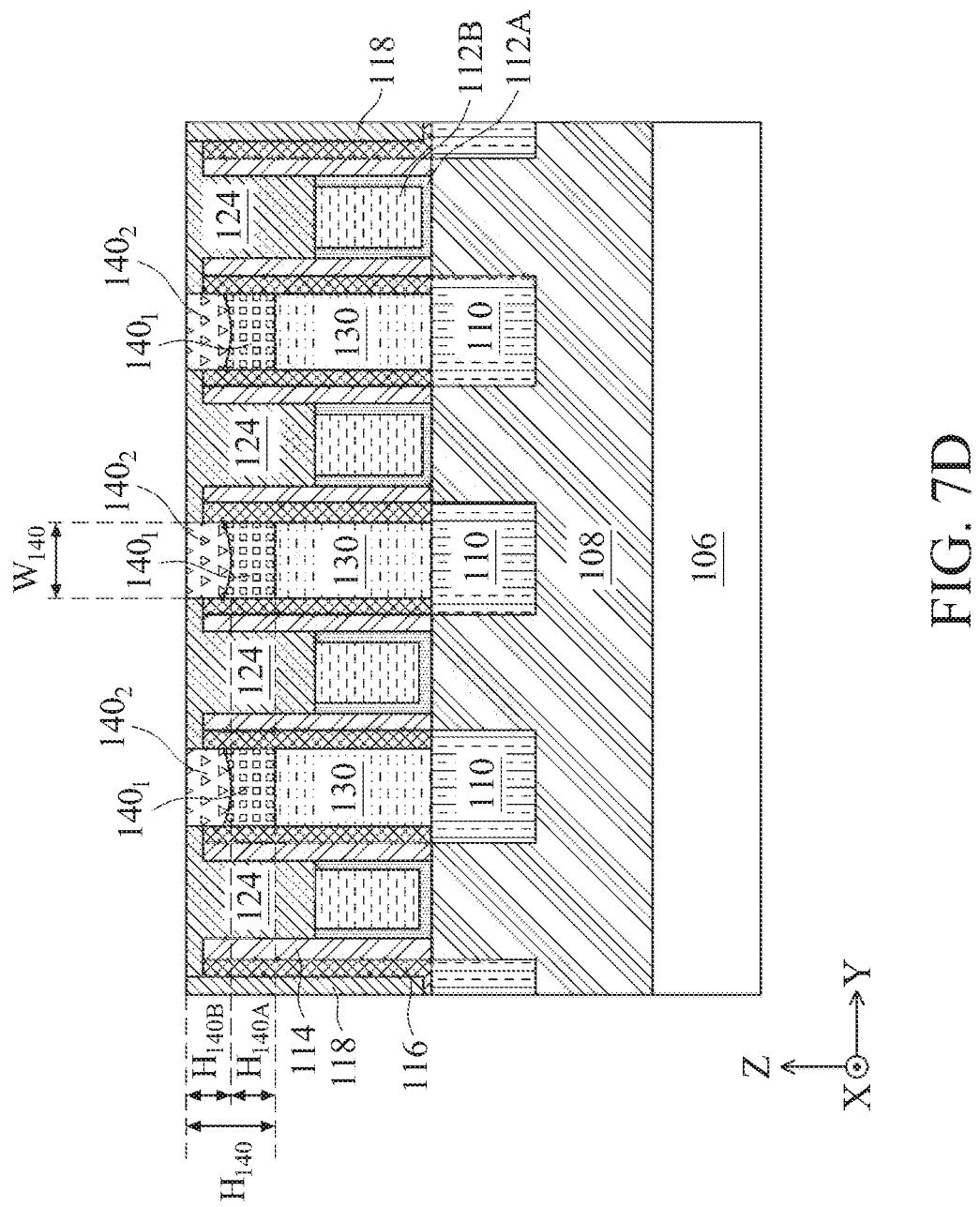

In some embodiments, referring to FIGS. 7B-7D, the process for forming ESL 140 can include forming a multi-layer structure. For example, the process tor forming ESL 140 can include (i) depositing a dielectric material of ESL 140$_1$ over trench conductor layer 130 of the structure of FIG. 6B and over padding layer 124 of the structure of FIG. 6B, (ii) coplanarizing the deposited dielectric material of ESL 140$_1$ with padding layer 124, gate spacer 114, and/or CESL 116 using a CMP process (shown in FIG. 7B), and (iii) etching, via a dry etching process, portions of the coplanarized dielectric material of ESL 140$_1$ to form ESL 140$_1$ with height H$_{140A}$ over trench conductor layer 130 (shown in FIG. 7C). The process of depositing the dielectric material of ESL 140$_1$ can include flowing the nitrogen-containing and/or the oxygen-containing processing gases to form an oxygen-containing and/or a nitrogen-containing dielectric material for ESL 140$_1$. In some embodiments, the process of depositing the dielectric material of ESL 140$_1$ can further include not supplying the carbon-containing and/or the boron-containing processing gases, thus avoiding incorporation of carbon and/or boron in ESL 140$_1$. In some embodiments, since the dry etching process for forming ESL 140$_1$ can have a greater etching rate proximate to CESL 116 than away from CESL 116, the resulting ESL 140$_1$ can have a dishing-like top surface (e.g., junction 141 shown in FIG. 1C) over trench conductor layer 130 (shown in FIG. 7C).

As shown in FIG. 7D, the process for forming ESL 140 can further include (i) depositing a dielectric material of ESL 140$_2$ over ESL 140$_1$ and over padding layer 124, and (ii) coplanarizing the deposited dielectric material of ESL 140$_2$ with padding layer 124, gate spacer 114, and/or CESL 116 using a CMP process to form ESL 140$_2$ with height H$_{140B}$. The process of depositing ESL 140$_2$ can include flowing the carbon-containing and/or the boron-containing processing gases to form a carbon-containing and/or a boron-containing dielectric material for ESL 140$_2$. In some embodiments, the process of depositing ESL 140$_2$ can further include not supplying the oxygen-containing and/or the nitrogen-containing processing gases, thus avoiding incorporation of oxygen and/or nitrogen in ESL 140$_2$. In some embodiments, ESL 140 shown in FIG. 7D can be ESL 140 shown in FIG. 1C.

Figure 7E:
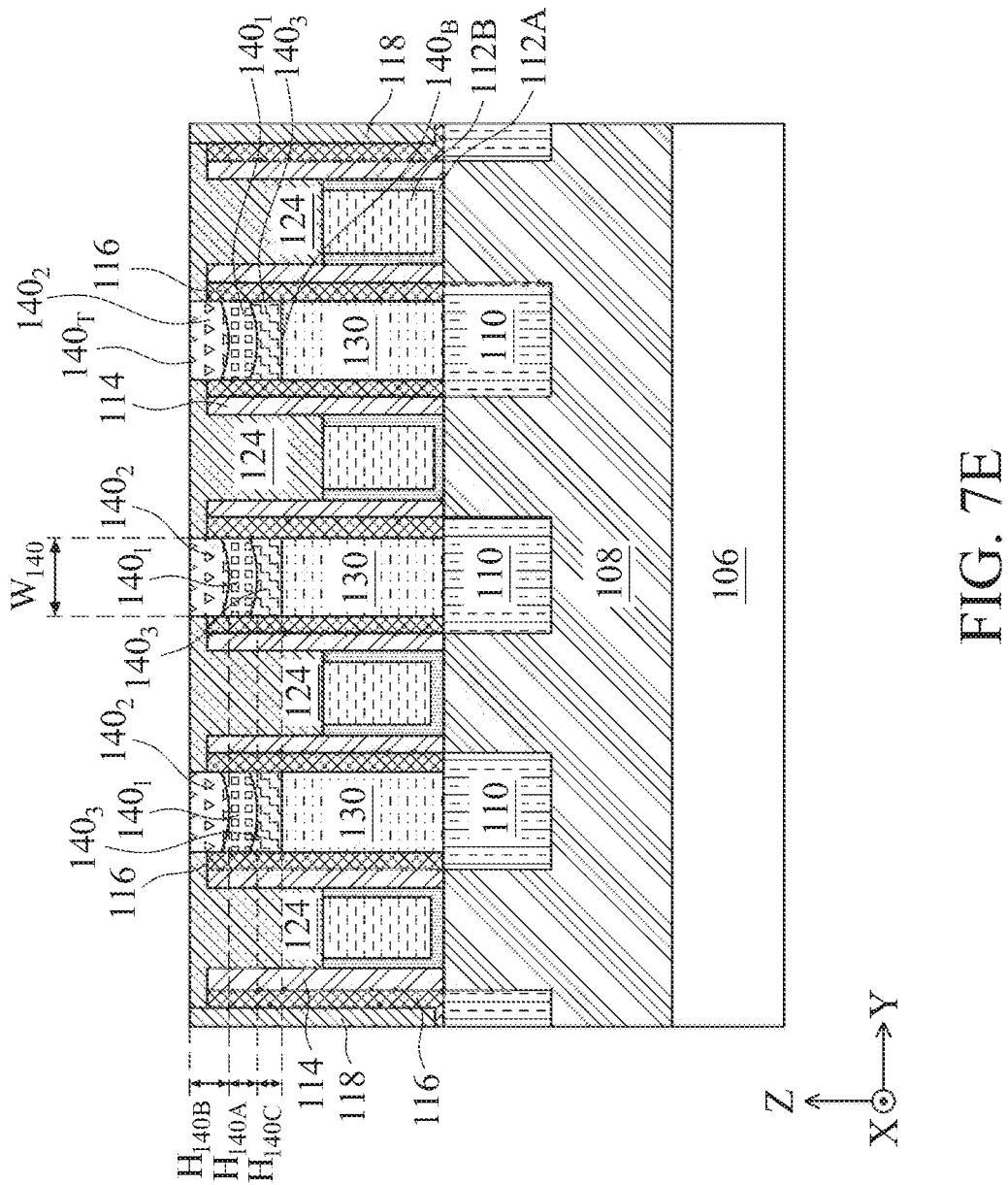

In some embodiments, referring to FIG. 7E, the process for forming ESL 140 can further include depositing capping layer 140$_3$ with height H$_{140C}$ between ESL 140$_1$ and trench conductor layer 130 (e.g., depositing capping layer 140$_3$ before depositing ESL 140$_1$ and/or before depositing ESL 140$_2$). The deposition process for capping layer 140$_3$ can include (i) depositing a dielectric material of capping layer 140$_3$ over trench conductor layer 130 of the structure of FIG. 6B and over padding layer 124 of the structure of FIG. 6B; and (ii) coplanarizing the deposited dielectric material of capping layer 140$_3$ with padding layer 124, gate spacer 114, and/or CESL 116 using a CMP process, and (iii) etching, via a dry etching process, portions of the coplartarized dielectric material of capping layer 140$_3$ to form capping layer 140$_3$ with height H$_{140C}$ over trench conductor layer 130 (shown in FIG. 7E). In some embodiments, since the dry etching process for forming capping layer 140$_3$ can have a greater etching rate proximate to CESL 116 than away from CESL 116, the resulting capping layer 140$_3$ can have a dishing-like top surface (shown in FIG. 7E) interfaced with ESL 140$_1$.

In some embodiments, capping layer 140$_3$ can be an oxygen-deficient dielectric material to prevent oxidizing trench conductor layer 130 during the deposition of ESLs 140$_1$ and 140$_2$. Accordingly, the process of depositing capping layer 140$_3$ can include flowing less the oxygen-containing and/or the nitrogen-containing processing gases than that for depositing ESLs 140$_1$ and/or 140$_2$. For example, referring to FIG. 1G's profile 161 and FIG. 7E, the process of depositing FIG. 7E's ESL 140 can include (i) flowing the nitrogen-containing and/or the oxygen-containing processing gases with a first flow rate to deposit capping layer 140$_3$, (ii) increasing the first flow rate to a second flow rate that is greater than the first flow rate to deposit ESL 140$_1$, and (iii) decreasing the second flow rate to a third flow rate that is less than the second flow rate to deposit ESL 140$_2$. Accordingly, the resulting capping layer 140$_3$ can have an oxygen concentration and/or a nitrogen concentration with a minimum concentration (e.g., about $C_{min}$) positioned proximate to bottom surface 140$_B$, and the resulting ESL 140 can have an oxygen concentration and/or a nitrogen concentration with a substantially constant concentration (e.g., about $C_{max}$) greater than the minimum concentration (e.g., about $C_{min}$) as illustrated in FIG. 1G's profile 161.

In some embodiments, the process of depositing capping layer 140$_3$ can include flowing the carbon-containing and/or the boron-containing processing gases to form a carbon-containing and/or a boron-containing dielectric material for capping layer 140$_3$. In some embodiments, the process of depositing capping layer 140$_3$ can further include not supplying the oxygen-containing and/or the nitrogen-containing processing gases, thus avoiding incorporation of oxygen and/or nitrogen in ESL 140$_2$.

In some embodiments, capping layer 140$_3$ can be an oxygen-deficient conductive material to prevent oxidizing trench conductor layer 130 during the deposition of ESLs 140$_1$ and 140$_2$. Accordingly, the deposition process for forming capping layer 140$_3$ can be a non-selective deposition process or a selective deposition process that can deposit the oxygen-deficient conductive material over and in contact with trench conductor layer 130. In some embodiments, the selective deposition process, such as similar to the previously discussed silylation process, for forming capping layer 140$_3$ can deposit the oxygen-deficient conductive material over trench conductor layer 130 with a deposition rate greater than that over padding layer 124, over CESL 116, and/or over gate spacer 114. For example, the selective deposition process for forming capping layer 140$_3$ can have a negligible deposition rate (e.g., deposition rate substantially equal to zero) of depositing the oxygen-deficient conductive material over a dielectric surface, such as over padding layer 124, over CESL 116, and/or over gate spacer 114. The selective deposition process for forming capping layer 140$_3$ can include (i) forming a layer of inhibitor material (not shown in FIG. 7E) over the exposed dielectric surfaces of the structure of FIG. 6B, such as over padding layer 124, over CESL 116, and/or over gate spacer 114, (ii) depositing the dielectric materials over the structure of FIG. 69 to form capping layer 140$_3$ in recess structure 601, and (iii) removing the layer of inhibitor material to expose padding layer 124, CESL 116, and/or gate spacer 114. The layer of inhibitor material can be selectively formed on insulating materials' surfaces (e.g., over padding layer 124, over CESL 116, and/or over gate spacer 114) of the structure of FIG. 6B, while exposing trench conductor layer 130 of the structure of FIG. 6B. Because of the layer of inhibiting material, the subsequent deposition of the oxygen-deficient conductive material can be delayed or inhibited over padding layer 124, over CESL 116, and/or over gate spacer 114, thus being capable of selectively forming capping layer 140$_3$ over trench conductor layer 130. In some embodiments, the layer of inhibitor material can a monolayer that includes hydrophobic head groups and/or a methyl group. In some embodiments, ESL 140 shown in FIG. 7E can be ESL 140 shown in FIG. 1D.

Figure 7F:
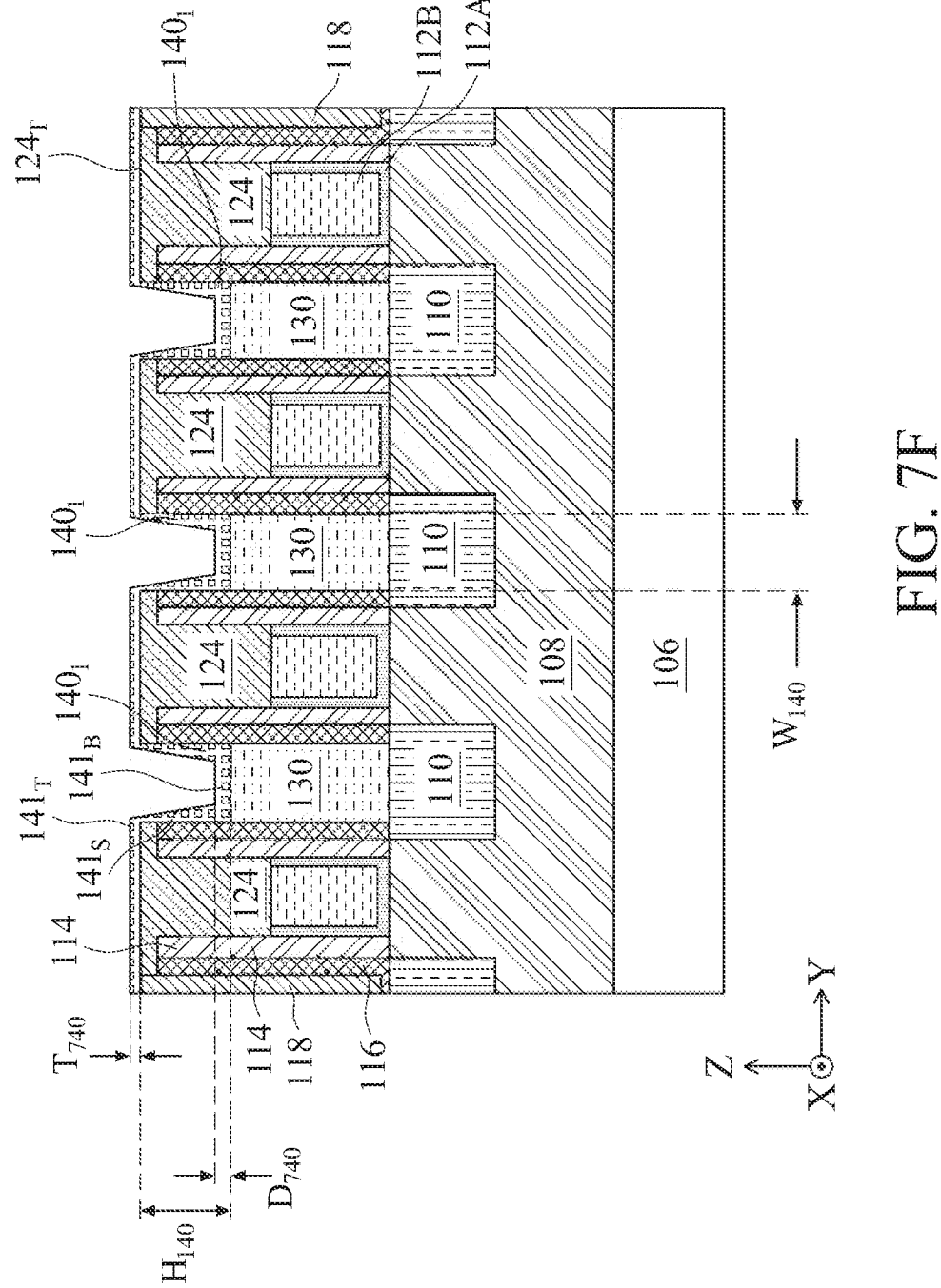
Figure 7G:
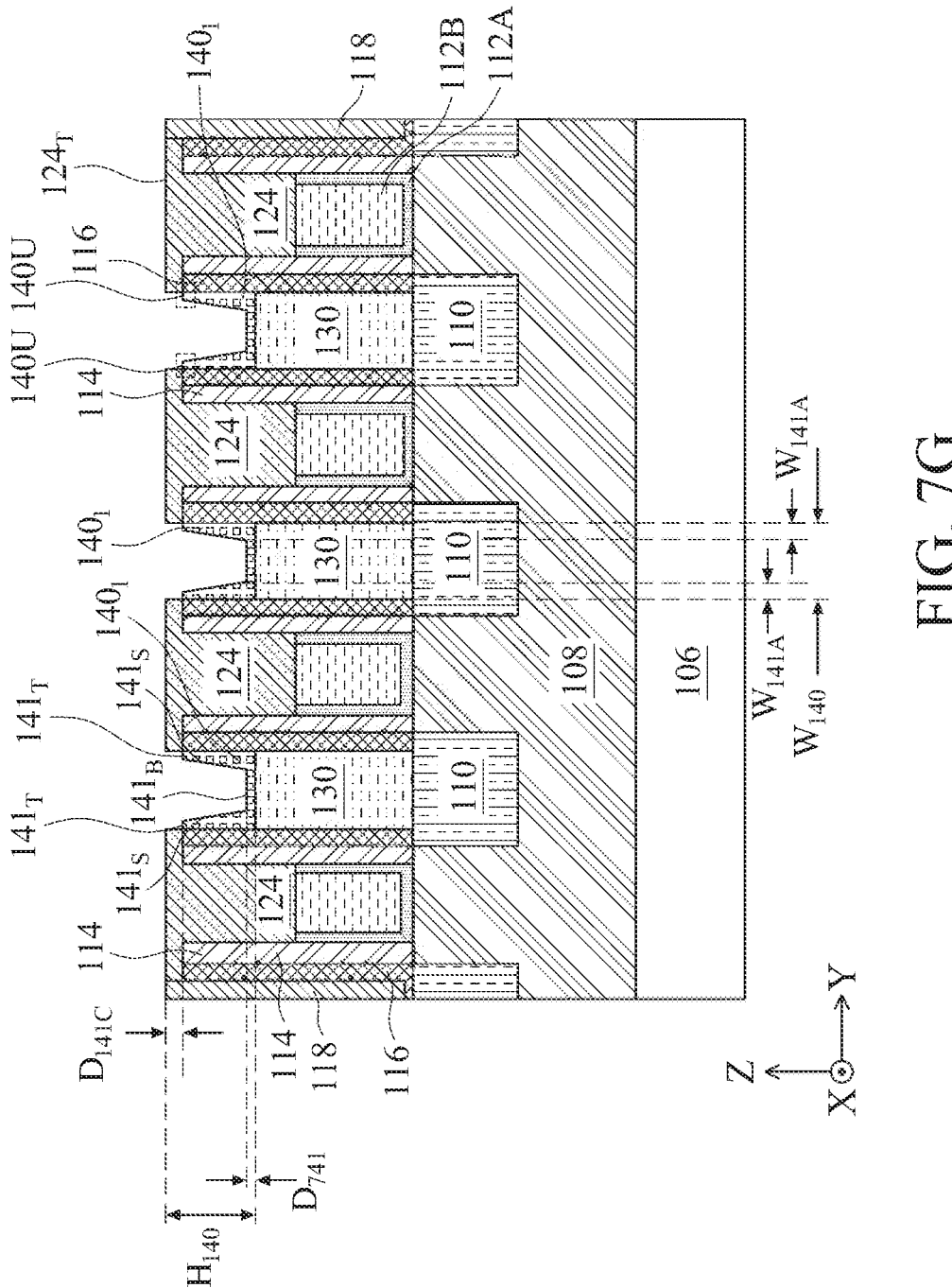
Figure 7H:
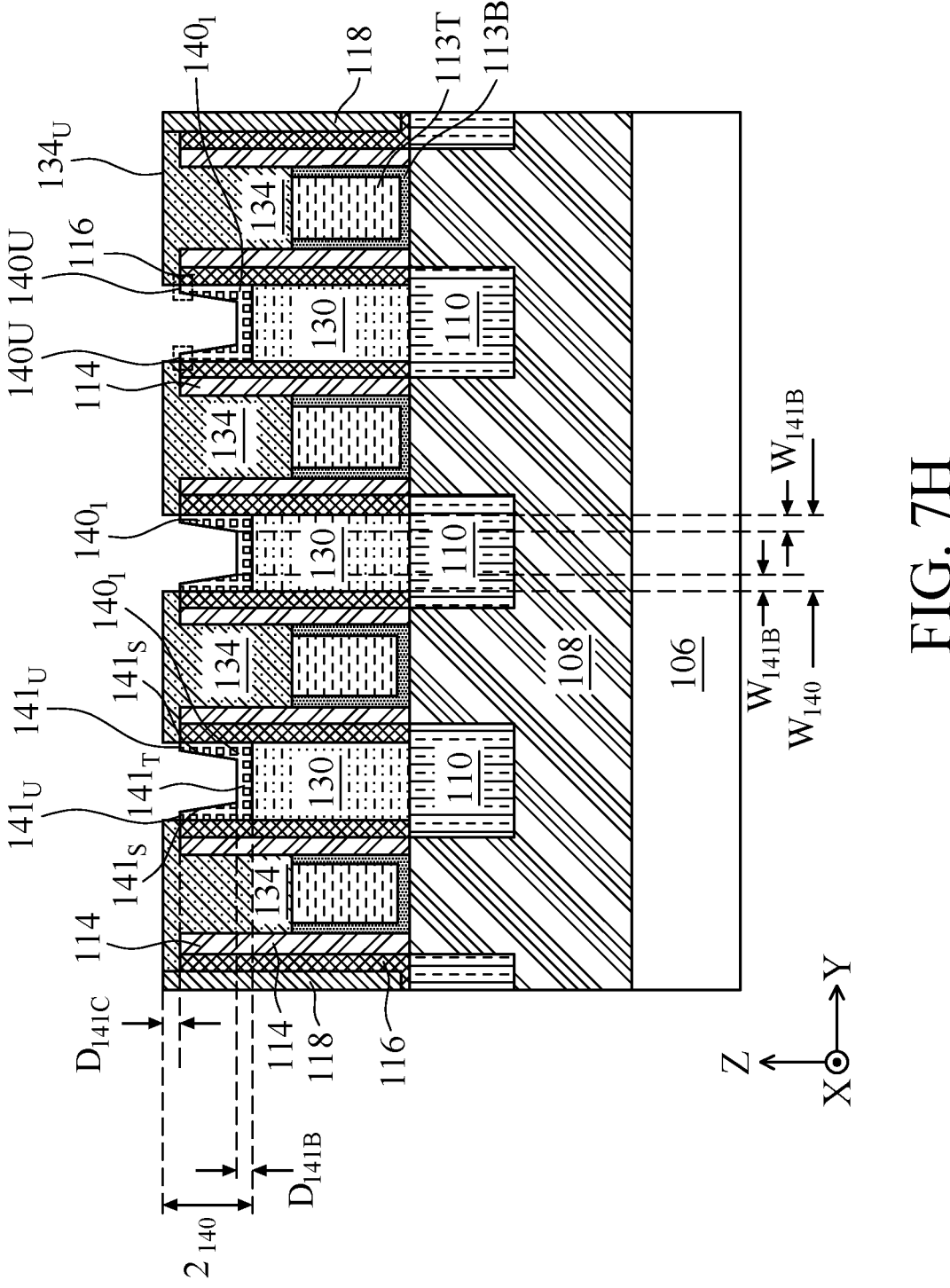
Figure 7I:
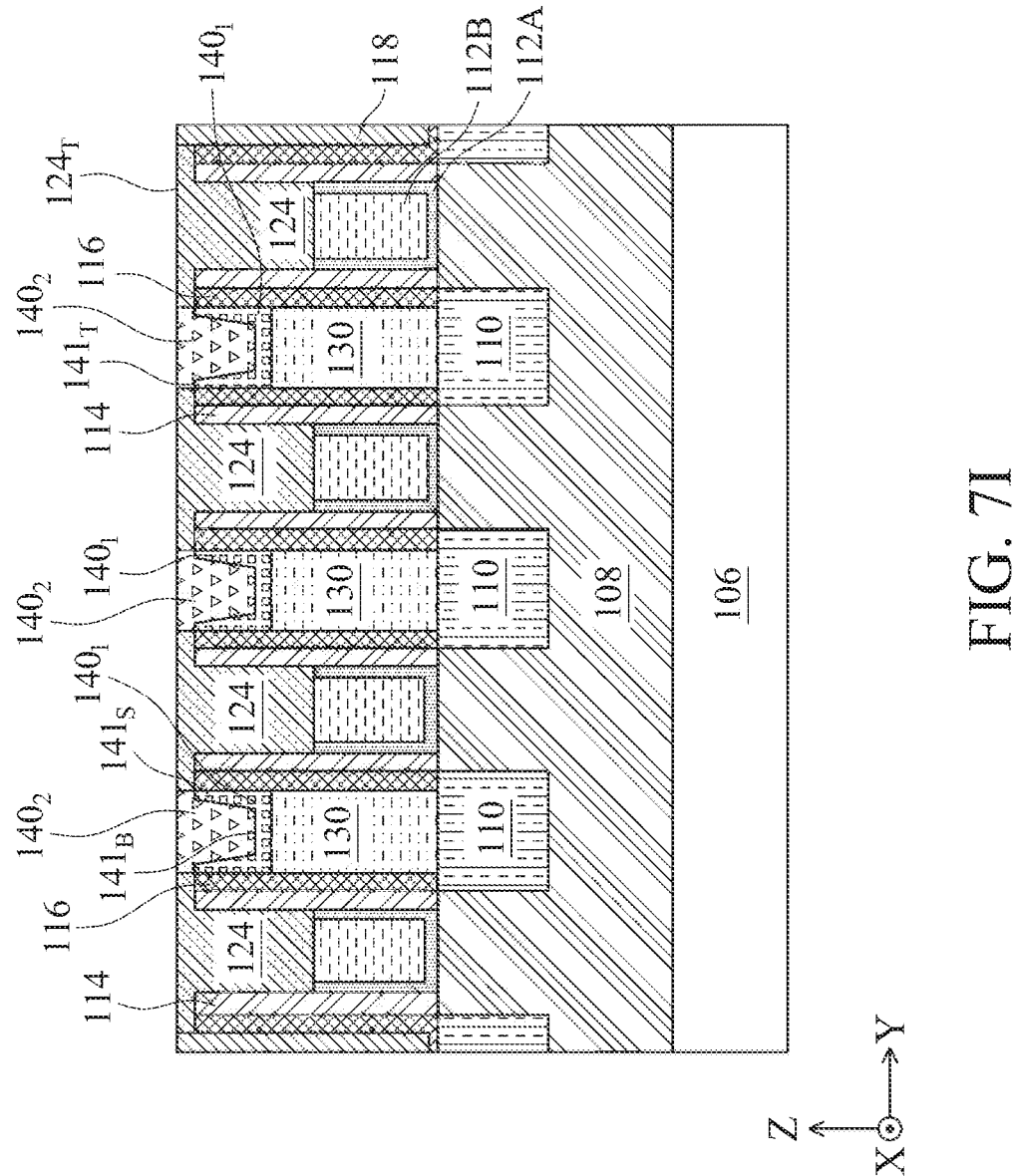

In some embodiments, referring to FIGS. 7F-7I, the process for forming ESL 140 can include forming a concave shape ESL 140$_1$, and forming ESL 140$_2$ (shown in FIG. 7I or 7K) over the concave shape ESL 140$_1$. As shown in FIG. 7F, the process of forming the concave shape ESL 140$_1$ can include depositing a dielectric material of ESL 140$_1$ over trench conductor layer 130 of the structure of FIG. 6B and over padding layer 124 of the structure of FIG. 6B using a non-conformal deposition process, such as a PECVD process and a PEALD process. In some embodiments, the deposited dielectric material can have thicknesses $T_{140}$ and $D_{740}$ (shown in FIG. 7F) over padding layer 124 and trench conductor layer 130, respectively, where thickness $T_{140}$ can be less than thickness $D_{740}$. As shown in FIG. 7G, the process of forming the concave shape ESL 140$_1$ can further include etching portion of the deposited dielectric material to expose padding layer 124, gate spacer 114, and/or CESL 116 via an etching process. Accordingly, after exposing padding layer 124, gate spacer 114, and/or CESL 116, the etched dielectric material can have a thickness $D_{741}$ (shown in FIG. 7G), less than thickness $D_{740}$, over trench conductor layer 130. Further, since the etchant's concentration of the dry etching process for forming capping layer 140$_1$ can be greater proximate to ESL 140$_1$'s upper portion than proximate to ESL 140$_1$'s lower portion, ESL 140$_1$'s upper portion can be removed to result in top surface 141$_T$ separated from padding layer 124's top surface 124$_T$ by separation $D_{141C}$ (shown in FIG. 7G) after the dry etching process. The dry etching process can further result in side surface 141$_S$ (shown in FIG. 7G) and bottom surface 141$_B$ (shown in FIG. 7G) separated from CESL 116 and trench conductor layer 130, respectively. The process of forming the concave shape ESL 140$_1$ can further include (i) forming, using a plasma treatment process (e.g., a nitrogen plasma treatment process), a layer of inhibitor material (not shown in FIG. 7G) over side surface 141$_S$'s upper portion 140U (shown in FIG. 7G) that is proximate to top surface 141$_T$, and (ii) depositing, using a directional deposition process, an upper portion of ESL 140$_1$ over the lower portion of ESL 140$_1$. Due to the layer of inhibitor material formed over upper portion 140U, the directional deposition process can deposit the upper portion of ESL 140$_1$ over the lower portion of ESL 140$_1$'s bottom surface 141$_B$ with a deposition rate greater than that over the lower portion of ESL 140$_1$'s side surfaces 141$_S$, and/or over the lower portion of ESL 140$_1$'s top surface 141$_T$, Accordingly, the resulting ESL 140$_1$ (e.g., including both the lower and upper portions) shown in FIG. 7H can have separation $D_{141A}$ greater than separation $W_{141A}$ to provide sufficient dielectric strength to reduce FET 102's leakage current. The process of forming ESL 140$_2$ can include depositing a dielectric material of ESL 140$_2$ over the concave shape ESL 140$_1$, and (ii) coplanarizing the deposited dielectric material of ESL 140$_2$ with padding layer 124 using a CMP process (shown in FIG. 7I). In some embodiments, ESL 140 shown in FIG. 7I can be ESL 140 shown in FIG. 1E.

Figure 7J:
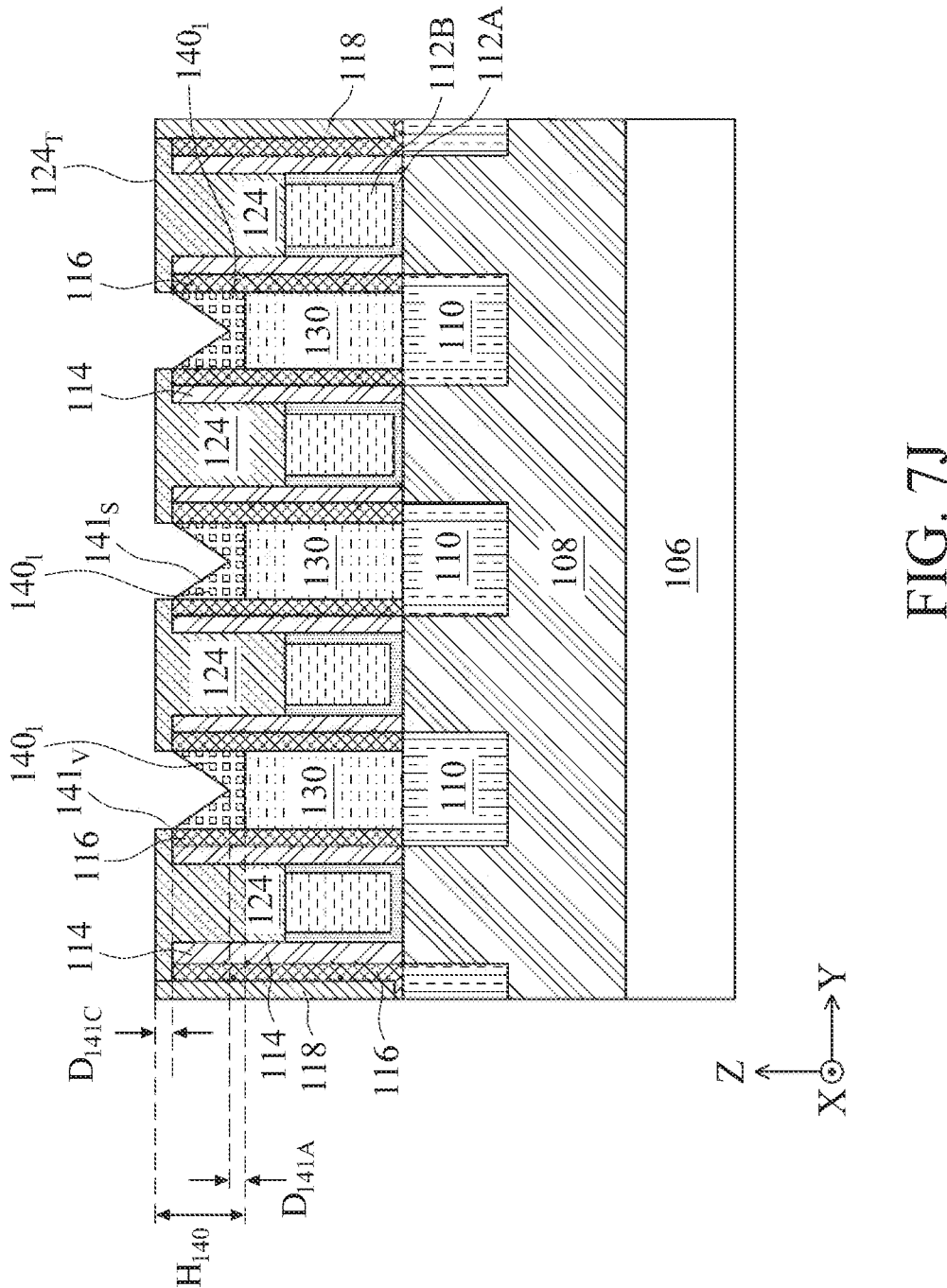
Figure 7K:
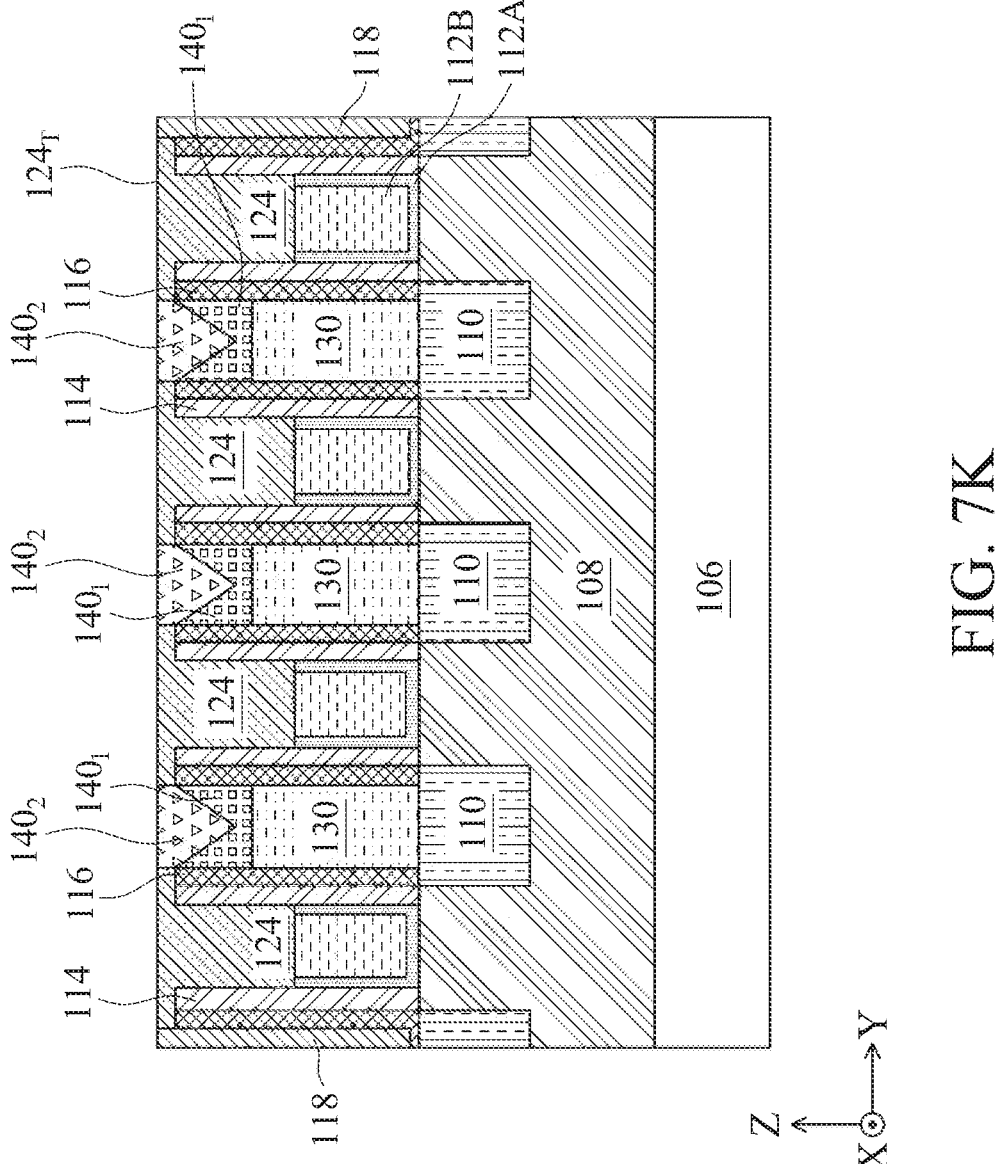
Figure 8:
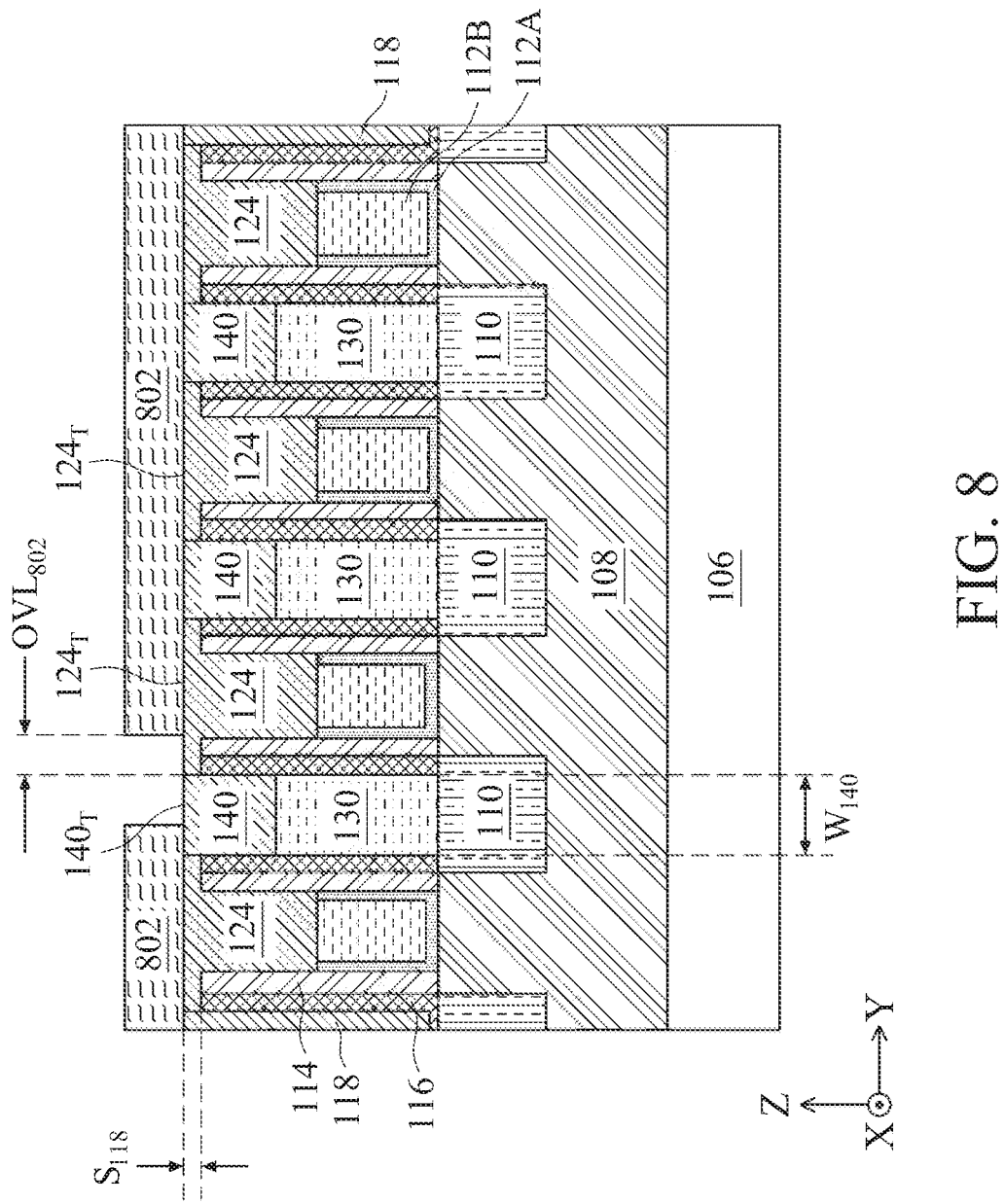
Figure 9:
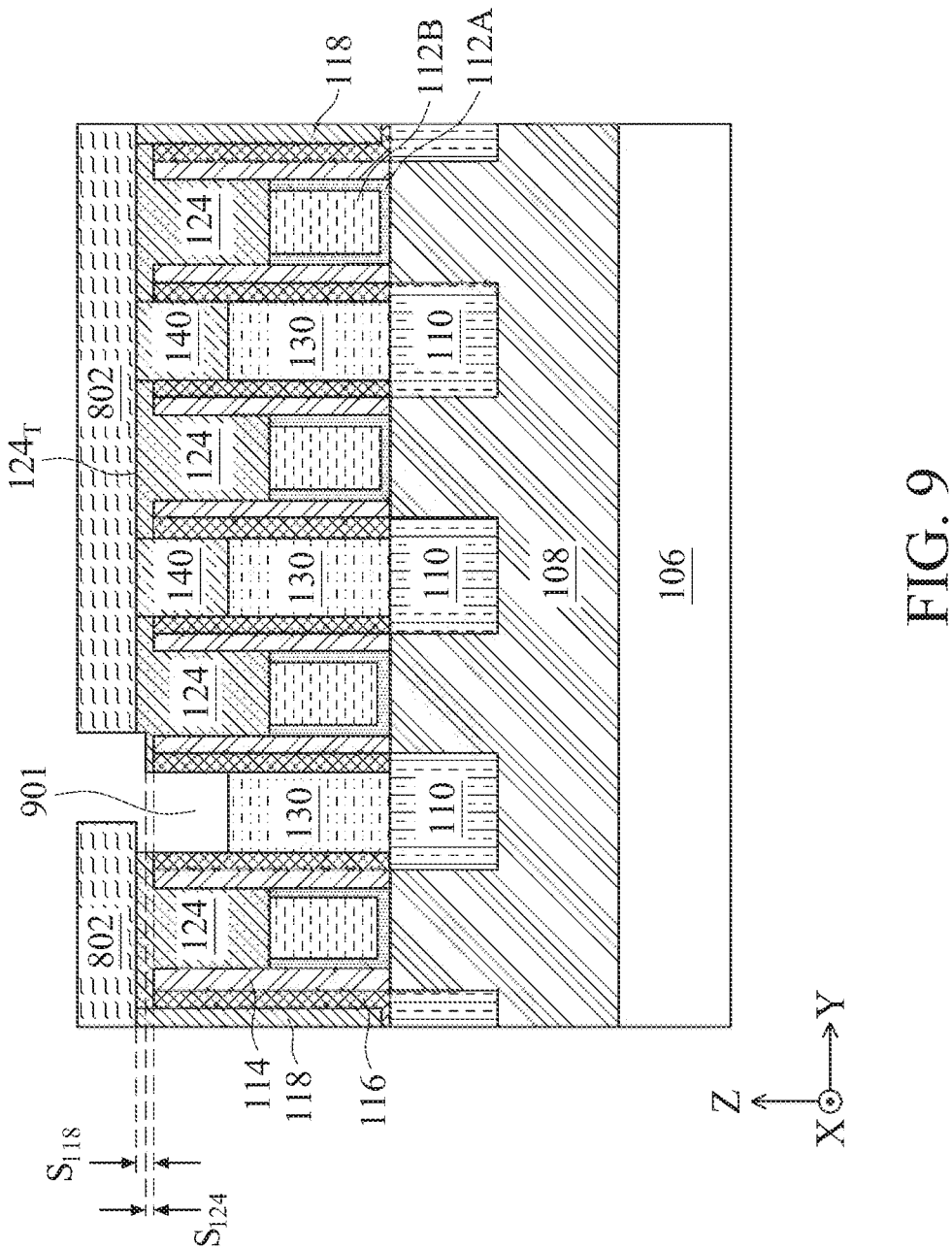

In some embodiments, referring to FIGS. 7J and 7K, the process for forming ESL 140 can include forming a V-shape ESL 140$_1$, and depositing ESL 140$_2$ over the V-shape ESL 140$_1$. As shown in FIG. 7J, the process of forming the V-shape shape ESL 140$_1$ can include etching, via an etching process, portion of the deposited dielectric material of ESL 140$_1$ of the structure of FIG. 7F to separate side surface 141$_S$'s topmost vertex 141V (shown in FIG. 7J) from padding layer 124's top surface 124$_T$ by separation $D_{141C}$. The etching process can etch ESL 140$_1$'s upper portion (e.g., proximate to padding layer 124's top surface 124$_T$) at a greater etching rate than etching ESL 140$_1$'s lower portion (e.g., proximate to trench conductor layer 130), because the plasma's density or the etchant's concentration of the etching process can be greater proximate to ESL 140$_1$'s upper than proximate to ESL 140$_1$'s lower portion. Accordingly, after the selective etching process, ESL 140$_1$'s upper portion can be removed to expose padding layer 124 and/or CESL 116. In some embodiments, after the etching process, the resulting ESL 140$_1$ can have a V-shape profile as shown in FIG. 7J. The process for forming ESL 140$_2$ can include depositing ESL 140$_2$ over side surfaces 141$_S$ as illustrated in FIG. 7K. In some embodiments, ESL 140 shown in FIG. 7K can be ESL 140 shown in FIG. 1E.

In some embodiments, the processes of forming padding layer 124 (discussed at operation 205) and forming ESL 140 (discussed at operation 210) can be interchangeably applied to one another (e.g., the previous discussion of the process of forming padding layer 124 can be applied to form ESL 141), and the previous discussion of the process of forming ESL 140 can be applied to form padding layer 124).

Figure 10:
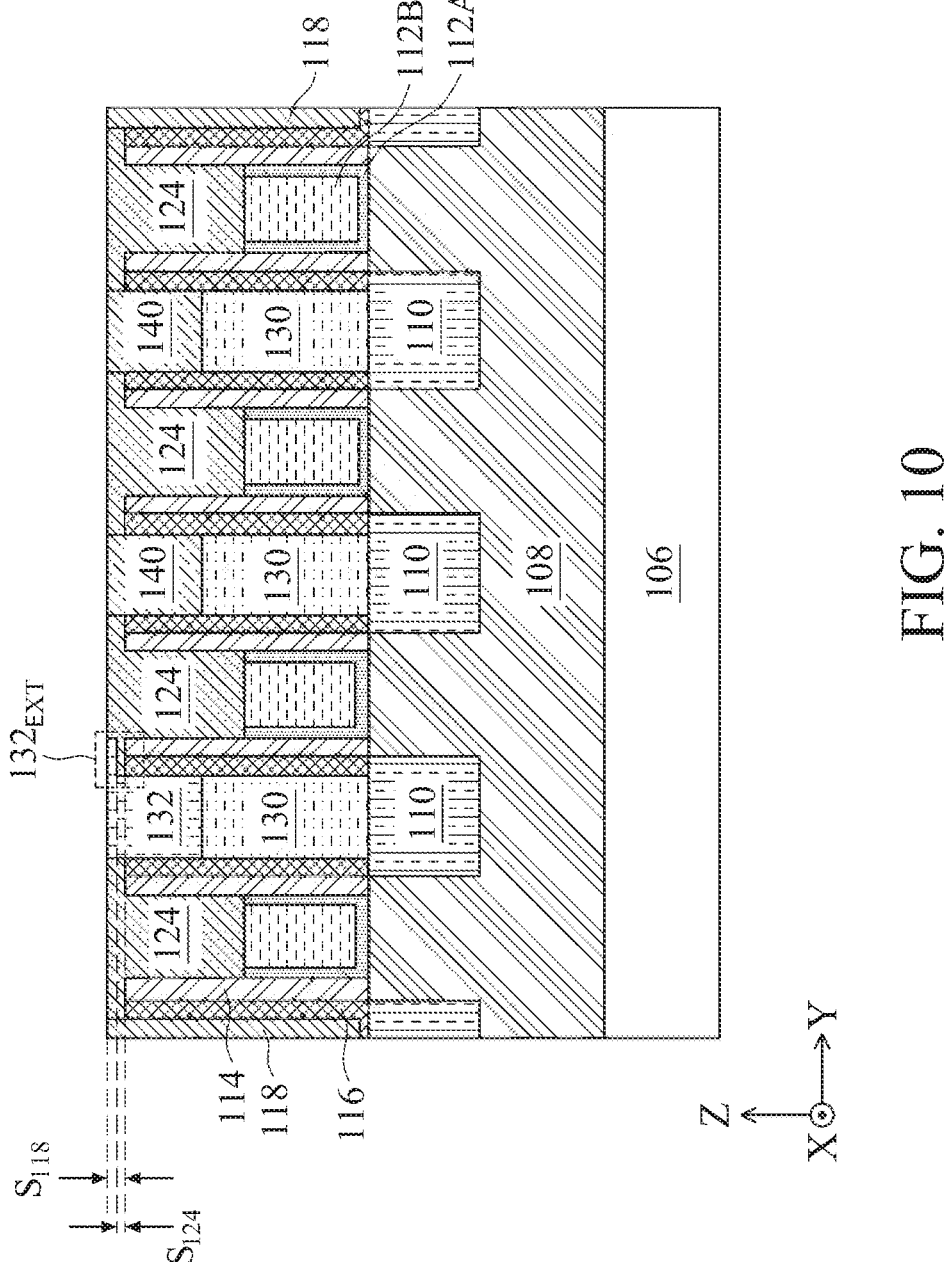
Figure 11:
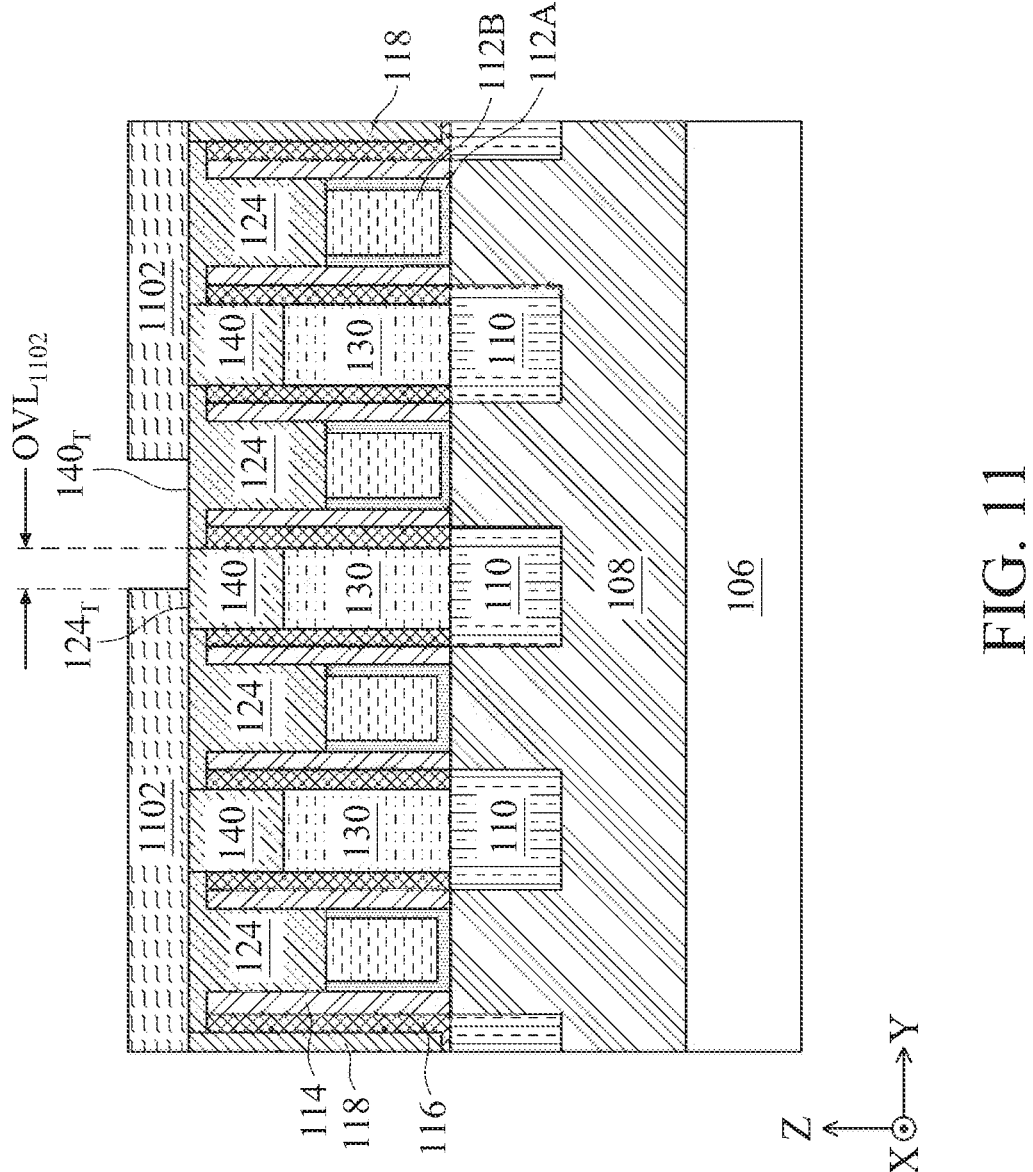
Figure 12:
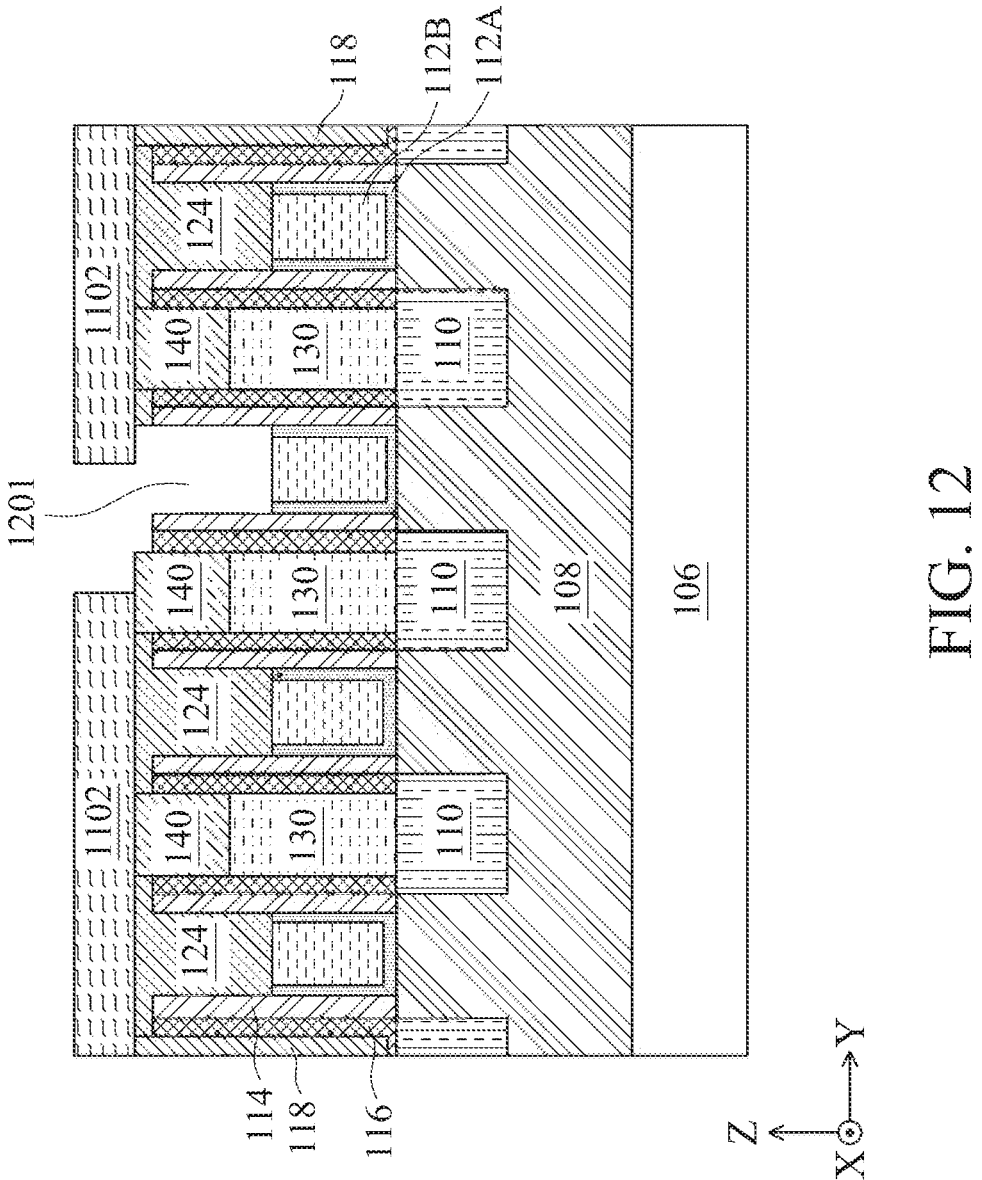

Referring to FIG. 2, in operation 215, a first trench conductor is formed through the first dielectric layer to contact the first metal contact structure. For example, as shown in FIG. 10, trench conductor layer 132 can be formed through ESL 140 in each of FIGS. 7A-7H to contact the underlying trench conductor layer 130, as described with reference to FIGS. 8-10. A process for forming trench conductor layer 132 can include patterning, using a lithography process, a mask layer 802 (shown in FIG. 8) to expose ESL 140's top surface 140$_T$. In some embodiments, the process of patterning mask layer 802 can further expose padding layer 124's top surface 124$_T$ due to an non-zero overlay shift $OVL_{802}$, such as from about 5 nm to about 20 nm, associated with the lithography process.

The process for forming trench conductor layer 132 can further include forming a recess structure 901 (shown in FIG. 9) through ESL 140 to expose the underlying trench conductor layer 130. In some embodiments, the process of forming recess structure 901 can include performing an etching process to remove ESL 140 through the patterned mask layer 802. For example, the etching processes can (i) etch a first portion of ESL 140 exposed by mask layer 802 and (ii) etch a second portion of ESL 140 that is under mask layer 802 and laterally (e.g., in the y-direction) adjacent to the first portion of ESL 140. Due to the etching selectivity between ESL 140 and padding layer 124, the etching process for removing ESL 140 can be a dry etching process and/or a wet etching process that etches ESL 140 faster than padding layer 124. In some embodiments, the etching process for forming recess structure 901 can etch ESL 140 and padding layer 124 with first and second etching rates, respectively, where a ratio of the first etching rate to the second etching rate can be greater than about 20, greater than about 30, greater than about 40, greater than about 50, greater than about 60, or greater than about 70. If the ratio of the first etching rate to the second etching rate is less than the above-noted lower limits, the process of forming recess structure 901 may damage the integrity of padding layer 124, thus causing an electrical short between trench conductor layer 132 and gate structure 112. In some embodiments, the etching process for forming recess structure 901 can remove portions of padding layer 124 formed above CESL 116 and above gate spacer 114 after completely removing ESL 140 to expose trench conductor layer 130. For example, the separation between padding layer 124's top surface $124_T$ can be reduced from separation $S_{118}$ to a separation $S_{124}$ less than separation $S_{118}$ (e.g., tor example, separation $S_{124}$ can be less than or equal to 50% of separation $S_{118}$) after completely removing ESL 140 to expose trench conductor layer 130. In some embodiments, the etching process for forming recess structure 901 can remove padding layer 124 to expose CESL 116 after completely removing ESL 140 to expose trench conductor layer 130. Due to the etching selectivity between ESL 140 and CESL 116, the etching process for removing ESL 140 can etch ESL 116 slower than ESL 140. In some embodiments, the etching process for forming recess structure 901 can etch ESL 140 and CESL 116 with first and third etching rates, respectively, where a ratio of the first etching rate to the third etching rate can be greater than about 20, greater than about 25, greater than about 30, or greater than about 40. If the ratio of the first etching rate to the third etching rate is less than the above-noted lower limits, the process of forming recess structure 901 may damage the integrity of CESL 116, thus causing an electrical short between trench conductor layer 132 and gate structure 112. In some embodiments, the etching process for forming recess structure 901 can remove padding layer 124 to expose gate spacer 114 after completely removing ESL 140 to expose trench conductor layer 130. Due to the etching selectivity between ESL 140 and gate spacer 114, the etching process for removing ESL 140 can etch gate spacer 114 slower than ESL 140. In some embodiments, the etching process for forming recess structure 901 can etch ESL 140 and gate spacer 114 with first and fourth etching rates, respectively, where a ratio of the first etching rate to the fourth etching rate can be greater than about 20, greater than about 25, greater than about 30, or greater than about 40. If the ratio of the first etching rate to the fourth etching rate is less than the above-noted lower limits, the process of forming recess structure 901 may damage the integrity of gate spacer 114, thus causing an electrical short between trench conductor layer 132 and gate structure 112.

The process for forming trench conductor layer 132 can further include filling a conductive material, using a suitable deposition process and a CMP process, in recess structure 901 to contact trench conductor layer 130. In some embodiments, the process of filling the conductive material can further form trench conductor layer 132's extension portion $132_{EXT}$ above CESL 116 and above gate spacer 114. In some embodiments, trench conductor layer 132's extension portion $132_{EXT}$ can be in contact with CESL 116 and above gate spacer 114. In some embodiments, because the overlay shift $OVL_{802}$ can extend in a horizontal direction (e.g., the +y direction towards FIG. 10's right side), trench conductor layer 132 can have extension portion $132_{EXT}$ extending in the horizontal direction (e.g., the +y direction towards FIG. 10's right side), and trench conductor layer 132 can be free from extension portion $132_{EXT}$ in an opposite horizontal direction (e.g., the –y direction towards FIG. 10's left side). In some embodiments, trench conductor layer 132 can have extension portion $132_{EXT}$ extending in the horizontal direction (e.g., the +y direction towards FIG. 10's right side) and another extension portion (not shown in FIGS. 1B-1F and 10) extending above CESL 116 and above gate spacer 114 in the opposite horizontal direction (e.g., the –y direction towards FIG. 10's left side), where a lateral (e.g., parallel to the y-direction) dimension of extension portion $132_{EXT}$ can be greater than that of the other extension portion.

Figure 13:
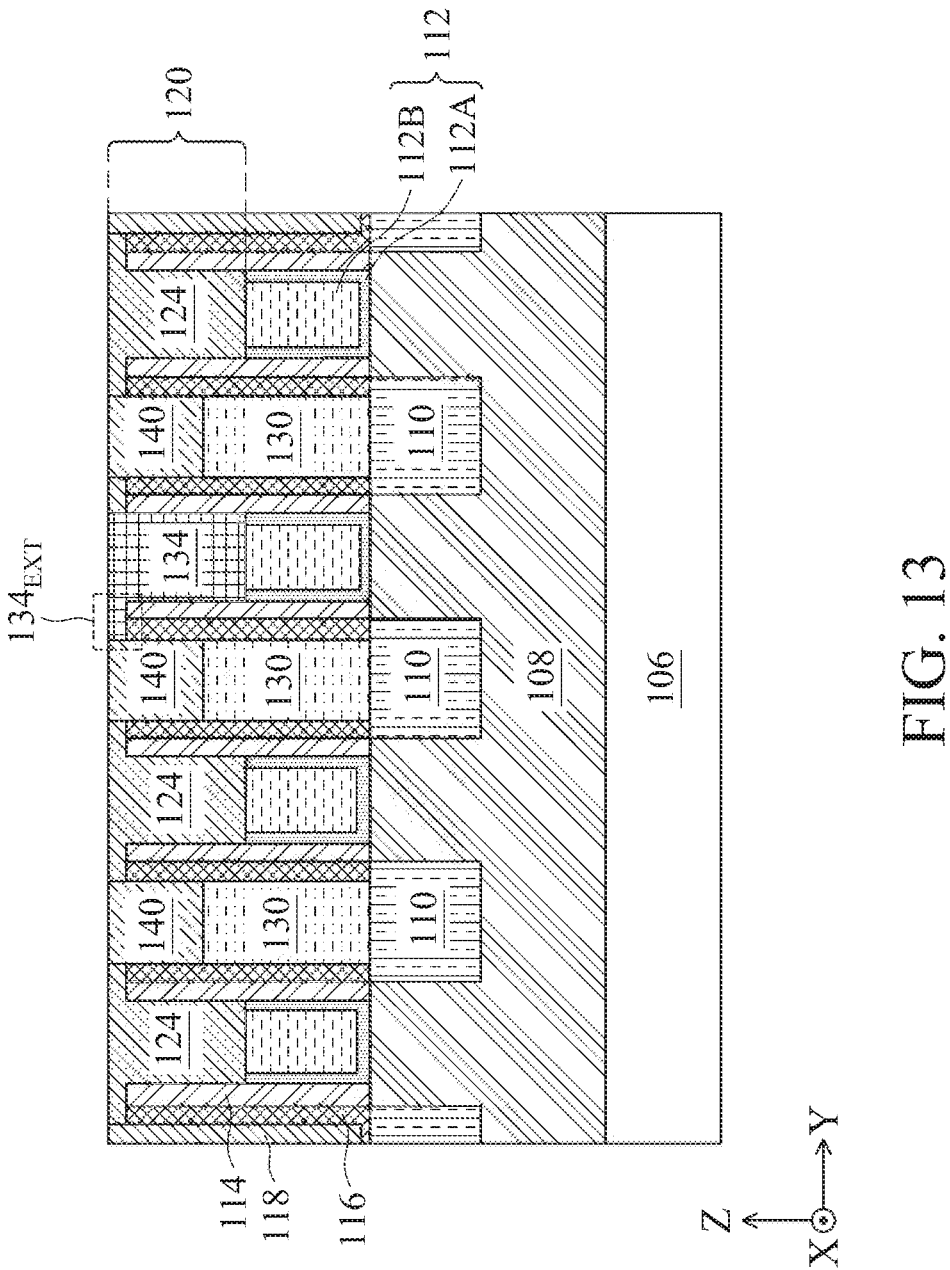

Referring to FIG. 2, in operation 220, a second trench conductor is formed through the second dielectric layer to contact the second metal contact structure. For example, as shown in FIG. 13, trench conductor layer 134 can be formed through padding layer 124 to contact the underlying gate structure 112, as described with reference to FIGS. 11-13. A process for forming trench conductor layer 134 can include patterning, using a lithography process, a mask layer 1102 (shown in FIG. 11) to expose padding layer 124's top surface $124_T$. In some embodiments, the process of patterning mask layer 802 can further expose ESL 140's top surface $140_T$ due to an non-zero overlay shift $OVL_{1102}$, such as from about 5 nm to about 20 nm, associated with the lithography process.

The process for forming trench conductor layer 134 can further include forming a recess structure 1201 (shown in FIG. 12) through padding layer 124 to expose the underlying gate structure 112. In some embodiments, the process of forming recess structure 1201 can include performing an etching process to remove padding layer 124 through the patterned mask layer 1102. For example, the etching processes can (i) etch a first portion of padding layer 124 exposed by mask layer 1102 and (ii) etch a second portion of padding layer 124 that is under mask layer 1102 and laterally (e.g., in the y-direction) adjacent to the first portion of padding layer 124. Due to the etching selectivity between padding layer 124 and ESL 140, the etching process for removing padding layer 124 can be a dry etching process and/or a wet etching process that etches padding layer 124 faster than ESL 140. In some embodiments, the etching process for forming recess structure 1201 can etch padding layer 124 and ESL 140 with first and second etching rates, respectively, where a ratio of the first etching rate to the second etching rate can be greater than about 20, greater than about 30, greater than about 40, greater than about 50, greater than about 60, or greater than about 70. If the ratio of the first etching rate to the second etching rate is less than the above-noted lower limits, the process of forming recess structure 1201 may damage the integrity of ESL 140, thus causing an electrical short between trench conductor layer 134 and trench conductor layer 130. In some embodiments, the etching process for forming recess structure 1201 can expose CESL 116. Due to the etching selectivity between padding layer 124 and CESL 116, the etching process for removing padding layer 124 can etch CESL 116 slower than padding layer 124. In some embodiments, the etching process for forming recess structure 1201 can etch padding layer 124 and CESL 116 with first and third etching rates, respectively, where a ratio of the first etching rate to the third etching rate can be greater than about 20, greater than about 25, greater than about 30, greater than about 40, or greater than about 50. If the ratio of the first etching rate to the third etching rate is less than the above-noted lower limits, the process of forming recess structure 1201 may damage the integrity of CESL 116, thus causing an electrical short between trench conductor layer 132 and trench conductor layer 130.

In some embodiments, the etching process for forming recess structure 1201 can expose gate spacer 114. Due to the etching selectivity between padding layer 124 and gate spacer 114, the etching process for removing padding layer 124 can etch gate spacer 114 slower than padding layer 124. In some embodiments, the etching process for forming recess structure 1201 can etch padding layer 124 and gate spacer 114 with first and fourth etching rates, respectively, where a ratio of the first etching rate to the fourth etching rate can be greater than about 20, greater than about 25, greater than about 30, or greater than about 40. If the ratio of the first etching rate to the fourth etching rate is less than the above-noted lower limits, the process of forming recess structure 1201 may damage the integrity of gate spacer 114, thus causing an electrical short between trench conductor layer 132 and trench conductor layer 130.

The process for forming trench conductor layer 134 can further include filling a conductive material, using a suitable deposition process and a CMP process, in recess structure 1201 to contact gate structure 112. In some embodiments, the process of filling the conductive material can further form trench conductor layer 134's extension portion 134$_{EXT}$ above CESI, 116 and above gate spacer 114. In some embodiments, trench conductor layer 134's extension portion 134$_{EXT}$ can be in contact with CESL 116 and above gate spacer 114. In some embodiments, because the overlay shift OVL$_{1102}$ can extend in a horizontal direction (e.g., the −y direction towards FIG. 13's left side), trench conductor layer 134 can have extension portion 134$_{EXT}$ extending in the horizontal direction (e.g., the −y direction towards FIG. 13's left side), and trench conductor layer 134 can be free from extension portion 134$_{EXT}$ in an opposite horizontal direction (e.g., the +y direction towards FIG. 13's right side). In some embodiments, trench conductor layer 134 can have extension portion 134$_{EXT}$ extending in the horizontal direction (e.g., the −y direction towards FIG. 13's left side) and another extension portion (not shown in FIGS. 1B-1F and 13) extending above CESL 116 and above gate spacer 114 in the opposite horizontal direction (e.g., the +y direction towards FIG. 13's right side), where a lateral (e.g., parallel to the y-direction) dimension of extension portion 134$_{EXT}$ can be greater than that of the other extension portion.

Figure 14:
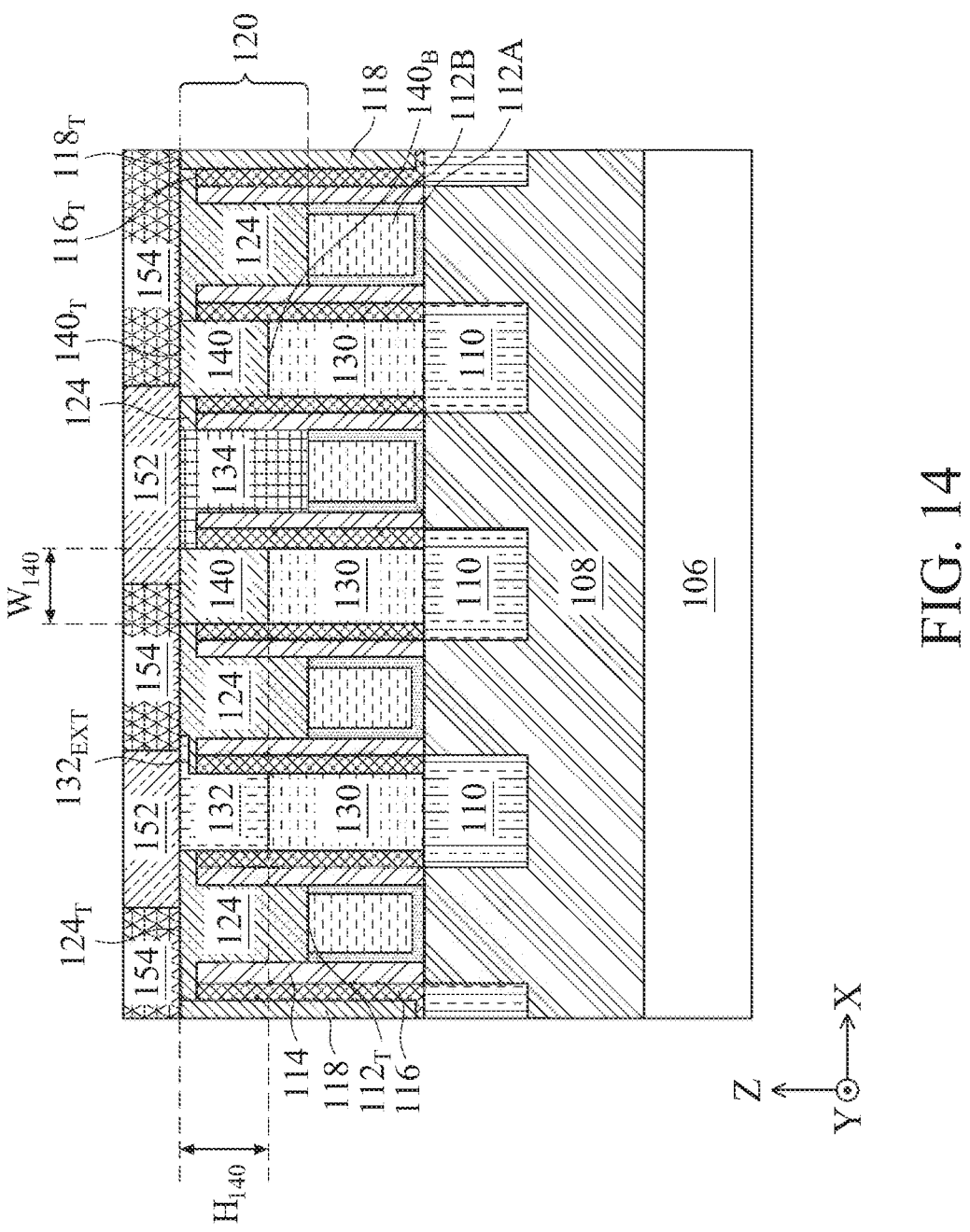

Referring to FIG. 2, in operation 225, an interconnect structure is formed over the first and second trench conductor layers. For example, as shown in FIGS. 1B-1F, interconnect structure 150 can be formed over trench conductor layers 132 and 134 as described in reference to FIGS. 14 and 1B-1F. Referring to FIG. 14, a process of forming interconnect structure 150 can include (i) forming a patterned layer of insulating material 154 over the structure of FIG. 13 to expose trench conductor layers 132 and 134 using a deposition process and an etching process, (ii) blanket depositing a conductive material over the patterned layer of insulating material 154 using a deposition process, and (iii) polishing the deposited conductive material using a CMP process to form layer of conductive material 152 substantially coplanar with layer of insulating material 154. The process of forming interconnect structure 150 can further include (i) blanket depositing layer of insulating material 156 over the structure of FIG. 14 using a deposition process, such as a CVD process, a PECVD process, a PVD process, and an ALD process, (ii) forming one or more recess structures (not shown in FIG. 14) through layer of insulating material 156 using a lithography process and an etching process, and (iii) filling the one or more recess structures with a conductive material to form trench conductor layers 158 (shown in FIGS. 1B-1F using a deposition process (e.g., CVD, ALD, PVD, or e-beam evaporation) and a polishing process (e.g., a CMP process).

The present disclosure provides a contact structure and a method for forming the same. The contact structure can include a metal gate structure and a S/D metal contact structure. The contact structure can further include a padding layer and an contact etch stop (CESL) layer formed over the metal gate structure and the S/D metal contact structure, respectively. The contact structure can further include first and second trench conductor layers to electrically bridge the metal gate structure and the S/D metal contact to an interconnect structure, respectively. The padding layer can be made of a carbon-five dielectric material, and the CESL layer can be made of a carbon-containing dielectric material. Accordingly, the CESL layer can have a different etching selectivity from the padding layer, thus avoiding removal of the padding layer and the CESL layer during the formation of the first or the second trench conductor layers. In addition, a lower portion of the CESL layer can be doped with a higher concentration of oxygen or nitrogen than an upper portion of the CESL layer to increase the CESL layer's dielectric strength. A benefit of the present disclosure, among others, is to provide the contact structure with improved reliability, thus enhancing an overall yield of IC manufacturing.

In some embodiments, a semiconductor structure can include a substrate, first and second contact structures proximate to each other and over the substrate, and first and second dielectric layers formed over the first and second contact structures, respectively. A top portion of the first dielectric layer can include a first dielectric material. A bottom portion of the first dielectric layer can include a second dielectric material different from the first dielectric material. The second dielectric layer can include a third dielectric material different from the first dielectric material.

In some embodiments, a method for forming a semiconductor structure can include forming a first dielectric layer over a substrate, forming a contact structure adjacent to the first dielectric layer, forming a second dielectric layer over the contact structure, and forming a trench conductor layer through the second dielectric layer to contact the contact structure. Top and bottom portions of the second dielectric layer can include dielectric materials different from one another. The first dielectric layer and the top portion of the second dielectric layer can include dielectric materials different from one another.

In some embodiments, a method for forming a semiconductor structure can include forming a fin structure over a substrate, forming first and second contact structures over the fin structure, forming a first dielectric layer over the first contact structure, forming a second dielectric layer over the second contact structure, and forming first and second trench conductors through the first and second dielectric layers to contact the first and second contact structures, respectively. Top and bottom portions of the second dielectric layer can include different dielectric materials from one another. The first dielectric layer and the top portion of the second dielectric layer can include dielectric materials different from one another.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:

forming a first dielectric layer over a substrate, wherein the first dielectric layer comprises a first extension portion on a spacer structure and on an etch stop layer (ESL);

forming a contact structure in contact with the ESL and adjacent to the first dielectric layer;

forming a second dielectric layer over the contact structure and in contact with the ESL, wherein:

top surfaces of the first extension portion and the first and second dielectric layers are substantially coplanar;

top and bottom portions of the second dielectric layer comprise dielectric materials different from one another; and the first dielectric layer and the top portion of the second dielectric layer comprise dielectric materials different from one another;

removing, through a mask layer, a portion of the second dielectric layer and a portion of the first extension portion to form a recess structure, wherein a remaining portion of the first extension portion is on the spacer structure and the ESL, and wherein a portion of the recess structure is directly under the mask layer;

forming a trench conductor layer in the recess structure through the second dielectric layer to contact the contact structure, wherein:

the trench conductor layer includes a second extension portion extending above the remaining portion of the first extension portion, and includes a bottom surface above a bottom surface of the first dielectric layer;

the remaining portion of the first extension portion separates the second extension portion from the spacer structure and the ESL; and top surfaces of the second extension portion and the first dielectric layer are substantially coplanar;

exposing the trench conductor layer with the second extension portion through a patterned layer; and forming an interconnect structure over the remaining portion of the first extension portion and in contact with the second extension portion.

2. The method of claim 1, wherein forming the first dielectric layer comprises:

forming a gate structure adjacent to the contact structure; and depositing the first dielectric layer over the gate structure.

3. The method of claim 1, wherein forming the second dielectric layer comprises:

flowing an oxygen-containing processing gas at a first flow rate to deposit a first dielectric material; and flowing, over the first dielectric material, the oxygen-containing processing gas at a second flow rate less than the first flow rate to deposit a second dielectric material.

4. The method of claim 1, wherein forming the second dielectric layer comprises:

flowing a nitrogen-containing processing gas at a first flow rate to deposit a first dielectric material; and flowing, over the first dielectric material, the nitrogen-containing processing gas at a second flow rate less than the first flow rate to deposit a second dielectric material.

5. The method of claim 1, wherein forming the second dielectric layer comprises:

flowing a carbon-containing processing gas at a first flow rate to deposit a first dielectric material; and flowing, over the first dielectric material, the carbon-containing processing gas at a second flow rate greater than the first flow rate to deposit a second dielectric material.

6. The method of claim 1, wherein forming the trench conductor layer comprises:

exposing the first and second dielectric layers through the mask layer; and selectively etching the exposed second dielectric layer over the exposed first dielectric layer.

7. A method for forming a semiconductor structure, comprising:

forming a fin structure over a substrate;

forming a gate structure over the fin structure;

forming a first dielectric layer over the gate structure, wherein the first dielectric layer comprises a first extension portion;

forming a contact structure over the fin structure, wherein the contact structure is in contact with the first extension portion, and wherein top surfaces of the contact structure, the first dielectric layer, and the first extension portion are substantially coplanar;

forming a second dielectric layer over the contact structure, wherein top and bottom portions of the second dielectric layer comprise different dielectric materials from one another, and wherein the first dielectric layer and the top portion of the second dielectric layer comprise dielectric materials different from one another;

exposing top surfaces of the second dielectric layer and the first extension portion of the first dielectric layer through a mask layer on the first and second dielectric layers;

removing the second dielectric layer and a first portion of the first extension portion to form a recess structure, wherein:

a second portion of the first extension portion remains over the gate structure, a portion of the recess structure is directly under the mask layer, and a bottom surface of the recess structure is below a top surface of the second portion of the first extension portion and above a bottom surface of the first dielectric layer; and forming a trench conductor in the recess structure and on the second portion of the first extension portion to contact the contact structure, wherein the trench conductor comprises a second extension portion extending over the second portion of the first extension portion and into the first dielectric layer, and wherein top surfaces of the trench conductor, the second extension portion, and the first dielectric layer are substantially coplanar.

8. The method of claim 7, wherein forming the first dielectric layer comprises depositing a carbon-free dielectric material, and wherein forming the second dielectric layer comprises depositing a carbon-containing dielectric material.

9. The method of claim 7, wherein forming the second dielectric layer comprises:

depositing a carbon-containing dielectric material; and coplanarizing the deposited carbon-containing dielectric material with the first dielectric layer.

10. The method of claim 7, wherein forming the second dielectric layer comprises:

forming an additional recess structure in the contact structure;

depositing a first dielectric material in the additional recess structure by flowing a carbon-containing processing gas at a first flow rate; and depositing a second dielectric material in the additional recess structure by flowing the carbon-containing processing gas at a second flow rate different from the first flow rate.

11. The method of claim 7, wherein forming the trench conductor comprises:

etching the first dielectric layer at a first etching rate; and etching the second dielectric layer at a second etching rate greater than the first etching rate.

12. The method of claim 7, further comprising:

etching the first dielectric layer at a first etching rate; and etching the second dielectric layer at a second etching rate less than the first etching rate; and forming an additional trench conductor on the gate structure.

13. The method of claim 7, wherein forming the second dielectric layer comprises:

removing a portion of the contact structure to form an additional recess structure; and depositing the second dielectric layer in the additional recess structure over the contact structure.

14. A method, comprising:

forming a source/drain (S/D) region on a fin structure;

forming a gate structure on the fin structure and adjacent to the S/D region;

forming a spacer layer on sidewall surfaces of the gate structure;

forming an etch stop layer (ESL) on a sidewall of the spacer layer and a top surface of the S/D region;

forming a first dielectric layer on the gate structure, wherein the first dielectric layer comprises a first extension portion on top surfaces of the spacer layer and the ESL;

forming a contact structure on the S/D region and in contact with the first extension portion and a sidewall surface of the ESL;

forming a second dielectric layer on the contact structure, wherein:

top and bottom portions of the second dielectric layer comprise different dielectric materials from one another, the first dielectric layer and the top portion of the second dielectric layer comprise dielectric materials different from one another, top surfaces of the first extension portion and the first and second dielectric layers are substantially coplanar, and the top surface of the second dielectric layer is above the top surfaces of the spacer layer and the ESL;

exposing top surfaces of the second dielectric layer and the first extension portion of the first dielectric layer through a mask layer on the first and second dielectric layers;

removing a first portion of the exposed second dielectric layer, a second portion of the second dielectric layer under the mask layer, and a first portion of the exposed first extension portion, wherein a second portion of the exposed first extension portion remains on the top surfaces of the spacer layer and the ESL; and forming a trench conductor layer through the second dielectric layer and on the second portion of the exposed first extension portion of the first dielectric layer to contact the contact structure, wherein the trench conductor layer comprises a second extension portion extending over the second portion of the exposed first extension portion and into the first dielectric layer, and wherein a bottom surface of the trench conductor layer is below a top surface of the second portion of the exposed first extension portion and above a bottom surface of the first dielectric layer.

15. The method of claim 14, wherein forming the second dielectric layer comprises depositing a carbon-containing dielectric material on the contact structure.

16. The method of claim 14, wherein forming the second dielectric layer comprises coplanarizing the top surfaces of the second dielectric layer and the first dielectric layer.

17. The method of claim 14, wherein forming the second dielectric layer comprises:

forming a recess structure in the contact structure;

depositing a first dielectric material in the recess structure by flowing a carbon-containing processing gas at a first flow rate; and depositing a second dielectric material in the recess structure by flowing the carbon-containing processing gas at a second flow rate greater than the first flow rate.

18. The method of claim 14, wherein forming the second dielectric layer comprises:

forming a recess structure in the contact structure;

depositing a first dielectric material in the recess structure by flowing an oxygen-containing processing gas at a first flow rate; and depositing a second dielectric material on the first dielectric material in the recess structure by flowing the oxygen-containing processing gas at a second flow rate less than the first flow rate.

19. The method of claim 14, further comprising:

forming a recess structure through the second dielectric layer to expose the contact structure; and forming a trench conductor in the recess structure to contact the contact structure.

20. The method of claim 19, wherein forming the recess structure comprises:

etching the first dielectric layer at a first etching rate; and etching the second dielectric layer at a second etching rate greater than the first etching rate.

* * * * *